(12) United States Patent
Arita et al.

(10) Patent No.: US 8,026,181 B2
(45) Date of Patent: *Sep. 27, 2011

(54) MANUFACTURING METHOD FOR SEMICONDUCTOR CHIPS

(75) Inventors: Kiyoshi Arita, Fukuoka (JP); Akira Nakagawa, Saga (JP)

(73) Assignee: Panasonic Corporation, Osaka (JP)

( * ) Notice: Subject to any disclaimer, the term of this patent is extended or adjusted under 35 U.S.C. 154(b) by 867 days.

This patent is subject to a terminal disclaimer.

(21) Appl. No.: 11/918,429

(22) PCT Filed: Apr. 11, 2006

(86) PCT No.: PCT/JP2006/307997
§ 371 (c)(1),
(2), (4) Date: Oct. 12, 2007

(87) PCT Pub. No.: WO2006/112424
PCT Pub. Date: Oct. 26, 2006

(65) Prior Publication Data
US 2009/0023295 A1    Jan. 22, 2009

(30) Foreign Application Priority Data
Apr. 14, 2005   (JP) ................. 2005-117239

(51) Int. Cl.
*H01L 21/302* (2006.01)
*H01L 21/00* (2006.01)
*C23F 1/00* (2006.01)
(52) U.S. Cl. ............................ 438/715; 438/460; 216/58
(58) Field of Classification Search .................... 216/41, 216/58, 63; 438/707; 257/E21.214
See application file for complete search history.

(56) References Cited

U.S. PATENT DOCUMENTS

| | | | |
|---|---|---|---|
| 5,324,981 A | 6/1994 | Kobiki et al. | |
| 6,071,822 A * | 6/2000 | Donohue et al. | 438/712 |
| 2001/0001215 A1 | 5/2001 | Siniaguine et al. | |
| 2004/0043614 A1* | 3/2004 | Koizumi | 438/689 |
| 2004/0102025 A1 | 5/2004 | Arita | |
| 2005/0003310 A1* | 1/2005 | Bai et al. | 430/323 |
| 2005/0072766 A1* | 4/2005 | Arita | 219/121.44 |
| 2007/0264832 A1* | 11/2007 | Arita et al. | 438/700 |

FOREIGN PATENT DOCUMENTS

| | | |
|---|---|---|
| JP | 2004-172365 | 6/2004 |
| JP | 2004-265902 | 9/2004 |

OTHER PUBLICATIONS

International Search Report of Jul. 6, 2006 issued in the International Application No. PCT/JP2006/307997.

(Continued)

*Primary Examiner* — Nadine G Norton
*Assistant Examiner* — Patti Lin
(74) *Attorney, Agent, or Firm* — Wenderoth, Lind & Ponack, L.L.P.

(57) ABSTRACT

By performing plasma etching on the second surface of a semiconductor wafer on the first surface of which an insulating film is placed in dividing regions and on the second surface of which a mask for defining the dividing regions are placed, the second surface being located opposite from the first surface, the insulating film is exposed from an etching bottom portion by removing portions that correspond to the dividing regions. Subsequently, by continuously performing the plasma etching in the state in which the exposed surfaces of the insulating film are charged with electric charge due to ions in the plasma, corner portions put in contact with the insulating film are removed. Subsequently, by removing the mask and thereafter performing plasma etching on the second surface, corner portions located on the second surface side are removed.

19 Claims, 30 Drawing Sheets

OTHER PUBLICATIONS

Written Opinion of the International Searching Authority of Jul. 6, 2006 issued in the International Application No. PCT/JP2006/307997.

International Preliminary Report on Patentability issued Oct. 25, 2007 in the International (PCT) Application No. PCT/JP2006/307997.

* cited by examiner

Fig.12

| PLASMA PROCESSING CONDITIONS | GAS COMPOSITION | | | | PRESSURE (Pa) | FREQUENCY (MHz) |
|---|---|---|---|---|---|---|
| | SF$_6$ | O$_2$ | He | CHF$_3$ | | |
| PLASMA PROCESSING CONDITIONS FOR ANISOTROPIC ETCHING 81A | 10 | 2 | 0 | — | 100 | 60 |
| PLASMA PROCESSING CONDITIONS FOR ISOTROPIC ETCHING 81B | 10 | 0 | 30 | — | 500 | 13.56 |
| PLASMA PROCESSING CONDITIONS FOR SILICON OXIDE REMOVAL 81C | — | — | — | 20 | 50 | 13.56 |
| PLASMA PROCESSING CONDITIONS FOR MASK REMOVAL 81D | — | 20 | — | — | 50 | 13.56 |

MANUFACTURING METHOD FOR SEMICONDUCTOR CHIPS

TECHNICAL FIELD

The present invention relates to a manufacturing method for semiconductor chips for forming semiconductor devices arranged in a plurality of device-formation-regions defined by dividing regions on a first surface of a semiconductor wafer and individually separating the device-formation-regions of the semiconductor wafer along the dividing regions, thereby manufacturing semiconductor chips that include the individualized semiconductor devices.

BACKGROUND ART

Conventionally, as a method for dividing a semiconductor wafer into individual semiconductor chips by such a manufacturing method for semiconductor chips, various methods have been known. For example, a method for dividing a semiconductor wafer by mechanically cutting the wafer by means of a rotary blade called the dicer blade, i.e., mechanical dicing, is known.

However, semiconductor wafers have recently been made thinner and thinner, and a semiconductor wafer susceptible to external forces is subjected to the mechanical dicing described above, it is often the case where the semiconductor wafer is damaged at the time of cutting. This leads to a problem that a reduction in the processing yield cannot be avoided. As such damage, there is, for example, the occurrence of chipping that the corner portions (edges) of the semiconductor chips become chipped due to the sharply cut shape.

In recent years, plasma dicing that uses plasma etching has been attracting attention as a substitute for the conventional mechanical dicing described above (reference should be made to, for example, Japanese unexamined patent publication No. 2004-172365 A). A method for dividing a semiconductor wafer into individual semiconductor chips by the conventional plasma dicing is described herein with reference to the schematic explanatory views shown in FIGS. 27A through 27C and FIGS. 28A and 28B.

First of all, as shown in FIG. 27A, a semiconductor wafer 501 is put into a state in which semiconductor devices 502 are formed in the respective device-formation-regions R1 defined by dividing regions R2 on its circuit-formation-face 501a. Each of the semiconductor devices 502 includes devices such as a MOS (Metal-Oxide-Semiconductor) structure transistor constructed of a semiconductor wafer 501 (Semiconductor), a silicon oxide 551 (Oxide) formed directly on the circuit-formation-face 501a and a metal film (Metal) formed on the silicon oxide 551. Further, the semiconductor device 502 further includes connection terminals 552 (also called the bonding pads) for electrically connecting the devices to external electronic apparatuses. Moreover, a surface protection film 553 is formed on the surfaces of the semiconductor devices 502, so that the surfaces of the semiconductor devices 502 are protected. The connection terminals 552 are exposed outside without being covered with the surface protection film 553. Neither the silicon oxide 551 nor the surface protection film 553 is formed in portions that correspond to the dividing regions R2 of the circuit-formation-face 501a.

Next, as shown in FIG. 27B, a protective sheet 504 is peelably adhesively stuck to the circuit-formation-face 501a via an adhesive so that the circuit-formation-face 501a of the semiconductor wafer 501 does not suffer damages. Subsequently, a mask (mask pattern) 505 is placed on a surface 501b to be processed (that is, a processing-target-face), or the surface opposite from the circuit-formation-face 501a so that the portions that correspond to the dividing regions R2 are exposed.

Next, by performing plasma etching on the semiconductor wafer 501 on which the mask 505 is thus formed, the exposed surface of the surface 501b that is not covered with the mask 505 is etched, removing the portions that correspond to the dividing regions R2. Through this process, as shown in FIG. 27C, the device-formation-regions R1 are individually separated, forming the individual pieces of the semiconductor chips 510 that include the semiconductor devices 502. Consequently, the semiconductor wafer 501 is divided into the individual pieces of the semiconductor chips 510 that include the respective semiconductor devices 502 along the dividing regions R2.

Subsequently, as shown in FIG. 28A, the mask 505 that is remaining on the surface 501b to be processed of the separated semiconductor chips 510 is removed by carrying out, for example, an ashing process. Subsequently, as shown in FIG. 28B, an adhesive sheet (dicing sheet) 506 is stuck to the surface 501b to be processed of the semiconductor wafer 501, and the protective sheet 504 that has protected the circuit-formation-face 501a of the semiconductor wafer 501 is peeled off. As a result, the semiconductor chips 510 are arranged on the adhesive sheet 506 in a state in which they are separated into individual pieces.

By dividing the semiconductor wafer 501 using the conventional plasma dicing described above, damage to the manufactured semiconductor chips 510 can be reduced in comparison with the aforementioned mechanical dicing.

DISCLOSURE OF INVENTION

However, even the semiconductor chips 510, which are divided into the individual pieces by the conventional plasma dicing described above, are to have sharp corner portions 554 (edges) formed by the separation as shown in FIGS. 27C, 28A and 28B. There is a problem that the occurrence of chipping cannot be avoided when the sharp corner portions 554 are formed on the semiconductor chips 510 as described above.

In particular, the conventional plasma dicing described above has a characteristic that the ions in the plasma have increasing difficulties in reaching the etching bottom portion as getting closer to the bottom portion. Therefore, it is sometimes the case where the protrusive sharp corner portions 554 are formed at the lower end portions of the separated semiconductor chips 510 as shown in, for example, the partially enlarged schematic view of the etched dividing region R2 shown in FIG. 29. In such a case, there is a problem that the corner portions 554 become more easily chipped and the transverse rupture strength of the semiconductor chip is reduced.

Further, in the semiconductor chips 510, as shown in FIG. 29, not only the formation of the sharp corner portions 554 on the circuit-formation-face 501a but also the formation of sharp corner portions 555 on the surface 501b to be processed result, and this leads to a problem that the reduction in the transverse rupture strength of the semiconductor chips 510 becomes more significant.

An object of the present invention is to solve the aforementioned problems and provide a manufacturing method for semiconductor chips for forming individualized semiconductor chips by dividing a semiconductor wafer, so as to make the semiconductor chips have high transverse rupture strength without damaging the semiconductor chips.

DISCLOSURE OF INVENTION

In order to achieve the object, the present invention is constituted as follows.

According to a first aspect of the present invention, there is provided a manufacturing method for semiconductor chips comprising:

performing plasma etching on a second surface of a semiconductor wafer that has a first surface on which semiconductor devices placed in a plurality of device-formation-regions defined by dividing regions and an insulating film placed in the dividing regions are formed and the second surface on which a mask for defining the dividing regions is placed, the second surface being located opposite from the first surface, whereby portions that correspond to the dividing regions are removed and the insulating film is exposed from etching bottom portions;

removing corner portions on the first surface side put in contact with the insulating film in the device-formation-regions by continuously performing the plasma etching in a state in which exposed surfaces of the insulating film are charged with electric charge due to ions in plasma;

removing the exposed insulating film from the second surface after the removal of the corner portions on the first surface side, so that the device-formation-regions are separated into individual semiconductor chips;

removing the mask from the second surface of the semiconductor chips; and removing corner portions on the second surface side by subsequently further performing plasma etching on the second surfaces of the semiconductor chips from which the mask has been removed, whereby the semiconductor chips each of which includes the individualized semiconductor device are manufactured.

According to a second aspect of the present invention, there is provided the manufacturing method for the semiconductor chips as defined in the first aspect, wherein removal of portions that correspond to the dividing regions and exposure of the insulating film are carried out by performing anisotropic etching as the plasma etching, and removal of the corner portions located on the second surface side is carried out by performing isotropic etching as the plasma etching.

According to the third aspect of the present invention, there is provided the manufacturing method for the semiconductor chips as defined in the first aspect, wherein, in the plasma etching from the second surface of the semiconductor wafer on which the mask is placed, the insulating film formed of silicon oxide ($SiO_2$) on the first surface of the semiconductor wafer is exposed from the etching bottom portion.

According to a fourth aspect of the present invention, there is provided the manufacturing method for the semiconductor chips as defined in the first aspect, wherein, in the plasma etching from the second surface of the semiconductor wafer on which the mask is placed, a surface protection film formed of polyimide (PI) to protect the surfaces of the semiconductor devices formed on the first surface of the semiconductor wafer is exposed from the etching bottom portion as the insulating film.

According to a fifth aspect of the present invention, there is provided the manufacturing method for the semiconductor chips as defined in the first aspect, wherein removal of the mask from the second surface of the semiconductor chips are carried out by performing ashing on the second surface.

According to a sixth aspect of the present invention, there is provided the manufacturing method for the semiconductor chips as defined in any one of the first through fifth aspects, wherein, the plasma etching is performed from the second surface of the semiconductor wafer, on which the mask is placed, the mask having roughly convex curved portions formed in portions that correspond to the corner portions of each of the device-formation-regions, each of the device-formation-regions having a roughly rectangular region.

According to a seventh aspect of the present invention, there is provided a manufacturing method for semiconductor chips comprising:

performing plasma etching on a second surface of a semiconductor wafer that has a first surface on which semiconductor devices placed in a plurality of device-formation-regions defined by dividing regions and an insulating film placed in the dividing regions are formed and the second surface on which a mask for defining the dividing regions is placed, the second surface being located opposite from the first surface, whereby portions that correspond to the dividing regions are removed and the insulating film is exposed from etching bottom portions;

removing the exposed insulating film while removing corner portions on the first surface side put in contact with the insulating film in the device-formation-regions by performing the plasma etching in a state in which exposed surfaces of the insulating film are charged with electric charge due to ions in plasma, whereby the device-formation-regions are separated into individual semiconductor chips;

removing the mask from the second surface of the semiconductor chips; and removing corner portions on the second surface side by subsequently further performing plasma etching on the second surfaces of the semiconductor chips, whereby the semiconductor chips each of which includes the individualized semiconductor device are manufactured.

According to an eighth aspect of the present invention, there is provided the manufacturing method for the semiconductor chips as defined in the seventh aspect, wherein removal of portions that correspond to the dividing regions and exposure of the insulating film are carried out by performing anisotropic etching as the plasma etching, and removal of the corner portions located on the second surface side is carried out by performing isotropic etching as the plasma etching.

According to a ninth aspect of the present invention, there is provided the manufacturing method for the semiconductor chips as defined in the seventh aspect, wherein, in the plasma etching from the second surface of the semiconductor wafer on which the mask is placed, a surface protection film formed of silicon nitride ($Si_3N_4$) to protect the surface of the semiconductor devices formed on the first surface of the semiconductor wafer is exposed from the etching bottom portion as the insulating film.

According to a tenth aspect of the present invention, there is provided the manufacturing method for the semiconductor chips as defined in the seventh aspect, wherein removal of the mask from the second surface of the semiconductor chips are carried out by performing ashing on the second surface.

According to an eleventh aspect of the present invention, there is provided the manufacturing method for the semiconductor chips as defined in any one of the seventh through tenth aspects, wherein, the plasma etching is performed from the second surface of the semiconductor wafer, on which the mask is placed, the mask having roughly convex curved portions formed in portions that correspond to the corner portions of each of the device-formation-regions, each of the device-formation-regions having a roughly rectangular region.

According to a twelfth aspect of the present invention, there is provided a manufacturing method for semiconductor chips comprising:

performing plasma etching on a second surface of a semiconductor wafer that has a first surface on which semiconductor devices placed in a plurality of device-formation-regions defined by dividing regions are formed and onto which a protective sheet having an insulating property is stuck and a second surface on which a mask for defining the dividing regions is placed, the second surface being located opposite from the first surface, whereby portions that correspond to the dividing regions are removed and the insulating protective sheet is exposed from etching bottom portions, and then the device-formation-regions are separated into individual semiconductor chips;

removing corner portions put in contact with the insulating protective sheet at each of the semiconductor chips by performing the plasma etching in a state in which exposed surfaces of the insulating film are charged with electric charge due to ions in plasma, removing the mask from the second surface of the semiconductor chips; and removing the corner portions on the second surface side by subsequently further performing plasma etching on the second surfaces of the semiconductor chips, whereby the semiconductor chips each of which includes the individualized semiconductor device are manufactured.

According to a thirteenth aspect of the present invention, there is provided the manufacturing method for the semiconductor chips as defined in the twelfth aspect, wherein removal of portions that correspond to the dividing regions and exposure of the insulating protective sheet are carried out by performing anisotropic etching as the plasma etching, and removal of the corner portions located on the second surface side is carried out by performing isotropic etching as the plasma etching.

According to a fourteenth aspect of the present invention, there is provided the manufacturing method for the semiconductor chips as defined in the twelfth aspect, wherein, after the corner portions located on the second surface side are removed, the insulating protective sheet is removed by being peeled off from the first surface of the semiconductor wafer.

According to a fifteenth aspect of the present invention, there is provided the manufacturing method for the semiconductor chips as defined in the twelfth aspect, wherein removal of the mask from the second surface of the semiconductor chips are carried out by performing ashing on the second surface.

According to a sixteenth aspect of the present invention, there is provided the manufacturing method for the semiconductor chips as defined in any one of the twelfth through fifteenth aspects, wherein, the plasma etching is performed from the second surface of the semiconductor wafer, on which the mask is placed, the mask having roughly convex curved portions formed in portions that correspond to the corner portions of each of the device-formation-regions, each of the device-formation-regions having a roughly rectangular region.

Moreover, according to another aspect of the present invention, it is possible to provide a semiconductor chip that has a roughly rectangular shape obtained by dividing a semiconductor wafer in which a plurality of semiconductor devices are formed into individual pieces of the semiconductor devices, wherein the rectangular shape of the chip is defined by rounded ridgelines thereof.

Moreover, a curved convex surface portion can be formed in each of the portions that correspond to the ridgelines of the rectangular shape.

Moreover, it is possible to provide a semiconductor chip including:

a first surface on which a semiconductor device is formed;

a second surface that is parallel to the first surface and located on the side opposite from the first surface; and a connection surface that is located at the peripheries of the first surface and the second surface and connects an outer end portion of the first surface with an outer end portion of the second surface, wherein the connection surface has a curved convex surface portion so that no ridgeline is formed at the end portions of the first surface and the second surface.

Moreover, it is also possible that the connection surface is comprised of the curved convex surface portion.

According to the present invention, by employing the semiconductor wafer on which the insulating film is placed in the portions that correspond to the dividing regions of the first surface as the semiconductor wafer, and removing the corner portions of the formed semiconductor chips by performing a plasma etching process on the second surface, a manufacturing method for semiconductor chips capable of forming, for example, R-portions (rounded portions or curved convex surface portions) at the removed corner portions and improving the transverse rupture strength can be provided.

By carrying out the plasma etching process on the semiconductor wafer on the second surface of which the mask is placed, the insulating film is exposed from the etching bottom portion by removing the portions that correspond to the dividing regions. Subsequently, by continuing the plasma etching process, the exposed insulating film can be charged with positive charge due to the ions in the plasma. By bending the trajectory of the applied ions by the electric charge described above, the sharp corner portions or ridgelines (i.e., the corner portions and the like on the first surface side) of the semiconductor chips put in contact with the insulating film can be removed.

Further, after the corner portions have been removed from the first surface side, by removing the mask placed on the second surface and then subsequently performing plasma etching directly on the second surface from which the mask has been removed, the corner portions and the ridgelines on the second surface side can be removed.

By thus removing all the sharp corner portions from the semiconductor chip, semiconductor chips capable of suppressing the occurrence of the chipping of the manufactured semiconductor chip and improving the transverse rupture strength thereof can be manufactured.

Moreover, by performing the anisotropic plasma etching as the plasma etching for the removal of the portions that correspond to the dividing regions and the exposure of the insulating film, the etching can effectively be performed in the direction perpendicular to the surface of the semiconductor wafer, i.e., in the depthwise direction of the dividing regions. Moreover, by performing the isotropic plasma etching as the plasma etching for the removal of the corner portions on the second surface side, the etching can be performed in the direction along the surface of the semiconductor wafer, i.e., in the widthwise direction of the dividing regions, and the removal of the corner portions can effectively be achieved.

Therefore, all the ridgelines can be removed from the formed semiconductor chips, and the curved convex surface portions can be formed in the positions that correspond to the ridgelines. Moreover, the curved convex surface portions as described above can be formed not by the mechanical processing of cutting, abrading or the like but by plasma etching, and therefore, the occurrence of a residual stress and a damaged layer can be prevented. Therefore, semiconductor chips, of which the configurational structural strength is improved and the transverse rupture strength is improved, can be provided.

Moreover, when the exposed insulating film is formed of silicon oxide or polyimide, the insulating film can be positively etched by performing the plasma etching by changing, for example, the kind of the gas, and the removal of the exposed insulating film can reliably be achieved.

Moreover, when the exposed insulating film is formed of silicon nitride, the exposed insulating film can be etched concurrently with the etching performed for the removal of the corner portions.

Furthermore, by employing an insulating protective sheet as a protective sheet adhesively placed to protect the first surface of the semiconductor wafer, removing the portions that correspond to the dividing regions for the exposure of the insulating protective sheet and thereafter continuing the plasma etching in a state in which the exposed insulating protective sheet is electrically charged, the corner portions of the semiconductor chips can be removed, and an effect similar to the aforementioned effect can be obtained.

BRIEF DESCRIPTION OF DRAWINGS

These and other aspects and features of the present invention will become clear from the following description taken in conjunction with the preferred embodiments thereof with reference to the accompanying drawings, in which:

FIG. 3A is a schematic structural view showing a state in which the surface of the lower electrode is charged with negative charge by driving a power unit for electrostatic attraction, and FIG. 3B is a schematic structural view showing a state in which plasma is generated in a processing chamber by driving a high-frequency power unit;

FIG. 8A is a view of a state before processing is started,

FIG. 8B is a view of a state in which a protective sheet is adhesively placed, and FIG. 8C is a view of a state in which a resist film is formed;

FIG. 9A is a view of a state in which a mask pattern for defining dividing regions is formed, FIG. 9B is a view of a state in which a plasma dicing processing for exposing the silicon oxide is carried out, and FIG. 9C is a view of a state in which a plasma dicing processing for notch formation is carried out;

FIG. 10A is a view of a state in which a silicon oxide removing process is carried out, FIG. 10B is a view of a state in which an ashing process is carried out, and FIG. 10C is a view of a state in which rounded portions are formed by isotopic etching;

FIG. 11A is a view of a state in which an adhesive sheet is stuck to mask-placement-faces of semiconductor chips, and FIG. 11B is a view of a state in which the protective sheet is peeled off from a circuit-formation-face;

FIG. 12 is a data table showing the plasma processing conditions used for the plasma dicing processing of a semiconductor wafer;

FIG. 16A is a view of a state before processing is started,

FIG. 16B is a view of a state in which a protective sheet is adhesively placed, and FIG. 16C is a view of a state in which a resist film is formed;

FIG. 17A is a view of a state in which a mask pattern for defining dividing regions is formed, FIG. 17B is a view of a state in which a plasma dicing processing for exposing a polyimide film is carried out, and FIG. 17C is a view of a state in which a plasma dicing processing for notch formation is carried out;

FIG. 18A is a view of a state in which a polyimide film removing process is carried out, FIG. 18B is a view of a state in which an ashing process is carried out, and FIG. 18C is a view showing a state in which rounded portions are formed by isotopic etching;

FIG. 19A is a view of a state in which an adhesive sheet is placed on the mask-placement-faces of semiconductor chips, and FIG. 19B is a view of a state in which the protective sheet is peeled off from the circuit-formation-face;

FIG. 23A is a view of a state before processing is started,

FIG. 23B is a view of a state in which an insulating protective sheet is adhesively placed, and FIG. 23C is a view of a state in which a resist film is formed;

FIG. 24A is a view of a state in which a mask pattern for defining dividing regions is formed, FIG. 24B is a view of a state in which a plasma dicing processing for exposing an insulating protective sheet is carried out, and FIG. 24C is a view of a state in which a plasma dicing processing for notch formation is carried out;

FIG. 25A is a view of a state in which an ashing process is carried out, and

FIG. 25B is a view showing a state in which rounded portions are formed by isotopic etching;

FIG. 26A is a view of a state in which an adhesive sheet is placed on the mask-placement-faces of semiconductor chips, and FIG. 26B is a view of a state in which the insulating protective sheet is peeled off from the circuit-formation-face;

FIG. 27A is a view of a state before processing is started,

FIG. 27B is a view of a state in which a mask pattern for defining dividing regions is formed, and FIG. 27C is a view of a state in which a plasma dicing processing is carried out;

FIG. 28A is a view of a state in which an ashing process is carried out, and

FIG. 28B is a view showing a state in which the protective sheet is peeled off from the circuit-formation-face;

DETAILED DESCRIPTION OF THE INVENTION

Figure 1:
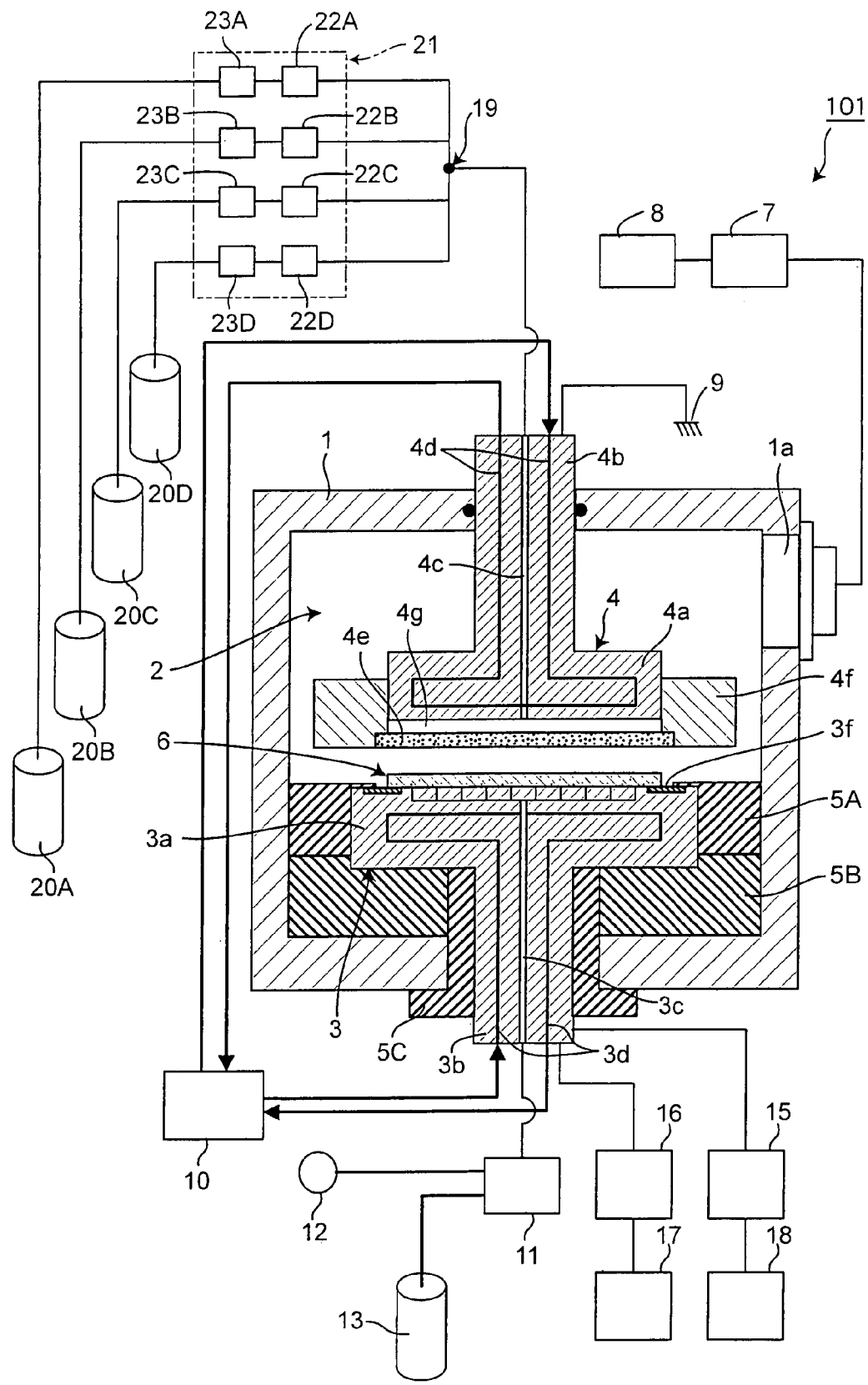
FIG. 1 is a schematic structural view showing the construction of a plasma processing apparatus according to a first embodiment of the present invention.

Before the description of the present invention proceeds, it is to be noted that like parts are designated by like reference numerals throughout the accompanying drawings.

Hereinbelow, one embodiment of the present invention is described in detail with reference to the accompanying drawings.

First Embodiment

Construction of Plasma Processing Apparatus

FIG. 1 shows a schematic structural view that schematically shows the construction of a plasma processing apparatus 101 used for dividing a semiconductor wafer by a manufacturing method for semiconductor chips of the first embodiment of the present invention. It is noted that FIG. 1 is a schematic structural view showing a longitudinal sectional view of the plasma processing apparatus 101. The plasma processing apparatus 101 is the apparatus that manufactures semiconductor chips by dividing a semiconductor wafer, on the circuit-formation-face (first surface) of which a plurality of semiconductor devices are formed, into individual pieces of the semiconductor chips that include the semiconductor devices.

In a series of manufacturing processes of the semiconductor chips as described above, a protective sheet, which is made of a material that is less etchable than, for example, silicon that is the principal material of the semiconductor wafer, is stuck to the circuit-formation-face (i.e., the surface on which the devices are formed) of the semiconductor wafer where the semiconductor devices are formed in device-formation-regions defined by dividing regions arranged in a roughly grating-like shape, and a mask for defining the dividing regions for separating the device-formation-regions into individual pieces from the semiconductor wafer is formed on a mask-placement-face (second surface) that is the surface opposite from the circuit-formation-face. Then, a plasma etching process (plasma processing) such as plasma dicing is carried out by the present plasma processing apparatus 101 on the objective semiconductor wafer in the state.

The construction of the plasma processing apparatus 101 is concretely described with reference to FIG. 1.

In the plasma processing apparatus 101 of FIG. 1, the inside of a vacuum chamber 1 serves as a processing chamber 2 for carrying out processing of the objective semiconductor wafer and is able to form a sealed space for generating plasma under a reduced pressure. A lower electrode 3 (first electrode) is placed on the lower side inside the processing chamber 2, and an upper electrode 4 (second electrode) is placed above the lower electrode 3 and oppositely to the lower electrode 3. The electrode 3 and the upper electrode 4 have a roughly cylindrical shape and are concentrically arranged in the processing chamber 2.

The lower electrode 3 is placed in a state in which its periphery is surrounded by insulating members 5A and 5B that are two layers mounted to fill up the bottom portion of the processing chamber 2 and its upper surface for retaining the object to be processed is fixed exposed at the center portion of the bottom portion of the processing chamber 2. The lower electrode 3 is made of a conductor such as aluminum and includes a disk-shaped electrode portion 3a for retaining the object to be processed and a columnar support portion 3b that protrudes downward from the lower surface of the electrode portion 3a and whose one end is formed exposed outside the vacuum chamber 1 in an integrated state. Moreover, the support portion 3b is held by the vacuum chamber 1 via an insulating member 5C, and the lower electrode 3 is attached to the vacuum chamber 1 in a state in which it is electrically insulated by being thus retained.

The upper electrode 4 is made of a conductor such as aluminum similar to the lower electrode 3 and includes a disk-shaped electrode portion 4a and a columnar support portion 4b that protrudes upward from the upper surface of the electrode portion 4a and whose one end is formed exposed-outside the vacuum chamber 1 in an integrated state. Moreover, the support portion 4b is electrically continued to the vacuum chamber 1 and made elevatable by an electrode elevation unit 24 (see FIG. 13). By the electrode elevation unit 24, the upper electrode 4 is made elevatable between a wafer loading/unloading position that is the upper end position of the elevation and where a large space for loading and unloading a semiconductor wafer between it and the lower electrode 3 is formed and a discharge space formation position that is the lower end position of the elevation and where a discharge space for generating plasma discharge for plasma processing is formed between the upper electrode 4 and the lower electrode 3. The electrode, elevation unit 24 functions as an interelectrode distance changing means and is able to change an interelectrode distance D (see FIG. 2) between the lower electrode 3 and the upper electrode 4 by moving up and down the upper electrode 4.

The detailed structure of the lower electrode 3 and the semiconductor wafer of the object to be processed are described next. As shown in FIG. 1, the upper surface of the electrode portion 3a of the lower electrode 3 is a planar retention surface (one example of the retention portion) on which a semiconductor wafer 6 is placed, and an insulating coating layer 3f is provided around the entire circumference of the outer edge portion of the retention surface. The insulating coating layer 3f is formed of ceramic such as alumina, and the outer edge portion of the insulating coating layer 3f is partially covered with an insulating member 5A as shown in FIG. 1 in a state in which the lower electrode 3 is mounted inside the vacuum chamber 1. The outer edge portion of the lower electrode 3 is insulated from the plasma generated in the discharge space by having the structure, and abnormal electrical discharge can be prevented from being generated.

Figure 2:
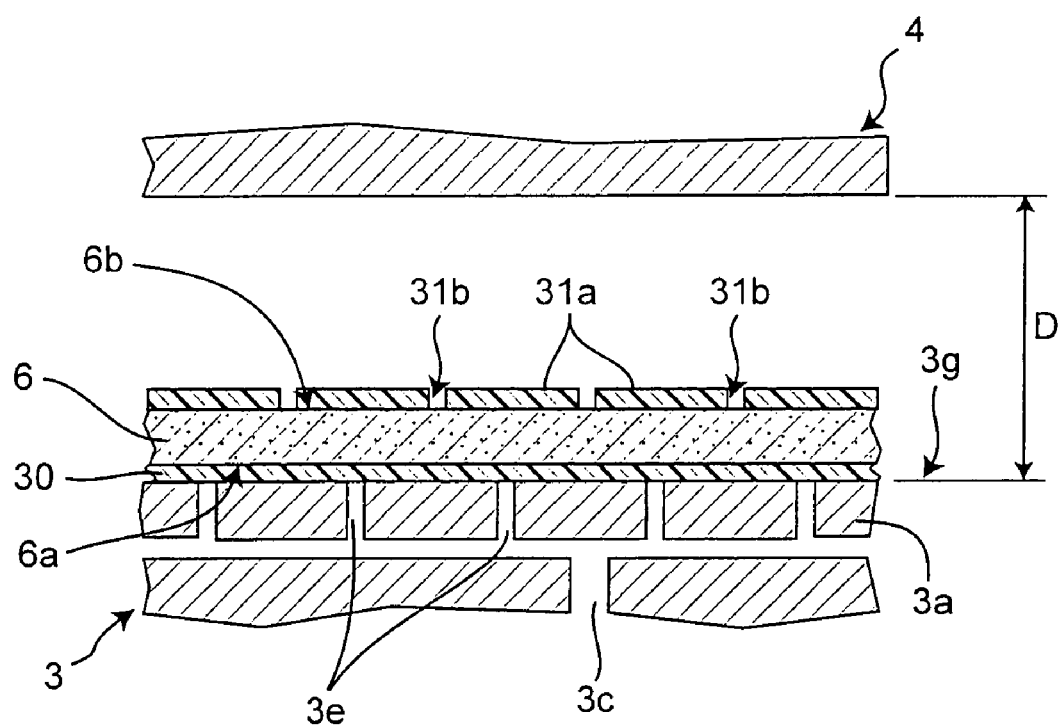
FIG. 2 is a partially enlarged sectional view of the lower electrode of the plasma processing apparatus of FIG. 1.

FIG. 2 is a partial schematic sectional view showing a state in which the semiconductor wafer 6 is placed on the lower electrode 3 before plasma dicing is started. The semiconductor wafer 6 is a semiconductor substrate made of a principal material of, for example, silicon, and a protective sheet 30 is adhesively stuck to a circuit-formation-face 6a (first surface) of the surface (lower surface side in FIG. 2) of the semiconductor wafer 6. In a state in which the semiconductor wafer 6 is placed on a retention surface 3g of the electrode portion 3a that is the upper surface of the lower electrode 3, the protective sheet 30 closely adheres to the retention surface 3g.

The protective sheet 30 has a construction that includes an insulating layer obtained by forming an insulating film such as polyimide into a film having a thickness of about 100 µm and is peelably stuck to the circuit-formation-face 6a of the semiconductor wafer 6 with an adhesive material. When the semiconductor wafer 6 to which the protective sheet 30 is stuck is retained on the lower electrode 3, the insulating layer functions as a dielectric in electrostatically attracting the semiconductor wafer 6 by the retention surface 3g of the electrode portion 3a as described later.

Moreover, with regard to the material of the protective sheet 30, it is preferable to select a material that is less etchable than silicon that is the principal material of the semiconductor wafer 6 during the plasma dicing described later.

Moreover, a mask-placement-face 6b (second surface) on which the mask for defining dividing regions (dividing lines) in the plasma dicing stage described later is placed is provided on the opposite side (upper side in FIG. 2) of the circuit-formation-face 6a. The mask is formed by abrading the surface on the side that becomes the mask-placement-face 6b by, for example, machining as described later and thereafter patterning the surface with a resist film 31a, by which regions excluding the portions that correspond to the dividing regions to be subjected to the plasma etching are covered with the resist film 31a. That is, the portions that correspond to the device-formation-regions are covered with the resist film 31a on the mask-placement-face 6b of the semiconductor wafer 6, so that mask slit portions 31b are arranged in the portions that correspond to the dividing regions.

Moreover, as shown in FIG. 2, the lower electrode 3 has a plurality of attraction holes 3e that open on the retention surface 3g, and the attraction holes 3e communicate with a suction hole 3c provided in the lower electrode 3. As shown in FIG. 1, the suction hole 3c is connected to a vacuum suction pump 12 via a gas line switchover valve 11, and the gas line switchover valve 11 is connected to an $N_2$ gas supply unit 13 that supplies $N_2$ gas. By switching the gas line switchover valve 11, the suction hole 3c can be selectively connected to the vacuum suction pump 12 or the $N_2$ gas supply unit 13.

By selecting the vacuum suction pump 12 by the gas line switchover valve 11 and driving the vacuum suction pump 12 in a state in which the suction hole 3c communicates with the vacuum suction pump 12, the semiconductor wafer 6 placed on the lower electrode 3 can be held by vacuum attraction by effecting vacuum suction through the attraction holes 3e. Therefore, the attraction holes 3e, the suction hole 3c and the vacuum suction pump 12 serve as vacuum suction means for retaining the semiconductor wafer 6 by vacuum attraction in a state in which the protective sheet 30 is closely fit to the retention surface 3g of the electrode portion 3a by effecting suction through the attraction holes 3e that open on the retention surface 3g of the lower electrode 3.

Moreover, by selecting the $N_2$ gas supply unit 13 by the gas line switchover valve 11 and connecting the suction hole 3c to the $N_2$ gas supply unit 13, the $N_2$ gas can be gushed through the attraction holes 3e against the lower surface of the protective sheet 30. The $N_2$ gas is the gas for blowing purpose intended for compulsorily separating the protective sheet 30 from the retention surface 3g as described later.

Moreover, as show in FIG. 1, a refrigerant passage 3d for cooling use is provided in the lower electrode 3, and the refrigerant passage 3d is connected to a cooling unit 10. By driving the cooling unit 10, a refrigerant such as cooling water circulates in the refrigerant passage 3d, by which the semiconductor wafer 6 is cooled via the lower electrode 3 and the protective sheet 30 on the lower electrode 3 of which the temperatures are raised by heat generated during the plasma processing. It is noted that the refrigerant passage 3d and the cooling unit 10 serve as cooling means for cooling the lower electrode 3.

Moreover, in the plasma processing apparatus 101 of FIG. 1, a vacuum pump 8 is connected via an exhaust switchover valve 7 to an exhaust port 1a provided communicating with the processing chamber 2. By driving the vacuum pump 8 by switching the exhaust switchover valve 7 to the exhaust side, the processing chamber 2 of the vacuum chamber 1 is internally evacuated, allowing the processing chamber 2 to be internally decompressed. Moreover, the processing chamber 2 has a pressure sensor 28 (not shown in FIG. 1, see FIG. 4), and by controlling the vacuum pump 8 by a control unit 33 (see FIG. 4) described later on the basis of the pressure measurement result of the pressure sensor 28, the processing chamber 2 can be internally decompressed to the desired pressure. The vacuum pump 8 for decompression to the desired pressure can be controlled by directly controlling the evacuation ability of the vacuum pump 8 itself by using, for example, a variable capacity type as the vacuum pump 8 or providing an opening regulating valve (butterfly valve etc.) in the evacuation path and indirectly controlling the evacuation ability by controlling the opening. It is noted that the vacuum pump 8 and the exhaust switchover valve 7 serve as an evacuation unit (decompression means) that internally decompresses the processing chamber 2 to the desired pressure. Moreover, by switching the exhaust switchover valve 7 to the atmospheric open side, the atmosphere is introduced into the processing chamber 2 through the exhaust port 1a, allowing the internal pressure of the processing chamber 2 to be restored to the atmospheric pressure.

The detailed structure of the upper electrode 4 is described next. The upper electrode 4 has a center electrode portion 4a and an annular member 4f constructed of an insulating film provided fixed to the outer peripheral portion of the electrode so as to surround the electrode portion 4a. The annular member 4f has an inside diameter made approximately equal to the outside diameter of the electrode portion 4a of the upper electrode 4 and is concentrically arranged in a shape that expands outwardly of the circumferential surface of the lower electrode 3. The annular member 4f plays the role of holding a disk-shaped gas blowing portion 4e placed in a lower center portion of the upper electrode 4.

The gas blowing portion 4e supplies a plasma generating gas for generating plasma discharge in the discharge space formed between the upper electrode 4 and the lower electrode 3. The gas blowing portion 4e is a member obtained by processing a porous material that internally has many micropores into a disk-like shape and is able to supply in a uniform state the plasma generating gas supplied into a gas retention space 4g, which is surrounded by the lower surface of the electrode portion 4a of the upper electrode 4, the upper surface of the gas blowing portion 4e and the inner peripheral surface of the annular member 4f, by making the gas uniformly blow into the discharge space via the micropores.

A gas supply hole 4c that communicates with the gas retention space 4g is provided in the support portion 4b, and the gas supply hole 4c is connected to a plasma generating gas supply unit placed outside the vacuum chamber 1. The plasma generating apparatus has a first gas supply unit 20A, a second gas supply unit 20B, a third gas supply unit 20C and a fourth gas supply unit 20D as a plurality of gas supply units that individually supply gases of different kinds, a gas mixing portion (junction of piping) 19 to mix the gasses supplied from the gas supply units 20A, 20B, 20C and 20D and put the gas composition into a uniform state, and a gas flow rate regulating section 21 that is placed between the gas mixing portion 19 and the gas supply units 20A, 20B, 20C and 20D and individually regulates the supply flow rates of the gases supplied to the gas mixing portion 19.

The gas flow rate regulating section 21 has a first flow rate control valve 23A that independently regulates the flow rate of the gas supplied from the first gas supply unit 20A, a first on/off valve 22A capable of interrupting the gas supply, a second flow rate control valve 23B that independently regulates the flow rate of the gas supplied from the second gas supply unit 20B, a second on/off valve 22B capable of interrupting the gas supply, a third flow rate control valve 23C that independently regulates the flow rate of the gas supplied from the third gas supply unit 20C, a third on/off valve 22C capable of interrupting the gas supply, a fourth flow rate control valve 23D that independently regulates the flow rate of the gas supplied from the fourth gas supply unit 20D and a fourth on/off valve 22D capable of interrupting the gas supply. The opening control and the on/off control of the valves are executed by the control unit 33 described later.

The plasma processing apparatus 101 of the present first embodiment is able to supply, for example, a sulfur hexafluoride gas ($SF_6$) from the first gas supply unit 20A, helium (He) from the second gas supply unit 20B, oxygen ($O_2$) from the third gas supply unit 20C and trifluoromethane ($CHF_3$) from the fourth gas supply unit 20D. The plasma generating gas supply units constructed as above makes it possible to individually regulate the flow rate of the gas(es) supplied from one or a plurality of gas supply units selected from the gas supply units 20A, 20B, 20C and 20D by the gas flow rate regulating section 21, supply a mixed gas (or single gas) of the desired gas composition and flow rate to the gas mixing portion 19 and supply the gas (mixed gas) mixed in the gas mixing portion 19 into the discharge space through a gas supply hole 4c, a gas retention space 4g and a gas blowing portion 4e.

Moreover, by changing only the supply flow rate without changing the gas composition, i.e., the gas supply ratio by using the function of the gas flow rate regulating section 21 that can individually regulate the flow rate of each gas, the internal pressure of the processing chamber 2 can be controlled. In concrete, by controlling the gas flow rate regulating section 21 by the control unit 33 on the basis of a preset pressure condition and the internal pressure of the processing chamber 2 detected by the pressure sensor 28, the internal pressure of the processing chamber 2 can be regulated to coincide with the pressure condition. Therefore, the gas flow rate regulating section 21 concurrently has the function of regulating the composition of the gas supplied into the processing chamber 2 and the function of controlling the internal pressure of the processing chamber 2.

Moreover, as shown in FIG. 1, the lower electrode 3 is electrically connected to a high-frequency power unit 17 via a matching circuit 16. By driving the high-frequency power unit 17, a high-frequency voltage is applied between the upper electrode 4 that is electrically continued to the vacuum chamber 1 grounded to a grounding portion 9 and the lower electrode 3. As a result, plasma discharge is generated in the discharge space between the upper electrode 4 and the lower electrode 3 in the processing chamber 2, and the plasma generating gas supplied into the processing chamber 2 makes a transition to the plasma state. Moreover, the matching circuit 16 has the function of matching the impedance of the plasma discharge circuit in the processing chamber 2 with the high-frequency power unit 17 at the time of generating plasma. In the present embodiment, the high-frequency power unit 17 and the matching circuit 16 serve as one example of the high-frequency power applying device.

Further, a DC power unit 18 for electrostatic attraction is connected to the lower electrode 3 via an RF filter 15. By driving the DC power unit 18 for electrostatic attraction, the surface of the lower electrode 3 is charged with negative charge (indicated by "−" in the figure) as shown in the schematic view of the plasma processing apparatus 101 of FIG. 3A. As shown in the schematic view of the plasma processing apparatus 101 of FIG. 3B, if a plasma 34 (indicated by the dotted portion in the figure) is generated in the processing chamber 2 by driving the high-frequency power unit 17 in this state, a direct current application circuit 32 that connects the semiconductor wafer 6 placed on the retention surface 3g via the protective sheet 30 to the grounding portion 9 is formed via the plasma 34 in the processing chamber 2. As a result, a closed circuit that sequentially connects the lower electrode 3, the RF filter 15, the DC power unit 18 for electrostatic attraction, the grounding portion 9, the plasma 34 and the semiconductor wafer 6 is formed, and the semiconductor wafer 6 is charged with positive charge (indicated by "+" in the figure).

Then, a Coulomb force takes effect between the negative charge "−" in the retention surface 3g of the lower electrode 3 formed of a conductor and the positive charges "+" in the semiconductor wafer 6 via the protective sheet 30 that includes an insulating layer as a dielectric, so that the semiconductor wafer 6 is retained on the lower electrode 3 by the Coulomb force. At this time, the RF filter 15 prevents the radio-frequency voltage of the radio-frequency power unit 17 from being applied directly to the DC power unit 18 for electrostatic attraction. It is noted that the polarity of the DC power unit 18 for electrostatic attraction may be reversed. As described above, in the plasma processing apparatus 101, the components that substantially contribute to the generation of the plasma can also be referred to as a plasma generating apparatus.

Moreover, in the above construction, the DC power unit 18 for electrostatic attraction serves as an electrostatic attraction means for electrostatically attracting the semiconductor wafer 6 by utilizing the Coulomb force that takes effect between the semiconductor wafer 6 and the retention surface 3g of the lower electrode 3, which are separated by the protective sheet 30, by applying a DC voltage to the lower electrode 3. That is, with regard to the retention means for retaining the semiconductor wafer 6 on the lower electrode 3, the two types of the vacuum suction means for vacuum attraction of the protective sheet 30 via the plurality of attraction holes 3e that open on the retention surface 3g and the electrostatic attraction means can properly be used.

Moreover, a refrigerant passage 4d for cooling use is provided in the upper electrode 4 as in the lower electrode 3, and the refrigerant passage 4d is connected to the cooling unit 10. A refrigerant such as cooling water circulates in the refrigerant passage 4d by driving the cooling unit 10, and this makes it possible to cool the upper electrode 4 whose temperature has been elevated by heat generated during the plasma processing.

Figure 7:
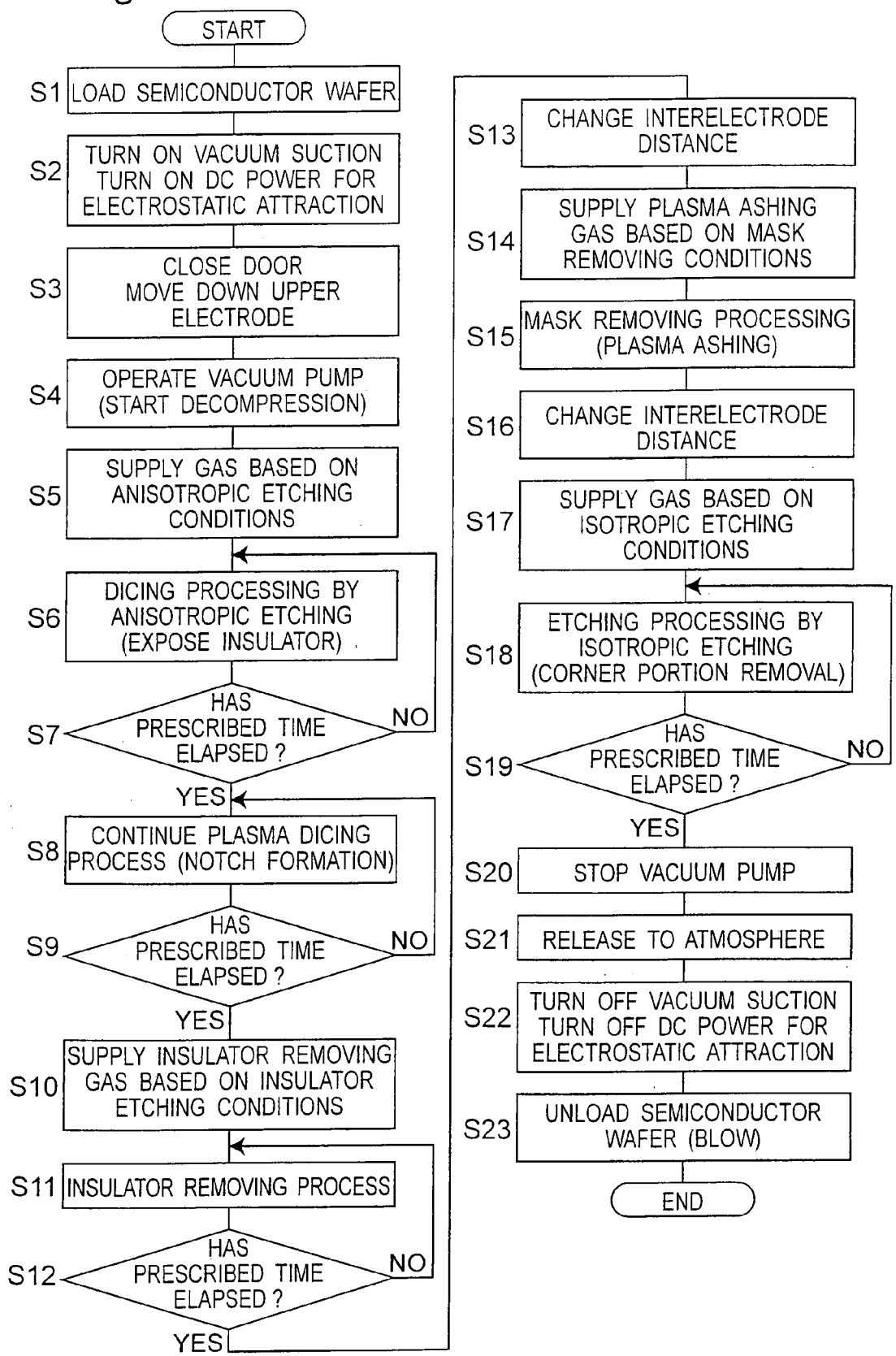
FIG. 7 is a flow chart showing the procedure of a semiconductor wafer dividing method according to the first embodiment.
Figure 13:
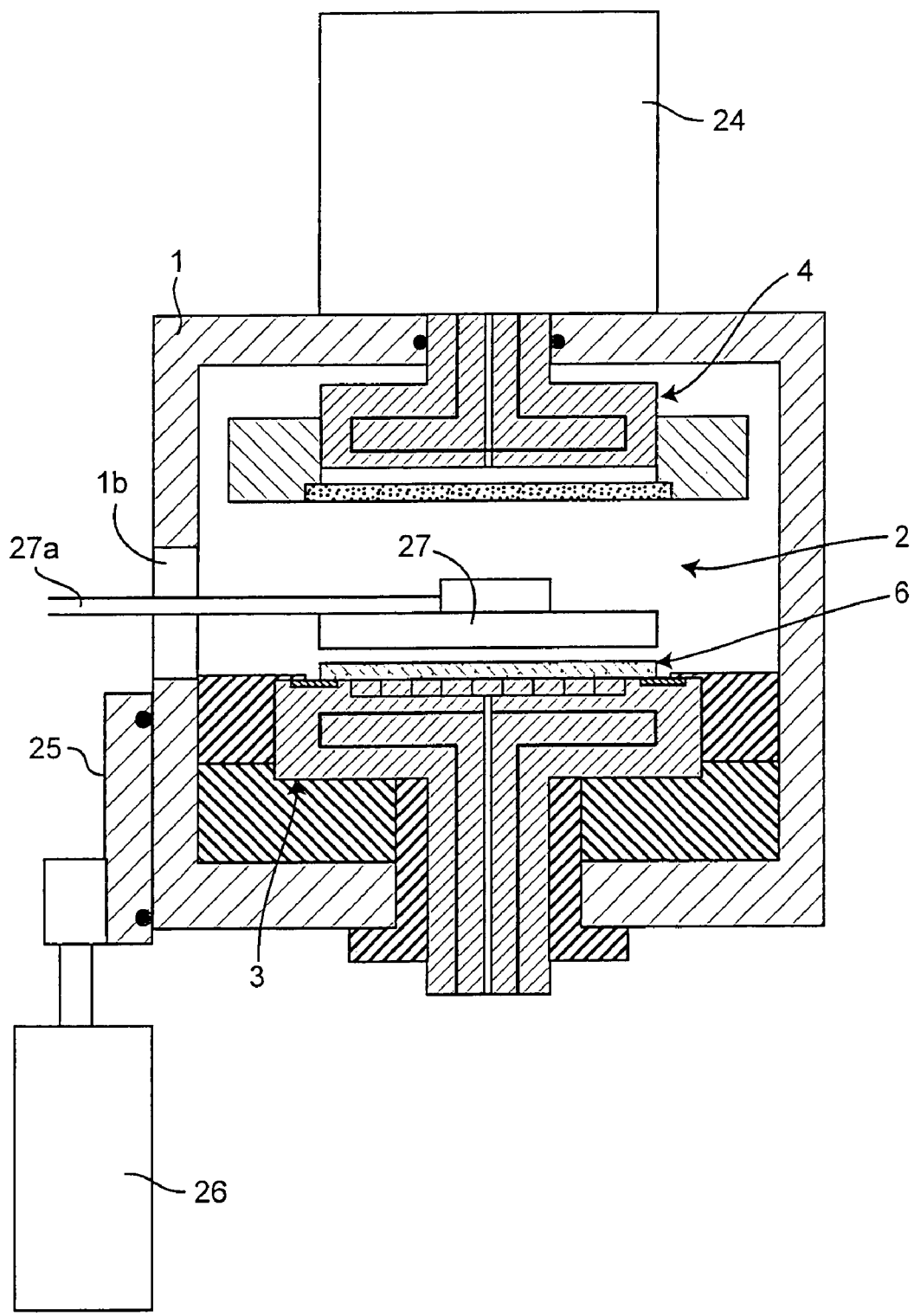
FIG. 13 is a schematic sectional view of the plasma processing apparatus in a state in which a semiconductor wafer is loaded.

Moreover, an opening 1b for loading and unloading the semiconductor wafer 6 that is the object to be processed is provided on the side surface of the processing chamber 2 (see FIG. 13). A door 25 that is moved up and down by a door opening/closing unit 26 is provided outside the opening 1b, and the opening 1b is opened and closed by moving up and down the door 25. FIG. 7 shows a state in which the semiconductor wafer 6 is loaded and unloaded with the opening 1b opened by moving down the door 25 by the door opening/closing unit 26.

Moreover, as shown in FIG. 13, a space for conveyance use is secured between the upper electrode 4 and the lower electrode 3 by moving up the upper electrode 4 by the electrode elevation unit 24 to position the electrode in the wafer loading/unloading position during the loading and unloading of the semiconductor wafer 6. In this state, a suction head 27 that is sucking and holding the semiconductor wafer 6 is made to enter the processing chamber 2 via the opening 1b by operating an arm 27a. By this operation, the loading of the semiconductor wafer 6 onto the lower electrode 3 and the unloading of the processed semiconductor wafer 6 (semiconductor devices) are performed.

Construction of Control System

The construction of the control system of the plasma processing apparatus 101 that has the above construction is described next with reference to the block diagram of the control system shown in FIG. 4.

Figure 4:
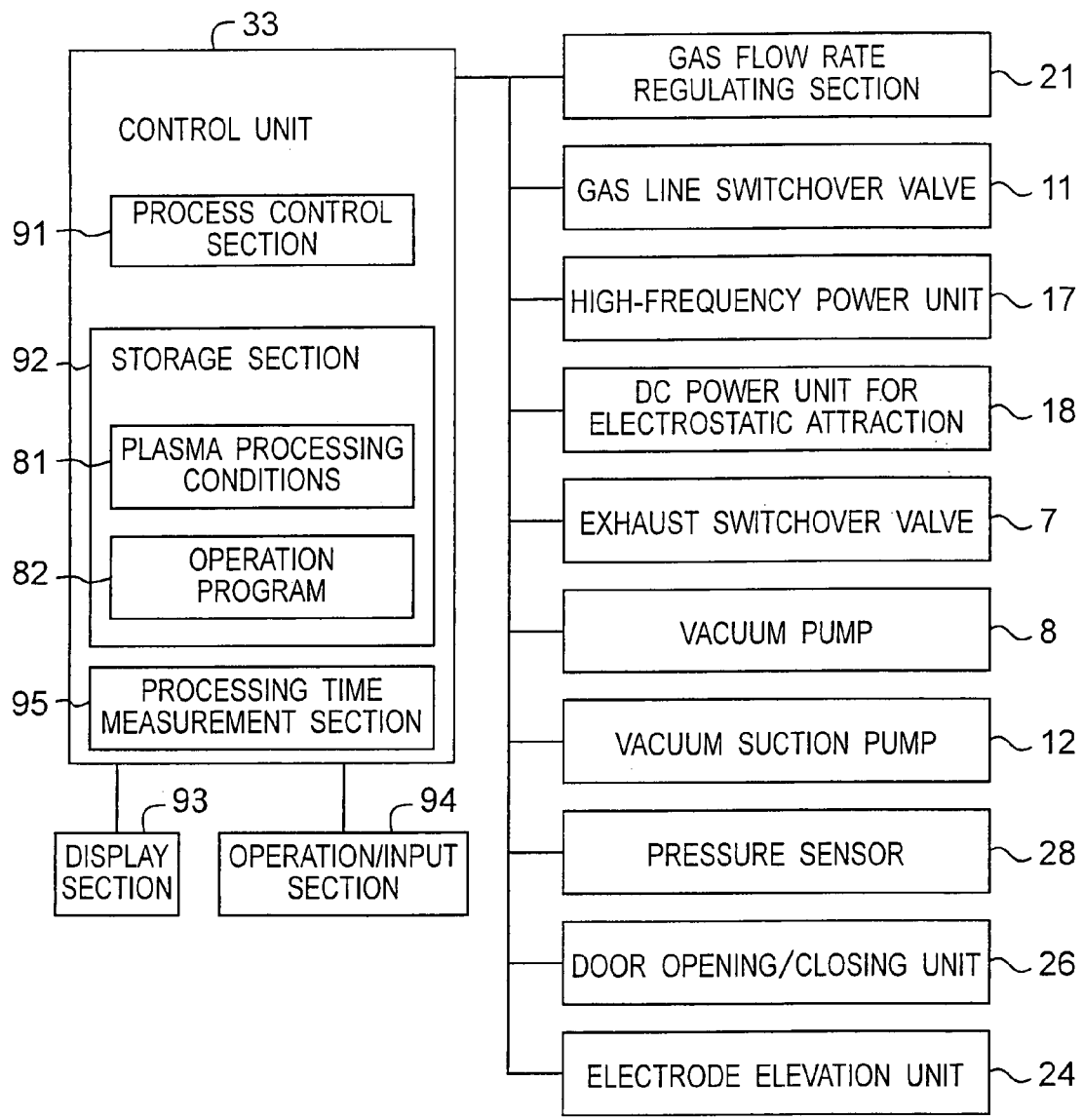
FIG. 4 is a control block diagram showing the construction of the control system of the plasma generating apparatus of FIG. 1.

As shown in FIG. 4, the control unit 33 has a storage section 92 that stores various data and a processing program and a process control section 91 that executes control of the plasma processing by executing the operation control of the components of the plasma processing apparatus 101 on the basis of these data and processing program. The storage section 92 stores plasma processing conditions 81 (allowed to be plasma conditions or operating conditions) and an operation program 82 of the plasma processing, and the process control section 91 executes control of the plasma processing on the basis of the operation program 82 and the plasma processing conditions 81. An operation/input section 94 is the input means such as a keyboard and executes data input of the plasma processing conditions and so on and input of operating commands. A display section 93 is a display device, which displays a guide screen and so on at the time of operation input. Although not shown, it may be a case where the control unit 33 has an external input/output interface and exchange of information with the outside of the device is performed.

In this case, the plasma processing conditions used in the plasma processing apparatus 101 of the present first embodiment is described. The plasma processing steps carried out in the present first embodiment includes mainly four processing steps of a plasma dicing processing (or plasma etching processing), an insulator removal processing, a mask removal processing and a corner portion removal processing (second corner portion removal processing described later) as described later. Moreover, in the plasma dicing processing, two processing steps of an insulator exposure processing and a first corner portion removal processing (or notch formation processing) are carried out by performing plasma etching as described later, and plasma processing conditions 81 for carrying out the processing steps are preliminarily individually determined. In concrete, the plasma processing conditions 81 are determined by combinational conditions of, for example, the gas composition of the plasma generating gas, the pressure inside the processing chamber 2 and a high frequency (discharge frequency) applied between the upper electrode 4 and the lower electrode 3.

Moreover, in the plasma processing apparatus 101 of the present first embodiment, two types of etching of mutually different etching characteristics of anisotropic etching that has a more intense etching characteristic in the direction of thickness than in the direction along the surface of the semiconductor wafer 6 (i.e., etching characteristic principally effected in the direction of thickness) and isotopic etching that has a roughly equivalent etching characteristic in the direction along the surface and the direction of thickness are used as the plasma etching. In concrete, in the plasma dicing processing, the insulator exposure processing and the corner portion removal processing are carried out by performing the anisotropic etching on the same plasma processing conditions, and the second corner portion removal processing is carried out by performing the isotopic etching. Here, intensity of the etching characteristic in the direction of thickness is expressed as "A", and intensity of the etching characteristic in the direction along the surface of the semiconductor wafer 6 is expressed as "B", it is desirable to set ratios between "A" and "B" for the respective types of etching as follows, For the anisotropic etching: A/B≧10
For the isotopic etching: 2≧A/B≧1

One example of the plasma processing conditions 81 as described above is shown in the data table of FIG. 12. As shown in FIG. 12, plasma processing conditions 81A for the anisotropic etching of the insulator exposure processing and the corner portion removal processing are provided by the combinational conditions that the gas composition of the mixed gas (i.e., mixture ratio of the gases) is constituted of $SF_6$ and $O_2$ at a ratio of 10:2, the pressure is 100 Pa and the frequency is 60 MHz. Moreover, plasma processing conditions 81B for the isotropic etching are provided by the combinational conditions that the gas composition is constituted of $SF_6$ and He at a ratio of 10:30, the pressure is 500 Pa and the frequency is 13.56 MHz. As conditions other than those of the plasma dicing processing, there is an interelectrode distance D between the upper electrode 4 and the lower electrode 3, and, for example, a value (assumed to be an interelectrode distance D1) considered to be optimum within a range of 5 to 50 mm as the interelectrode distance D is set as the plasma processing conditions 81A and 81B.

Moreover, plasma processing conditions 81C for the insulating film removing process are provided by the combinational conditions that the gas composition is constituted of $CHF_3$ at a ratio of 20, the pressure is 50 Pa and the frequency is 13.56 MHz when silicon oxide ($SiO_2$) is used as the insulator as described later. Further, plasma processing conditions 81D for the mask removal process are provided by the combinational conditions that the gas composition is constituted of $O_2$ at a ratio of 20, the pressure is 50 Pa and the frequency is 13.56 MHz. Moreover, a value (assumed to be an interelectrode distance D2) considered to be optimum within a range of 50 to 100 mm as the interelectrode distance D is set for the plasma processing conditions 81D for the mask removal process. Moreover, the plasma processing conditions 81 include the condition of a processing time.

Moreover, although the selective execution of (or switchover between) the anisotropic etching and the isotropic etching in the plasma dicing processing, i.e., the selective execution of the etching characteristic should preferably be achieved by alternatively selecting the plasma processing conditions 81A or the plasma processing conditions 81B determined by the combinations of the gas composition, the pressure and the frequency as described above, the selected parameters are not limited to the conditions. It may be a case where the selective execution of the etching characteristic can be achieved even when only one parameter of, for example, the gas composition, the pressure and the frequency is selectively switched in place of such a case. For the selection of the etching characteristic, the gas composition is the most effective parameter, and the second and third most effective parameters are the pressure and the frequency, respectively. For example, when the selective execution of the etching characteristic is performed by only changing the gas composition, the switchover from the anisotropic etching to the isotropic etching can be achieved by changing the gas composition of $SF_6:O_2$:He from 10:2:0 to 10:0:30. Moreover, when the selective execution of the etching characteristic is performed by only changing the internal pressure of the processing chamber 2, switchover from the anisotropic etching to the isotropic etching can be achieved by increasing the pressure (e.g., from 100 Pa to 500 Pa). Moreover, when the selective execution of the etching characteristic is performed by only changing the frequency of the high frequency, switchover from the anisotropic etching to the isotropic etching can be achieved by lowering the frequency (e.g., from 60 MHz to 13.56 MHz). It is noted that, for example, a high-frequency output (e.g., set within a range of 500 to 3000 W) and a gas supply flow rate are also used as a parameter besides these parameters.

Moreover, as the gas composition for the anisotropic etching, it is preferable to use a gas composition such that a reaction product that easily deposits (deposition: vapor deposition or deposition). For example, a fluorine oxide of silicon ($Si_xF_yO_z$) (x, y and z are integers in this case) can be generated as the reaction product by using a gas composition that includes oxygen as the gas composition for the anisotropic etching. The fluorine oxide has a characteristic that it is less etchable than silicon. Taking advantage of the characteristic allows the groove portions to be formed on the surface of the semiconductor wafer by performing the anisotropic etching and allows the film to be formed on the inner surface side of the formed groove portions by making the generated fluorine oxide adhere to the surface (sidewall deposition). On the other hand, the fluorine oxide does not easily adhere to the bottom surfaces of the groove portions by physical etching with accelerated ions. For the above reasons, the inner surfaces of the groove portions can be made less etchable than the bottom surfaces, and this consequently allows the etching to produce an intense effect in the direction of thickness of the semiconductor wafer, so that more ideal anisotropic etching can be achieved. Therefore, it is preferable to use the gas composition that promotes the anisotropic etching, i.e., the gas composition that easily causes sidewall deposition as the gas composition for the anisotropic etching.

The plasma processing conditions 81A for the anisotropic etching, the plasma processing conditions 81B for the isotropic etching, the plasma processing conditions 81C for the insulator removing process and the plasma processing conditions 81D for the mask removing process are stored in the storage section 92 of the control unit 33. The plasma processing conditions 81 necessary for each processing step are selected on the basis of the operation program 82, and the plasma processing is carried out by the process control section 91 on the basis of the selected plasma processing conditions 81.

During the plasma processing carried out on the basis of the operation program 82, as shown in FIG. 4, the components, which are the gas flow rate regulating section 21, the gas line switchover valve 11, the high-frequency power unit 17, the DC power unit 18 for electrostatic attraction, the exhaust switchover valve 7, the vacuum pump 8, the vacuum suction pump 12, the door opening/closing unit 26 and the electrode elevation unit 24, are controlled by the process control section 91.

Moreover, by regulating the total supply amount of the gases by controlling the gas flow rate regulating section 21 by the process control section 91 on the basis of the pressure detection result by the pressure sensor 28, the internal pressure of the processing chamber 2 can be controlled to coincide with the plasma processing conditions 81.

Further, as shown in FIG. 4, the control unit 33 has a processing time measurement section 95, which measures the processing time of the plasma processing and executes control such that, when the measurement result reaches the condition of the processing time included in the plasma processing conditions 81, control to end the processing is by the process control section 91 can be performed.

The principle of the plasma etching processing method used in the present first embodiment is described next with reference to the partially enlarged schematic explanatory views of the neighborhood of the dividing regions of the semiconductor wafer 6 shown in FIGS. 5 and 6.

Figure 5:
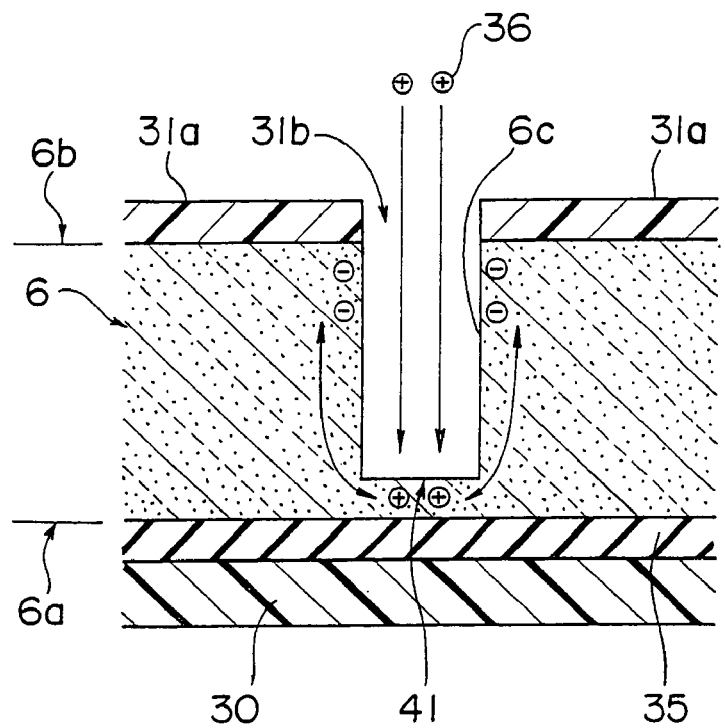
FIG. 5 is a schematic explanatory view for explaining the principle of a plasma dicing processing method used in the first embodiment, showing a state in which the insulating film is not exposed from an etching bottom portion.

FIG. 5 is a view showing a state in which the plasma etching process is carried out on the portion that corresponds to the mask slit portion (or mask cutout portion) 31b, i.e., the dividing region from the mask-placement-face 6b side on the semiconductor wafer 6 to the circuit-formation-face 6a of which the protective sheet 30 is adhesively stuck and on which the resist film 31a is placed to define the dividing region on the mask-placement-face 6b. Moreover, as shown in FIG. 5, the semiconductor wafer 6 used in the present first embodiment is the semiconductor wafer on the circuit-formation-face 6a of which the silicon oxide film 35 formed of silicon oxide ($SiO_2$) of one example of the insulating film (that is, insulating thin film or insulating layer) is formed also in the portion that corresponds to the dividing region. The semiconductor wafer has a construction different from that of the conventional semiconductor wafer on which no such silicon oxide is formed in the portion that corresponds to the dividing region. It is noted that the protective sheet 30 is adhesively stuck to the circuit-formation-face 6a located on the thus-formed silicon oxide film 35 side.

As shown in FIG. 5, the ions in the plasma are made roughly perpendicularly incident on the semiconductor wafer 6 by an electric field generated in the plasma processing apparatus 101, and the incident ions reach the bottom portion (etching bottom portion) of a groove portion formed by an etching process, promoting the etching. The ions (having positive charge) that have reached the etching bottom portion are recombined with electrons in the semiconductor wafer 6 formed of silicon that is the semiconductor material. That is, since the silicon material also has characteristics as a conductor, the ions that have reached the etching bottom portion and have positive charge are recombined with the electrons in the semiconductor wafer 6 due to an electric continuity between the etching bottom portion and the inside of the semiconductor wafer 6. The etching bottom portion is not charged with positive charge so long as the electric continuity is achieved.

Figure 6:
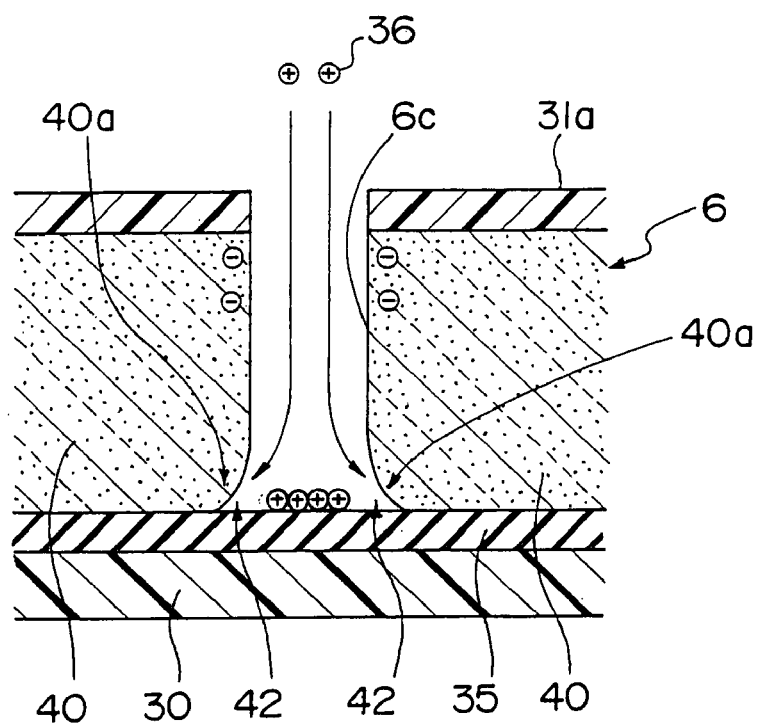
FIG. 6 is a schematic explanatory view for explaining the principle of the plasma dicing processing method used in the first embodiment, showing a state in which notch formation is performed with the insulating film exposed from the etching bottom portion.

On the other hand, as shown in FIG. 6, when a state in which the etching progresses to remove the etching bottom portion and expose the surface of the silicon oxide film 35, no electric continuity is achieved between the exposed silicon oxide film 35 and the inside of the semiconductor wafer 6, and therefore, the silicon oxide film 35 exposed by the reach of the ions is surface charged (electrically charged) with positive charge for the charging of the positive charge. When the state in which the thus exposed silicon oxide film 35 is charged with the positive charge, ions that enter next looses the straightness thereof due to the electric fields of positive charges, and the track (trajectory) thereof is to be bent. Consequently, as shown in FIG. 6, the ions reach both corner portions of the groove portion, so that etching is performed at both the corner portions, and removed portions of a shape that is called "notch" where the groove portion is sharply expanded in the widthwise direction at the bottom portions are formed. This is the principle of the plasma etching process method used in the present first embodiment.

By thus forming the notches at the bottom portions of the groove portion, removal of the corner portions of the separated semiconductor chips, or, for example, formation of rounded (R) portions that are curved convex surface portions when viewed from the semiconductor wafer 6 side, or the side to be etched can be achieved (first corner portion removal processing). Moreover, with regard to the principle of the plasma processing method as described above, it is preferable to perform anisotropic etching so that the ions in the applied plasma easily reach the etching bottom portions in the state shown in FIG. 5, i.e., in the state in which the silicon oxide film 35 is not exposed, and the anisotropic etching is also performed in the insulator exposure processing of the first embodiment. Moreover, a processing time necessary for exposing the silicon oxide film 35 (i.e., processing time of the insulator exposure processing) and a processing time (i.e., processing time of the first corner portion removal processing) necessary for forming notches of a prescribed size (i.e., removing the corner portions, such as chamfering and rounded portion formation) after the exposure of the silicon oxide film 35 in the plasma dicing processing are included in the plasma processing conditions 81A.

Semiconductor Chip Manufacturing Method

Next, a manufacturing method for semiconductor chips carried out by the plasma processing apparatus 101 that has the construction described above and a semiconductor wafer dividing method (plasma dicing processing) carried out through the process of the manufacturing method for semiconductor chips are described below. A flow chart showing a series of procedure of the semiconductor wafer dividing method is shown in FIG. 7, and schematic explanatory views for explaining a series of processing contents of the manufacturing method for semiconductor chips are shown in FIGS. 8A through 8C, FIGS. 9A through 9C, FIGS. 10A through 10C and FIGS. 11A and 11B. Reference is made with reference to mainly these figures.

Figure 8A:
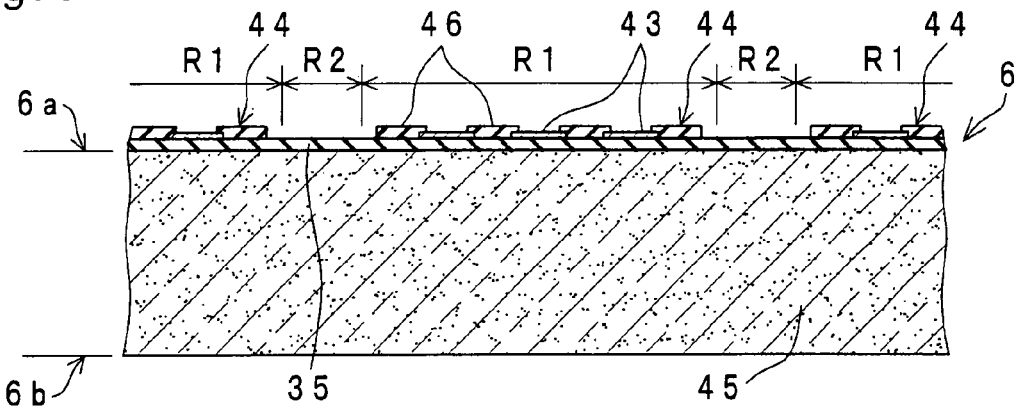
FIGS. 8A through 8C are schematic explanatory views of a semiconductor wafer showing the processes of a semiconductor chip manufacturing method according to the first embodiment, where.

The semiconductor wafer 6 has a disk-like shape, and a plurality of device-formation-regions R1 are arranged in a matrix form on its circuit-formation-face 6a. The size of the device-formation-regions R1 are determined according to the size of the semiconductor chips to be manufactured and arranged in, for example, rectangular regions. FIG. 8A shows a partially enlarged schematic sectional view of the semiconductor wafer 6. As shown in FIG. 8A, dividing regions R2, which are roughly belt-shaped regions that have a prescribed width dimension (i.e., a region that has a width dimension sufficiently smaller than that in the lengthwise direction thereof), are arranged between the mutually adjacent device-formation-regions R1. The dividing regions R2 serve as the regions that are arranged in a roughly grating-like shape on the circuit-formation-face 6a of the semiconductor wafer 6 defining the device-formation-regions R1 and also serve as the frame-shaped regions arranged outside the peripheries of the device-formation-regions R1 with regard to the relation thereof to one device-formation-region R1. Further, the dividing regions R2 are located in dividing positions where the device-formation-regions R1 are separated into individual pieces in the plasma dicing processing. Moreover, the semiconductor devices 44 are formed in the respective device-formation-regions R1.

As shown in FIG. 8A, the semiconductor wafer 6 is formed of a silicon substrate 45 that has a disk-like shape, and the silicon oxide film 35 formed of $SiO_2$ is formed on the entire circuit-formation-face 6a thereof. Further, the semiconductor devices 44 are formed in portions that correspond to the device-formation-regions R1 of the circuit-formation-face 6a. The semiconductor devices 44 include devices of MOS (Metal-Oxide-Semiconductor) structure transistors constructed of a silicon substrate 45 (Semiconductor), a silicon oxide 35 (Oxide) formed directly on the circuit-formation-face 6a and a metal film (Metal) formed on the silicon oxide 35. Further, the semiconductor devices 44 have connection terminals 43 (also called the bonding pads) for electrically connecting the devices to external electronic apparatuses. It is noted that a surface protection film 46 (e.g., formed of polyimide) is formed on the surfaces of the semiconductor devices 44 for the protection of the surfaces of the semiconductor devices 44. The connection terminals 43 are not covered with the surface protection film 35 but exposed outside.

Figure 8B:
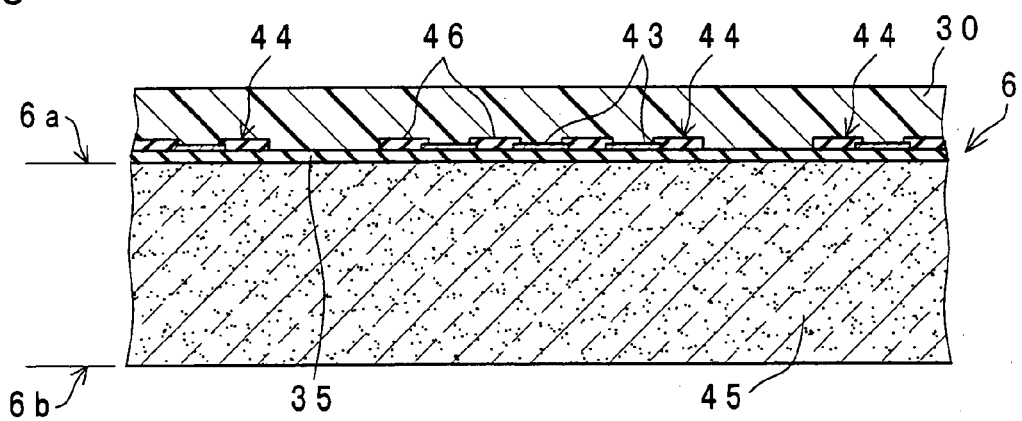

As shown in FIG. 8B, in order that the circuit-formation-face 6a might not suffer damages during each process subsequently carried out on the semiconductor wafer 6, the protective sheet 30 is peelably stuck to the circuit-formation-face 6a via an adhesive. With regard to the protective sheet 30, one that is shaped into the same shape as the exterior shape of the semiconductor wafer 6 is used so that the sheet covers the entire surface of the circuit-formation-face 6a and does not protrude from the semiconductor wafer 6. By using the protective sheet 30 of this shape, damage to a portion of the protective sheet 30 protruding from the semiconductor wafer 6 by the plasma can be prevented from occurring in the subsequent processing such as plasma processing.

Figure 8C:
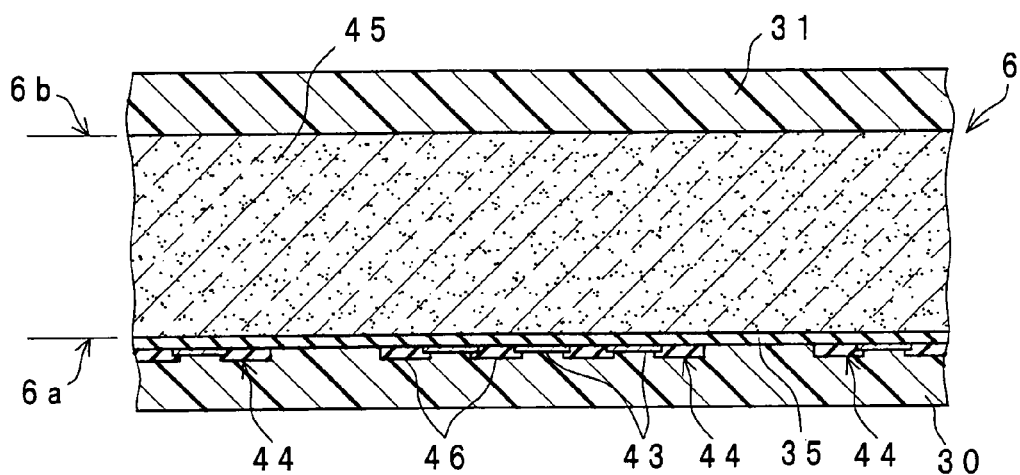
Figure 9A:
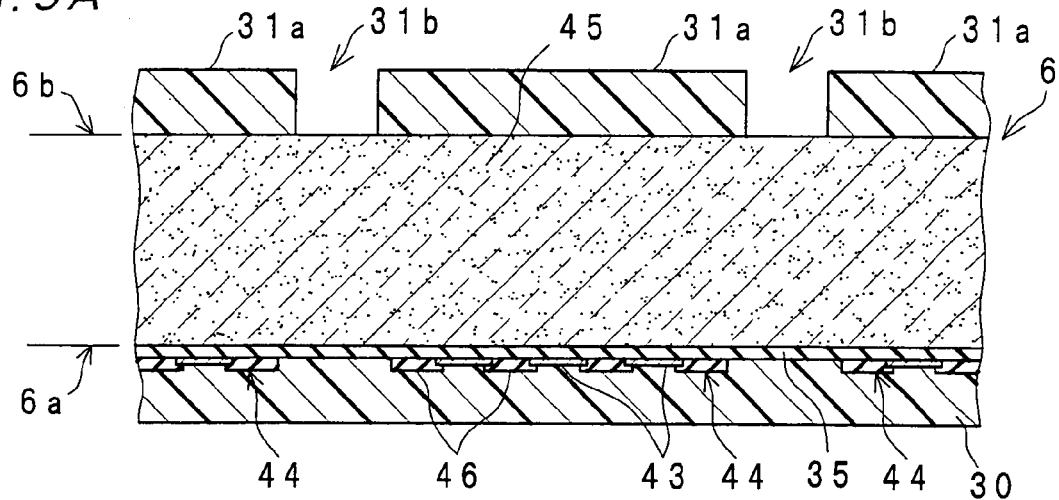
FIGS. 9A through 9C are schematic explanatory views of the semiconductor wafer showing the processes of the semiconductor chip manufacturing method continued from FIG. 8C, where.

Next, as shown in FIG. 8C, a mask for defining the dividing regions R2 for dividing the semiconductor wafer 6 into individual pieces of semiconductor chips are formed on the mask-placement-face 6b that is the back surface of the circuit-formation-face 6a of the semiconductor wafer 6. A resist film 31 made of, for example, a resin is formed as the mask to cover the entire surface of the mask-placement-face 6b of the semiconductor wafer 6. Subsequently, as shown in FIG. 9A, mask slit portions 31b are formed by patterning the resist film 31 by photolithography and removing only the portions that correspond to the dividing regions R2 by a width of, for example, 20 μm. As a result, a mask pattern such that the portions that correspond to the device-formation-regions R1 are covered with the resist film 31a and the portions that correspond to the dividing regions R2 are exposed at the mask slit portions 31b is formed on the mask-placement-face 6b of the semiconductor wafer 6. The semiconductor wafer 6 provided with the mask in the state becomes the object to be subjected to the plasma processing described later.

Figure 14:
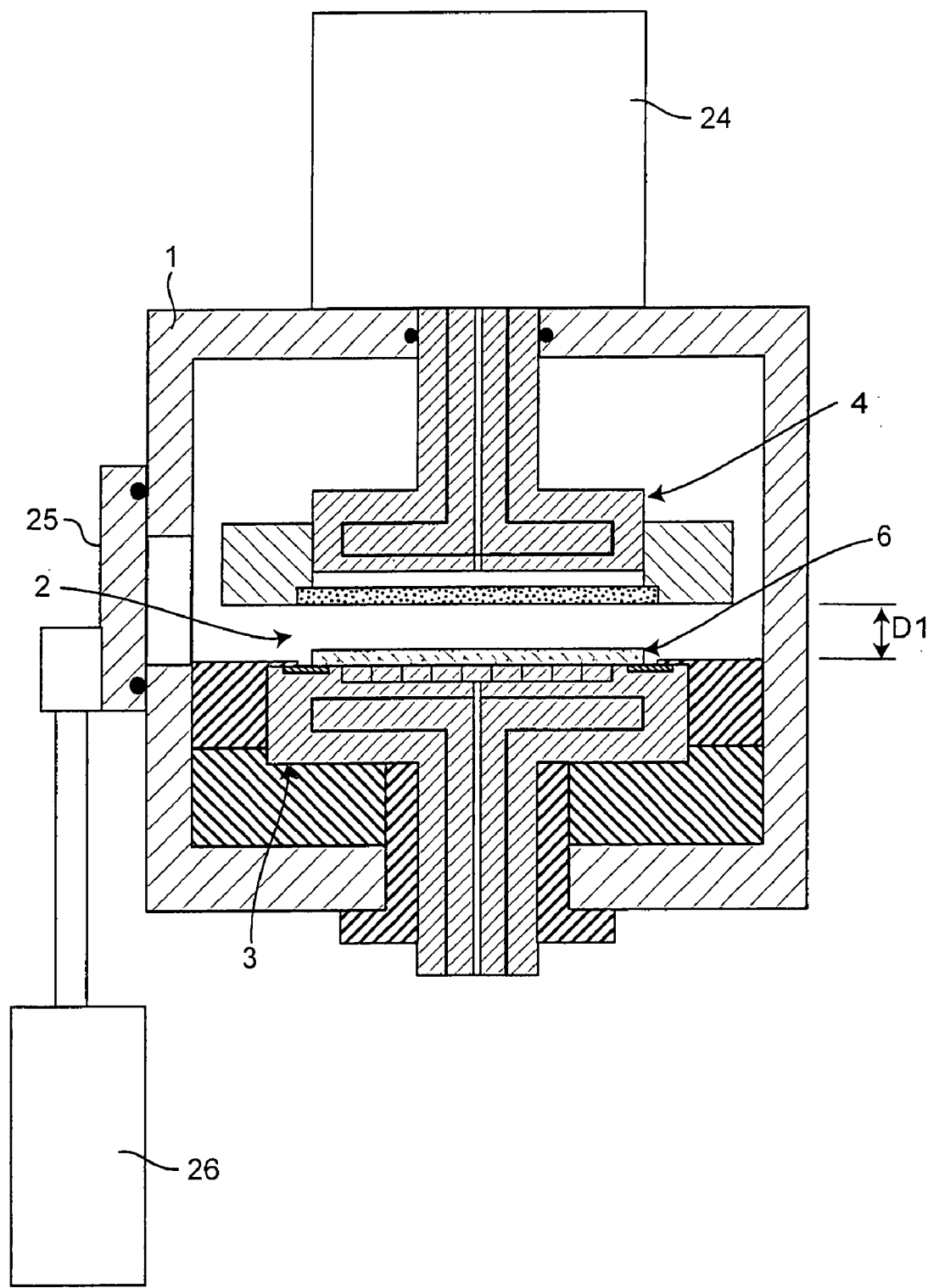
FIG. 14 is a schematic sectional view of the plasma processing apparatus in a state in which a plasma dicing processing is carried out.
Figure 15:
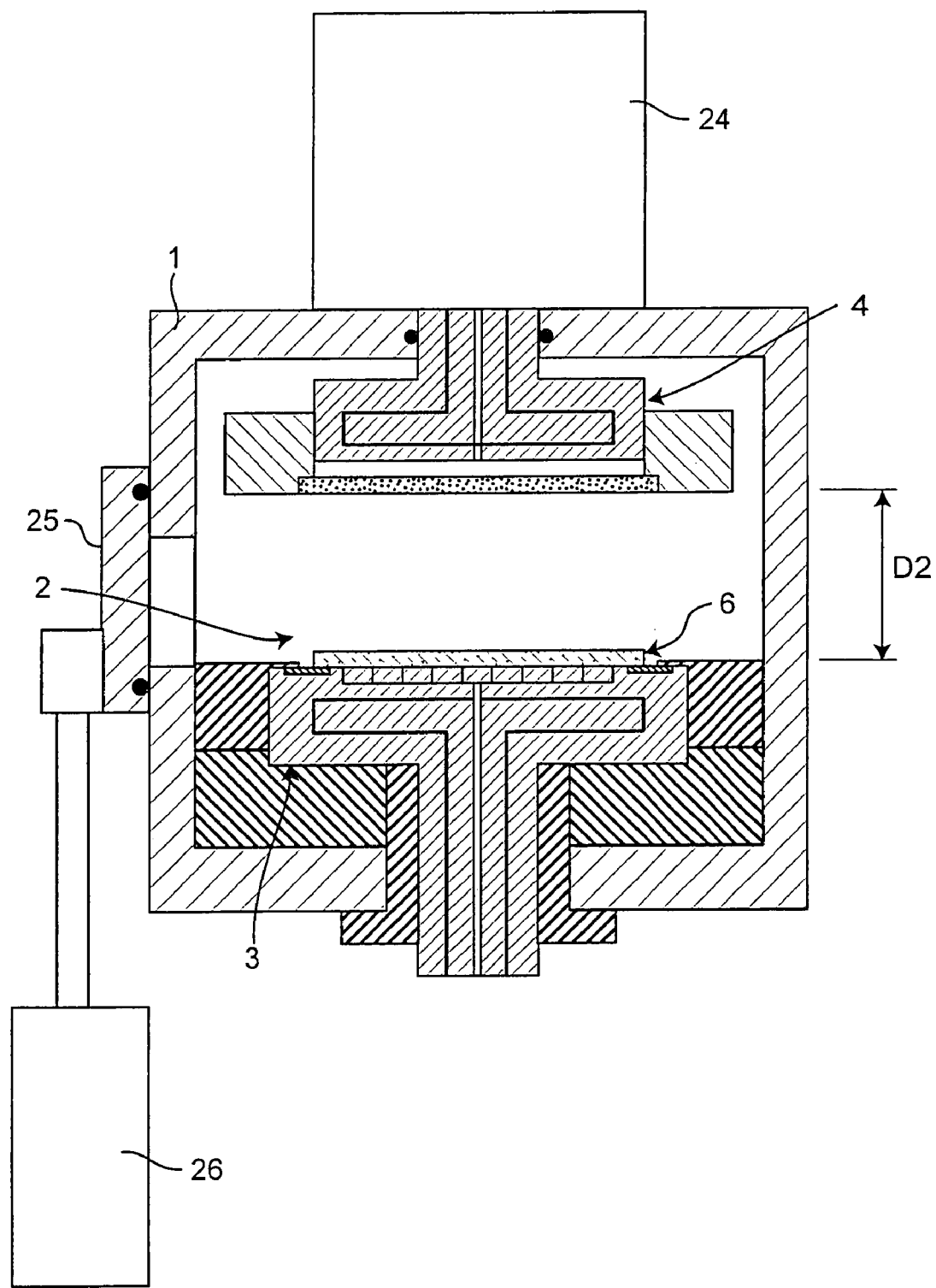
FIG. 15 is a schematic sectional view of the plasma processing apparatus in a state in which a plasma ashing process is carried out.

A method for dividing the semiconductor wafer, 6 provided with the mask into individual pieces of semiconductor chips is described according to the flow chart of FIG. 7 with reference to the schematic views of the plasma processing apparatus 101 shown in FIGS. 13 through 15. It is noted that the control of each subsequent operation in the plasma processing apparatus 101 is executed by controlling the components by the process control section 91 on the basis of the operation program 82 stored in the storage section 92 of the control unit 33.

First of all, in step S1 of the flow chart of FIG. 7, the semiconductor wafer 6 provided with the mask is loaded into the processing chamber 2 as shown in FIG. 13. During the loading operation, the semiconductor wafer 6 held by the suction head 27 via the mask is loaded through the opening 1b into the processing chamber 2 by operating the arm 27a in a state in which the upper electrode 4 is moved up by the electrode elevation unit 24, and the semiconductor wafer 6 is placed on the lower electrode 3 via the protective sheet 30.

Next, the vacuum suction pump 12 is driven to effect vacuum suction through the attraction holes 3e to turn on the vacuum attraction of the semiconductor wafer 6, and the DC power unit 18 for electrostatic attraction is turned on (step S2). By the vacuum attraction, the semiconductor wafer 6 is held by the lower electrode 3 in a state in which the protective sheet 30 closely adhere to the retention surface 3g of the lower electrode 3 in the processing chamber 2.

Subsequently, the door 25 is closed as shown in FIG. 14, and the upper electrode 4 is moved down by the electrode elevation unit 24 (step S3). At this time, the plasma processing conditions 81A for the anisotropic etching is selected and taken out of the plasma processing conditions 81 stored in the storage section 92 of the control unit 33 by the process control section 91 on the basis of the operation program 82, and the interelectrode distance D between the upper electrode 4 and the lower electrode 3 is set to a prescribed condition (i.e., interelectrode distance D1) within a range of, for example, 5 to 50 mm based on the condition of the interelectrode distance D included in the plasma processing conditions 81A for the anisotropic etching.

Next, the vacuum pump 8 is operated to start decompression in the processing chamber 2 (step S4). When the inside of the processing chamber 2 reaches a prescribed degree of vacuum, the gasses selected by the gas flow rate regulating section 21 are regulated to a prescribed gas composition and a prescribed flow rate based on the selected plasma processing conditions 81A for the anisotropic etching and supplied into the processing chamber 2 (step S5). In concrete, the first on/off valve 22A is opened on the basis of the plasma processing conditions 81A for the anisotropic etching, and $SF_6$ is supplied from the first gas supply unit 20A to the gas mixing portion 19 with the supply flow rate thereof regulated by the first flow rate control valve 23A. In addition, the third on/off valve portion 22C is opened, and $O_2$ is supplied from the third gas supply unit 20C to the gas mixing portion 19 with the supply flow rate thereof regulated by the third flow rate control valve 23C. At this time, the second on/off valve 22B and the fourth on/off valve 22D are put in a closed state, and neither He nor $CHF_3$ is supplied. Moreover, $SF_6$ and $O_2$ are mixed together so as to have a gas composition of 10:2 at the gas mixing portion 19 and supplied into the processing chamber 2.

Then, in the gas supply process, the internal pressure of the processing chamber 2 is detected by the pressure sensor 28 and compared with the pressure condition (e.g., 100 Pa) in the plasma processing conditions 81A, and it is confirmed that the detected pressure has reached the pressure expressed by the pressure condition. That is, the interelectrode distance D between the lower electrode 3 and the upper electrode 4, the composition of the gases to be supplied to the processing chamber 2 and the internal pressure of the processing chamber 2 are set on the basis of the plasma processing conditions 81A for the anisotropic etching.

Then, after the condition setting is completed, a high-frequency voltage that agrees with the condition is applied between the upper electrode 4 and the lower electrode 3 by driving the high-frequency power unit 18 on the basis of the frequency (e.g., 60 MHz) and the output condition of the high-frequency of the plasma processing conditions 81A, and plasma discharge is started (step S6). As a result, the supplied mixed gas makes a transition to the plasma state in the discharge space between the upper electrode 4 and the lower electrode 3. By the plasma generation, ions in the plasma are applied from the mask side (resist film 31a side) to the semiconductor wafer 6. By the application of ions, only the portions corresponding to the dividing regions R2 that are not covered with the resist film 31a of the silicon (i.e., silicon substrate 45) that is the principal material of the semiconductor wafer 6 are etched.

Figure 3A:
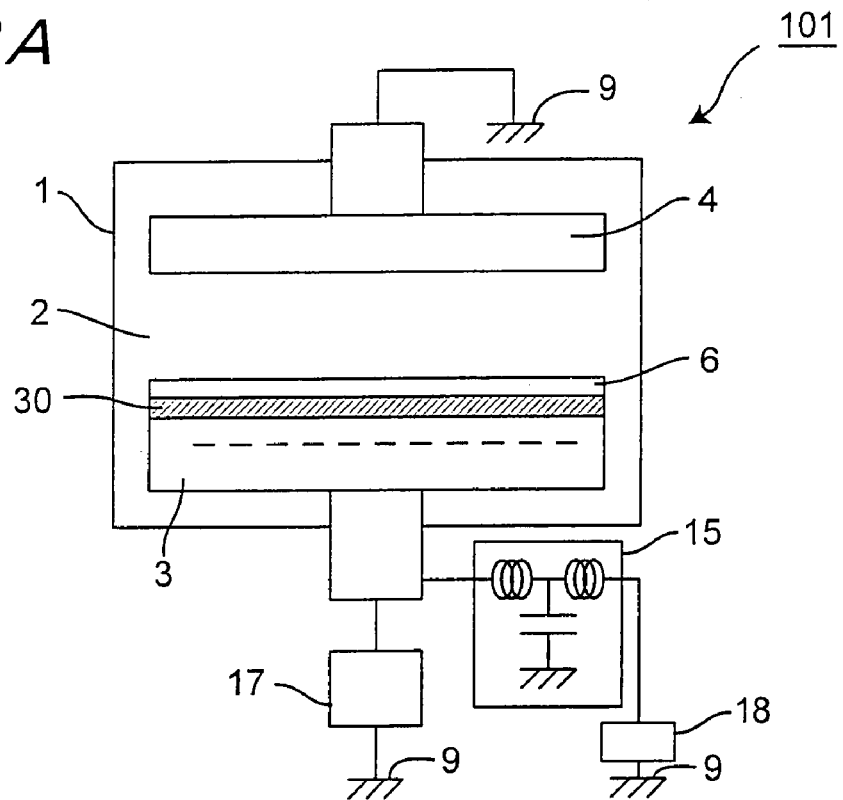
FIGS. 3A and 3B are schematic structural views of the plasma processing apparatus of FIG. 1, where.
Figure 3B:
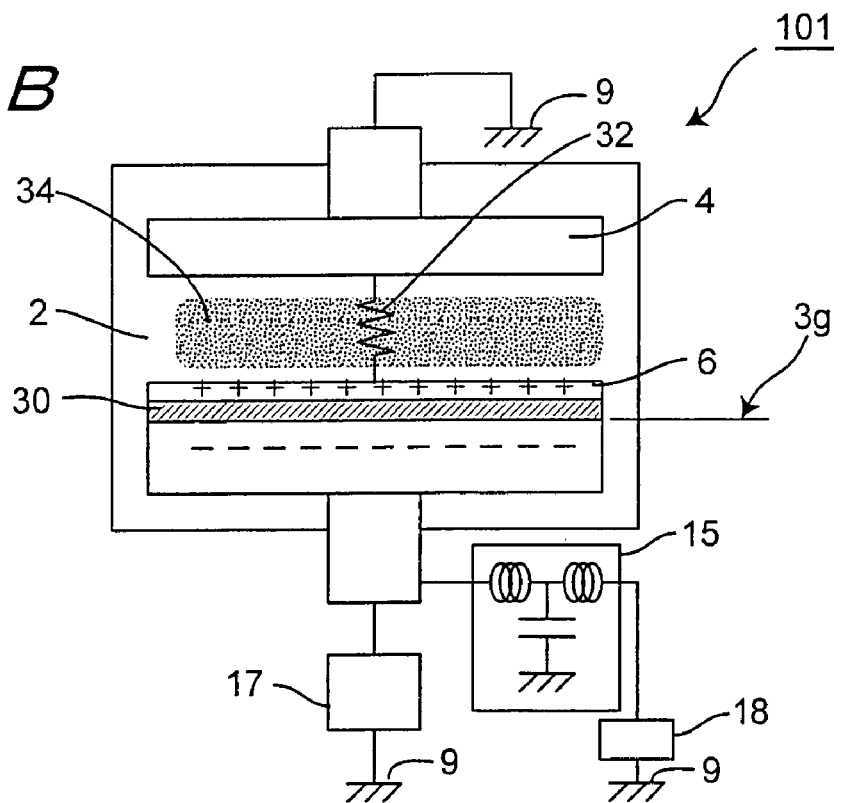

Concurrently with this, a direct current application circuit 32 is formed in the discharge space between the upper electrode 4 and the lower electrode 3 by the plasma (see FIGS. 3A and 3B). As a result, an electrostatic attraction force is generated between the lower electrode 3 and the semiconductor wafer 6, and the semiconductor wafer 6 is held by the lower electrode 3 with the electrostatic attraction force. Therefore, the protective sheet 30 satisfactorily adheres close to the retention surface 3g of the lower electrode 3, and the semiconductor wafer 6 is stably retained in the plasma processing process. In addition, the protective sheet 30 is satisfactorily cooled by the cooling function provided for the lower electrode 3, and a thermal damage due to heat generated by the plasma discharge is prevented.

Figure 9B:
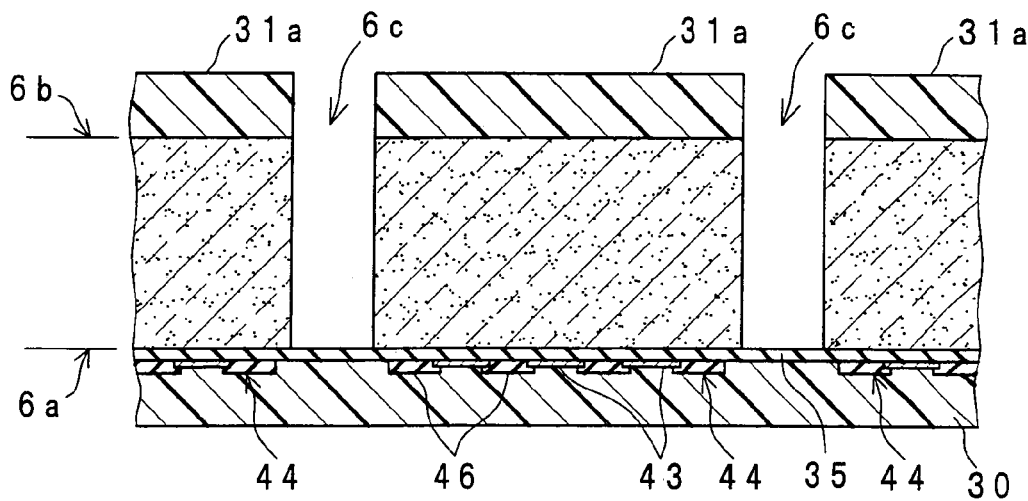

Moreover, since anisotropic etching is performed on the basis of the plasma processing conditions 81A in the plasma dicing processing (insulator exposure processing) by the anisotropic etching, the etching characteristic has an increase in the thickness direction of the semiconductor wafer 6. Therefore, as shown in FIG. 9B, the surface of the semiconductor wafer 6 corresponding to the mask slit portions 31b is etched in the thickness direction, so that groove portions 6c are formed having a width that is roughly equal to the width of the mask slit portions 31b, i.e., the width of the dividing regions R2.

Moreover, in step S7, the plasma dicing processing (insulator exposure processing) in step S6 is carried out until the etching bottom portion that is the bottom portion of the groove portion 6c is removed by etching and the surface of the silicon oxide film 35 is exposed from the bottom portion (i.e., until the surface of the insulator is exposed), or, for example, until the time measured by the processing time measurement section 95 reaches the condition of the processing time necessary for exposing the silicon oxide film 35 included in the plasma processing conditions 81A. By thus providing a state in which the silicon oxide film 35 is exposed at the groove portions 6c, the portions that correspond to the dividing regions R2 are removed from the silicon substrate 45.

Figure 9C:
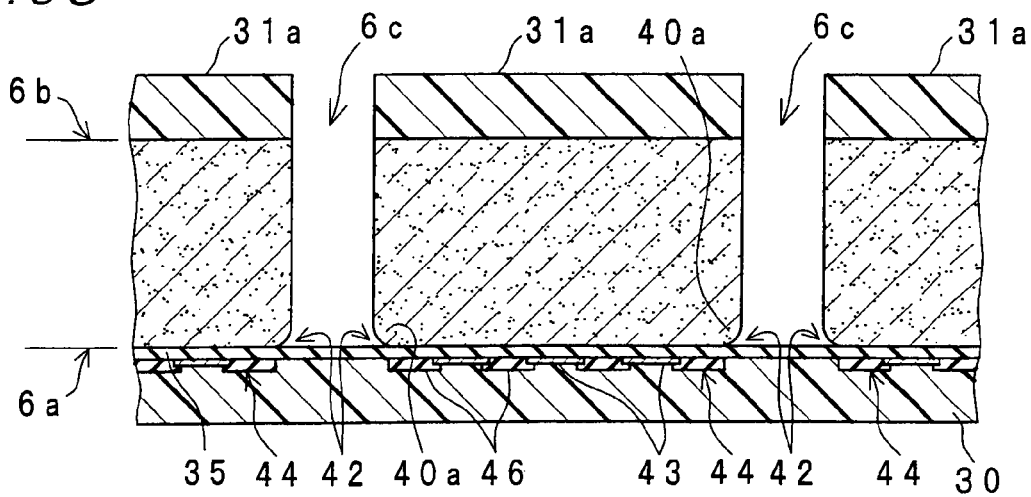

When it is determined in step S7 that it reaches the prescribed time, the plasma dicing processing under the same condition is continuously carried out by anisotropic etching in step S8 as a plasma dicing processing for performing the notch formation (i.e., notch formation processing or first corner portion removal processing). As a result, the exposed silicon oxide film 35 becomes electrically charged with the positive charge of the ions applied from inside the plasma to the bottom portions of the groove portions 6c, and the trajectory of the incident ions in the groove portions 6c are consequently bent, performing the etching of the divided silicon substrate 45 so that the bottom portions of the groove portions 6c are expanded in the widthwise direction. Consequently, as shown in FIG. 9C, notches 42 are formed at both corner portions of the bottom portions of the groove portions 6c, i.e., the corner portions of the portions put in contact with the silicon oxide film 35 of each piece of the divided silicon substrate 45 are removed, forming rounded (R) portions 40a.

The plasma dicing processing for notch formation in step S8 is carried out in step S9 until the notches 42 and the rounded portions 40a of the prescribed sizes are formed, e.g., the time measured by the processing time measurement section 95 reaches the condition of the processing time necessary for forming the notches of the prescribed size included in the plasma processing conditions 81A.

If it is determined that it has reached the processing time in step S9, then the plasma dicing processing (notch formation processing) by the anisotropic etching is ended, and the plasma processing conditions 81C for the removal of the insulating film are selected by the process control section 91, and the gases selected by the gas flow rate regulating section 21 are regulated to a prescribed gas composition and a prescribed flow rate based on the conditions and supplied into the processing chamber 2 (step S10). In concrete, the fourth on/off valve 22D is opened on the basis of the plasma processing conditions 81C for the removal of the insulating film, and $CHF_3$ is supplied from the fourth gas supply unit 20D to the gas mixing portion 19 with the supply flow rate thereof regulated by the fourth flow rate control valve 23D.

Then, it is confirmed that the internal pressure of the processing chamber 2 detected by the pressure sensor 28 has reached a pressure condition (e.g., 50 Pa) in the plasma processing conditions 81C in the gas supply process. It is noted that the interelectrode distance D1 between the lower electrode 3 and the upper electrode 4 is kept as it is.

Subsequently, by starting plasma discharge with a high-frequency voltage that agrees with the conditions applied between the upper electrode 4 and the lower electrode 3 by driving the high-frequency power unit 18 on the basis of the frequency (e.g., 13.56 MHz) and the output condition of the plasma processing conditions 81C, the plasma etching for removing the silicon oxide 35 exposed at the groove portions 6C is started (insulator removal processing in step S11).

Figure 10A:
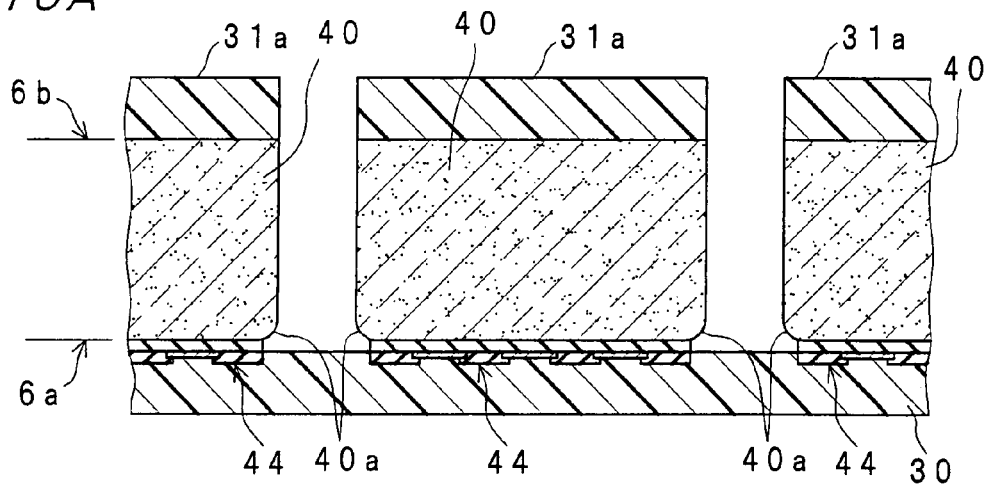
FIGS. 10A through 10C are schematic explanatory views of the semiconductor wafer showing the processes of the semiconductor chip manufacturing method continued from FIG. 9C, where.

By carrying out the plasma etching as described above, the silicon oxide 35 that has been exposed, i.e., the silicon oxide 35 located in the portions that correspond to the dividing regions R2 are positively etched as shown in FIG. 10A, so that the silicon oxide 35 in the portions is removed. Consequently, the portions that correspond to the dividing regions R2 are completely removed from the semiconductor wafer 6, and the device-formation-regions R1 are separated into individual pieces, forming the semiconductor chips 40 that include the respective semiconductor devices 44. It is noted that the plasma etching is carried out until the time measured by the processing time measurement section 95 reaches the processing time included in the plasma processing conditions 81C (step S12).

If it is determined in step S12 that it has reached the prescribed time, then the plasma etching process for the insulating film removing process, i.e., the insulator removal processing is ended. When the processing is ended, the supply of the mixed gas and the application of the high-frequency voltage are stopped. Subsequently, an interelectrode distance change for making a transition to the plasma ashing process (mask removal processing) is performed (step S13). In concrete, the plasma processing conditions 81D for the mask removing process are selected by the process control section 91, and the upper electrode 4 is moved up by the electrode elevation unit 24 as shown in FIG. 15 on the basis of the conditions, setting the interelectrode distance between the upper electrode 4 and the lower electrode 3 to the interelectrode distance D2. The interelectrode distance D2 when the mask is removed by the plasma ashing as described above is set wider than the interelectrode distance D1 in the plasma dicing processing.

Subsequently, the third gas supply unit 20C is selected on the basis of the plasma processing conditions 81D, and a plasma ashing gas (e.g., oxygen) is supplied from the third gas supply unit 20C with the gas supply flow rate regulated (step S14). Then, by detecting the internal gas pressure of the processing chamber 2 in the gas supply process and comparing the pressure with that of the plasma processing conditions, it is confirmed that the pressure has reached the pressure expressed by the conditions.

Subsequently, by applying the high-frequency voltage between the upper electrode 4 and the lower electrode 3 by driving the high-frequency power unit 18, plasma discharge is started (step S15). As a result, the supplied gas makes a transition to the plasma state in the discharge space between the upper electrode 4 and the lower electrode 3. The thus generated plasma takes effect on the mask-placement-face 6b of the semiconductor wafer 6, thereby ashing (incinerating) the resist film 31a made of an organic substance by the plasma.

Figure 10B:
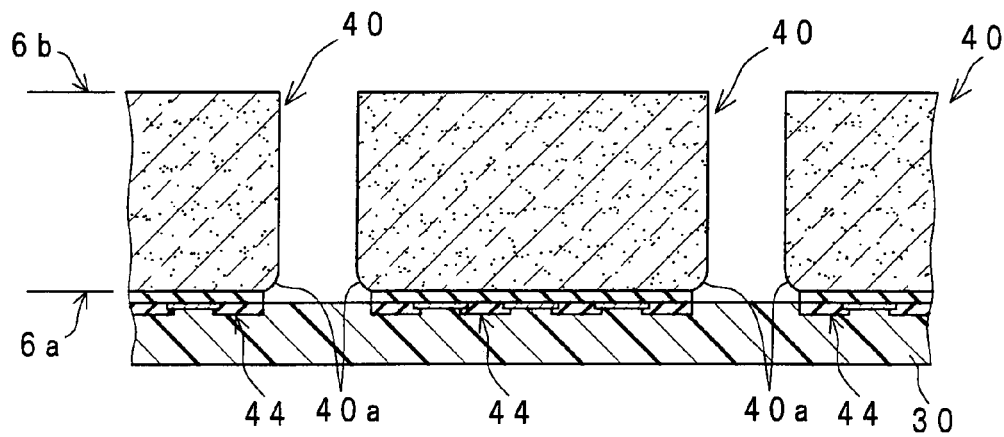

Then, with the progress of the ashing, the resist film 31a gradually disappears, and finally, the mask is completely removed from the semiconductor wafer 6, i.e., the mask-placement-face 6a of the semiconductor chips 40 formed into individual pieces as shown in FIG. 10B. The output of the high-frequency power source in the mask removal processing is set to a prescribed value set within a range of, for example, 100 to 1000 W based on the plasma processing conditions 81D. Then, after the mask is completely removed, the plasma discharge is stopped.

Subsequently, an interelectrode distance change for making a transition to the plasma etching process (second corner portion removal processing) by isotropic etching is performed (step S16). In concrete, the plasma processing conditions 81B for the isotropic etching process are selected by the process control section 91, and the position of the upper electrode 4 is moved by the electrode elevation unit 24 on the basis of the conditions, setting the interelectrode distance between the upper electrode 4 and the lower electrode 3. In concrete, the interelectrode distance D between the upper electrode 4 and the lower electrode 3 is set to a prescribed condition (i.e., interelectrode distance D1) within a range of, for example, 5 to 50 mm on the basis of the interelectrode distance D included in the plasma processing conditions 81B for the isotropic etching.

Yet subsequently, the gas selected by the gas flow rate regulating section 21 is supplied into the processing chamber 2 while being regulated to a prescribed gas composition and a prescribed flow rate on the basis of the plasma processing conditions 81B for the isotropic etching (step S17). In concrete, the first on/off valve 22A is opened on the basis of the plasma processing conditions 81B for the isotropic etching, and $SF_6$ is supplied from the first gas supply unit 20A to the gas mixing portion 19 with the supply flow rate thereof regulated by the first flow rate control valve 23A. In addition, the second on/off valve portion 22B is opened, and He is supplied from the second gas supply unit 20B to the gas mixing portion 19 with the supply flow rate thereof regulated by the second flow rate control valve 23B. At this time, the third on/off valve 22C and the fourth on/off valve 22D are put in a closed state, and neither $O_2$ nor $CHF_3$ is supplied. Moreover, $SF_6$ and He are mixed together so as to have a gas composition of 10:30 at the gas mixing portion 19 and supplied into the processing chamber 2.

Then, it is confirmed that the internal pressure of the processing chamber 2 detected by the pressure sensor 28 has reached a pressure condition (e.g., 500 Pa) in the plasma processing conditions 81B in the gas supply process (step S17).

Subsequently, by starting plasma discharge with a high-frequency voltage that agrees with the conditions applied between the upper electrode 4 and the lower electrode 3 by driving the high-frequency power unit 18 on the basis of the high frequency (e.g., 13.56 MHz) and the output condition of the plasma processing conditions 81B, the plasma etching process (second corner portion removal processing) by the isotropic etching is started (step S18).

Since the isotopic etching has a feature that the etching characteristic in the direction along the surface of the semiconductor wafer 6 and the etching characteristic in the direction of thickness are roughly equal to each other, the etching is performed roughly equally in each of the directions in the portions to which the plasma is applied. Although the etching characteristic in the direction of thickness actually tends to become slightly more intense than the etching characteristic in the direction along the surface even by the isotropic etching, it is unchanged that an etching characteristic obviously different from that of the anisotropic etching is exhibited.

Figure 10C:
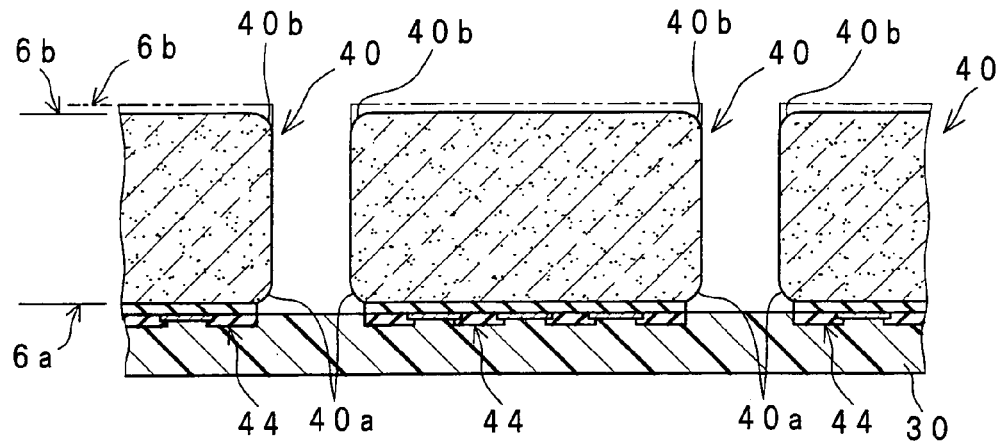

If the plasma etching is carried out by the isotropic etching, as shown in FIG. 10C, etching of the mask-placement-face (second surface) 6b from which the resist film 31a has been removed is started on each of the semiconductor chips 40. Moreover, during the isotropic etching, the groove portions 6c formed by the plasma dicing processing by the anisotropic etching are etched in the direction along the surface of the semiconductor wafer 6 in the neighborhood of the entrance (i.e., in the neighborhood of the upper portion in the figure). Therefore, the groove portions 6c are etched so as to be slightly expanded in the widthwise direction thereof. Moreover, the etching characteristic tends to become more intense in the neighborhood of the entrance of the groove portions 6c and weaker as approaching the bottom portions. Therefore, by performing the isotropic etching, as shown in FIG. 10C, the etching is performed on the entire surfaces of the second surfaces 6b of the semiconductor chips 40, and the rounded (R) portions 40b that are curved convex surface portions can be formed at the end portions put in contact with the dividing regions R2. That is, the rounded portions 40b are formed at the end portions (corner portions) located on the second surface 6b side and the four corner portions of the rectangular plane.

It is noted that the plasma etching process by the isotropic etching in step S18 is carried out until the rounded portions 40b are formed into a prescribed size in step S19, or, for example, until the time measured by the processing time measurement section 95 elapses over the processing time of the plasma processing conditions 81B for the isotropic etching. Moreover, when it is determined that the prescribed time has elapsed in step S19, the plasma etching process by the isotropic etching is ended.

Subsequently, the operation of the vacuum pump 8 is stopped (step S20), and the exhaust switchover valve 7 is switched for release to the atmosphere (step S21). As a result, the internal pressure of the processing chamber 2 is restored into the atmospheric pressure. Then, the vacuum attraction is turned off, and the DC power unit for electrostatic attraction is turned off (step S22). As a result, the retention by attraction of the semiconductor wafer 6 in a state in which it is divided into individual pieces of the semiconductor chips 40 and retained by the protection tape 30 is released.

Yet subsequently, the semiconductor wafer 6 that has undergone the plasma processing is unloaded (step S23). That is, the semiconductor wafer 6 is sucked and held by the suction head 27 and unloaded to the outside of the processing chamber 2 with the $N_2$ gas blown through the attraction holes 3e. As a result, the plasma processing for continuously carrying out the insulator removal processing, the notch formation processing (first corner portion removal processing), the insulating film removing process, the mask removal processing and the isotropic etching processing (second corner portion removal processing) is ended in the plasma processing apparatus 101.

Figure 11A:
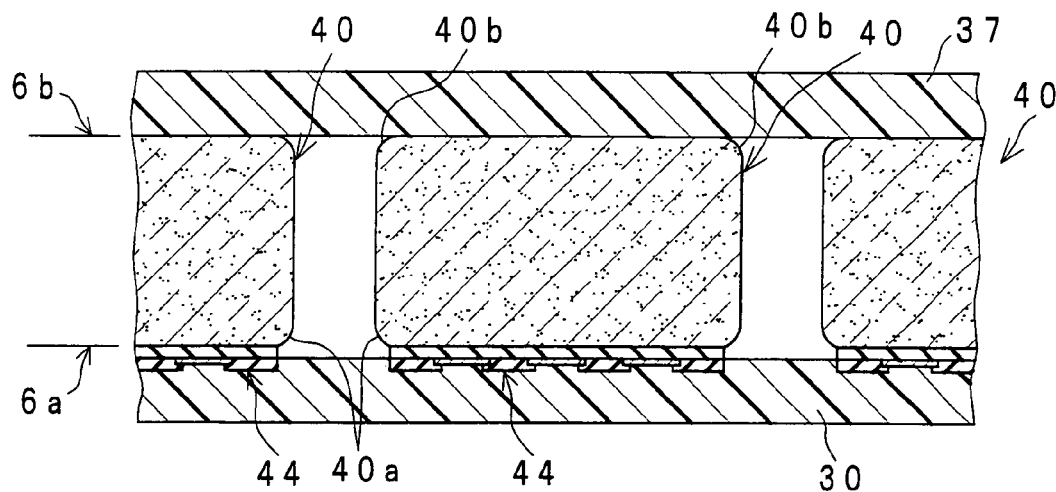
FIGS. 11A and 11B are schematic explanatory views of the semiconductor wafer showing the processes of the semiconductor chip manufacturing method continued from FIG. 10C, where.
Figure 11B:
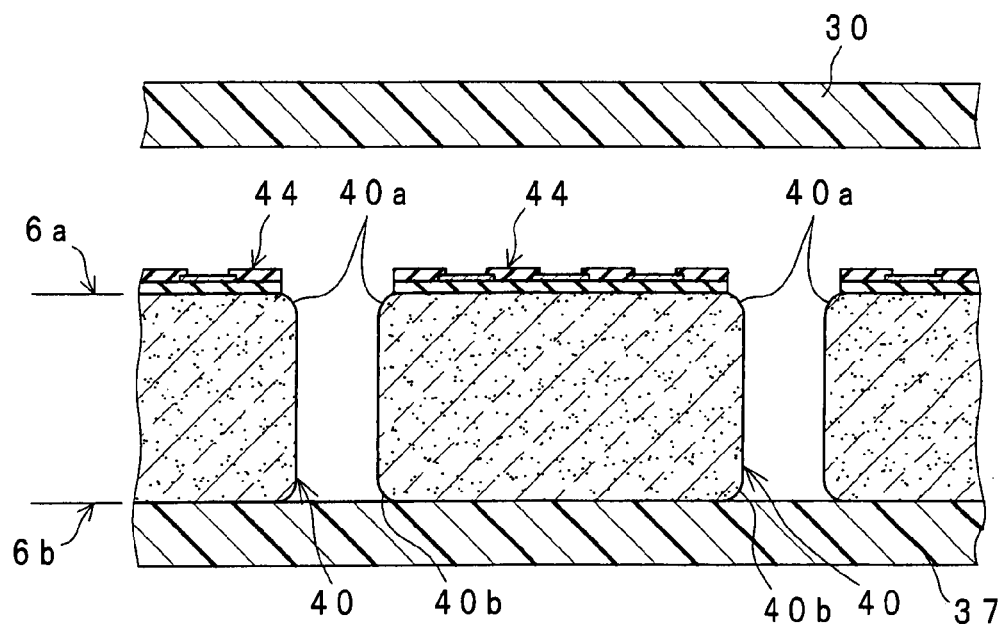

Then, the semiconductor wafer 6 unloaded together with the protective sheet 30 is transferred to a sheet peeling processing, in which the protective sheet 30 is peeled off from the circuit-formation-faces 6a of the semiconductor chips 40. As shown in FIGS. 11A and 11B, the sheet peeling is performed after the semiconductor chips 40 are retained on the adhesive sheet 37 by sticking an adhesive sheet 37 for retention use to the mask-placement-face 6b of the semiconductor chips 40. As a result, the manufacturing process of the semiconductor chips is completed.

Figure 30:
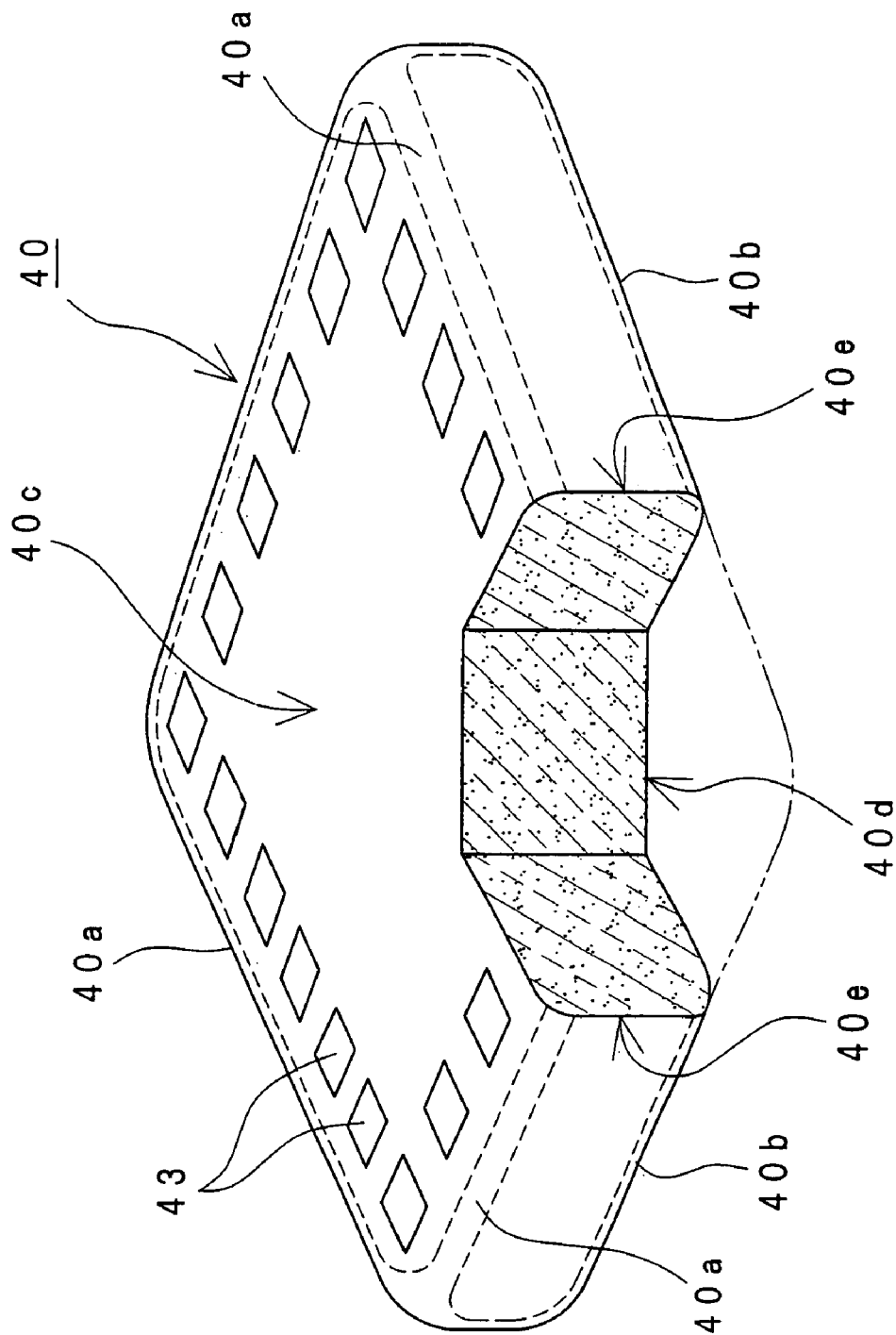
FIG. 30 is a schematic perspective view (including, a partial removal cross section) showing the appearance of the semiconductor chip formed by the semiconductor chip manufacturing method of the first embodiment.

In this case, FIG. 30 shows a schematic perspective view (including partial removal cross section) showing the appearance of the thus-formed semiconductor chips 40. As shown in FIG. 30, the rounded portions 40a that are curved convex surface portions can be formed so as to remove (i.e., remove through the first corner portion removal processing) the sharp corner portions (or ridgelines) at the end portions (i.e., at the end portions in all of the four directions) on the circuit-formation-face 6a side of the semiconductor chips 40. Further, the rounded portions 40b that are curved convex surface portions can be formed so as to remove (i.e., remove through the second corner portion removal processing) the sharp corner portions (or ridgelines) at the end portions (i.e., at the end portions in all of the four directions) on the mask-placement-face 6b side of the semiconductor chips 40. That is, all the corner portions and the ridgelines of the semiconductor chips 40 can be removed. As a result, chipping due to the corner portions, and the like that become chipped can be suppressed from occurring on the manufactured semiconductor chip 40, and the transverse rupture strength can be improved.

Moreover, the thus-formed semiconductor chip 40 is, for example, a semiconductor chip of a reduced thickness such that the thickness dimension thereof is sufficiently smaller than the width dimension thereof. Concretely describing the structure of the semiconductor chip 40, the semiconductor chip 40 has a first surface (circuit-formation-face) 40c which has a roughly rectangular flat surface and on which the semiconductor device 44 is formed, a second surface 40d which is a roughly rectangular flat surface parallel to the first surface 40c located on the side opposite from the first surface 40c, and a connection surface 40e which is located at the periphery of the first surface 40c and the second surface 40d and connects the end portion of the first surface 40c with the end portion of the second surface 40d. Furthermore, the semiconductor chip 40 is constructed so that the connection surface 40e includes the respective rounded portions 40a and 40b that are curved convex surface portions so that no ridgelines are formed at the end portions of the first surface 40c and the second surface 40d. Therefore, in the manufactured semiconductor wafer 40, the portions where the ridgelines have been located by the conventional manufacturing method can be constructed of curved convex surface portions, and the transverse rupture strength can be improved. Considering the fact that the thickness dimension is sufficiently smaller than the width dimension in the semiconductor chip 40 as described above, it is also possible to form all the connection surfaces 40e of the curved convex surface portions.

Figure 31:
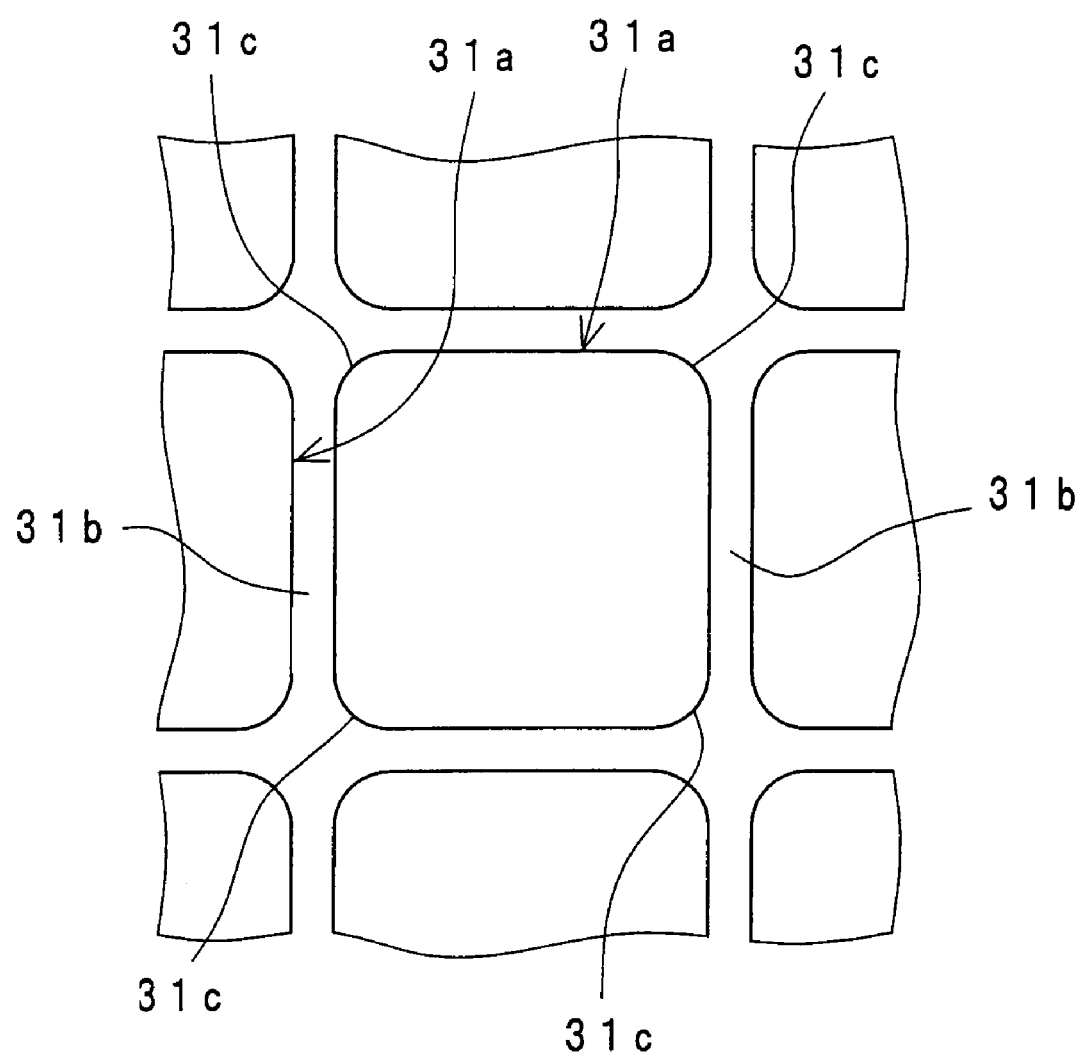
FIG. 31 is a schematic plan view showing the placement of a resist film in a state in which rounded portions are formed at corner portions by the semiconductor chip manufacturing method of the first embodiment.

Moreover, when curved convex surface portions, i.e., rounded portions 31c are formed at the four corner portions of the resist films 31a that have a roughly rectangular shape in plane and are arranged on the mask-placement-faces 6b of the semiconductor wafer 6 as shown in the schematic explanatory view of FIG. 31, the configuration of the formed semiconductor chip 40 can be formed into a smoother configuration, and this is preferable. In the thus-formed semiconductor chips 40, the width dimension of the dividing regions R2 is, for example, about 5 to 20 μm, the width dimension of the removed corner portions, i.e., the diameter dimension of the rounded portions 40a and 40b is about 0.5 to 20 μm, and further the width dimension of the removed silicon oxide film 35 is not greater than about 50 μm. Although the curved convex surface portions come to have a configuration that unlimitedly resembles chamfered portions (inclined flat surface portion or a tapered portion) if a curvature of the "rounded portions", or the "curved convex surface portions" becomes unlimitedly small, such chamfered portions are included in the curved convex surface portions of the present embodiment so long as the portions are convex surface portions curved even a little.

Although the case where the rounded portions 40a are formed by forming notches at the corner portions of the semiconductor chip 40 has been described above, the manufacturing method for semiconductor chips of the present first embodiment is not limited only to this case, and it may be a case where chamfer portions obtained by removing the sharp portions are formed at the corner portions. This is because the occurrence of chipping can be suppressed even if the chamfer portions are formed as described above.

Moreover, although the case where the principal portion of the semiconductor wafer 6 is the silicon substrate 45 formed of silicon has been described above, the notch formation of the present first embodiment can be similarly carried out and a similar effect can be obtained even when the semiconductor wafer is formed of a GaAs based material in place of the above case. It is noted that a gas constituted mainly of chlorine based gas should preferably be used as the plasma processing gas in place of the fluorine based gas ($SF_6$, $CF_4$) for etching the silicon material. When the GaAs based material is used as described above, the silicon oxide can be used as the insulating film.

Moreover, although the case where the second corner portion removal processing is carried out by the isotropic etching has been described above, the present embodiment is not limited to the case. It may be a case where the second corner portion removal processing is carried out by anisotropic etching instead of the above case. It is noted that the isotropic etching that have an intense etching characteristic along the surface of the second surface 6b should preferably be adopted from the viewpoint that the removal of the corner portions of the second surface 6b is efficiently performed.

According to the first embodiment, various effects can be obtained as follows.

By using the semiconductor wafer, on which the silicon oxide film 35 is placed as the insulating film in the portions that correspond to the dividing regions R2 of the circuit-formation-face 6a, as the semiconductor wafer 6 and carrying out the plasma dicing processing from the mask-placement-face 6b, the semiconductor chip manufacturing capable of forming the rounded portions 40a at the corner portions of the formed semiconductor chips 40 and improving the transverse rupture strength can be achieved.

The groove portions 6c are formed in the portions that correspond to dividing regions R2 by carrying out the plasma dicing processing on the semiconductor wafer 6, and the silicon oxide film 35 is exposed from the etching bottom portions in accordance with the progress of the etching. Subsequently, the exposed silicon oxide film 35 can be charged with the positive charge due to the ions in the plasma by continuing the plasma dicing processing, and the rounded portions 40a can be formed by removing the corner portions of the semiconductor chips 40 put in contact with the silicon oxide film 35 by bending the trajectory of the applied ions by the charging.

By thus forming the rounded portions 40a on the semiconductor chips 40, the semiconductor chips, which are able to suppress the occurrence of chipping of the manufactured semiconductor chips 40 and of which the transverse rupture strength is improved, can be manufactured.

Moreover, with regard to the exposed silicon oxide film 35, the silicon oxide film 35 can be positively etched by performing the plasma etching while switching, for example, the kind of the gas, and the removal can reliably be achieved. Therefore, the silicon oxide film 35, which is not formed in the portions that correspond to the dividing regions R2 in the conventional semiconductor wafer 501 to be subjected to the plasma dicing processing, can be removed by carrying out the plasma etching process by switching the kind of the gas in the case where the silicon oxide film 35 is formed in the portions that correspond to the dividing regions R2, and the semiconductor wafer 6 can reliably be divided into the individual pieces of the semiconductor chips 40.

Further, by subsequently removing the resist film 31*a* placed on the mask-placement-face 6*b* of each of the semiconductor chips 40 through the mask removal processing to expose the mask-placement-face 6*b* on each of the semiconductor chips 40 and thereafter performing isotropic etching on the mask-placement-face 6*b* as the second corner portion removal processing, etching can be performed on the inner side surfaces of the grooves 6*c* located between the semiconductor chips 40 in the direction along the surface of the semiconductor wafer 6, so that the etching can be performed in the widthwise direction in the neighborhood of the entrance of the grooves 6*c*. By performing the etching as described above, the rounded portions 40*b* that are the curved convex surface portions can be formed at the end portions and the corner portions on the mask-placement-face 6*b* side of the semiconductor chips 40.

Therefore, all the ridgelines can be removed from the semiconductor chips 40 separated by the plasma dicing processing, so that the smooth curved convex surface portions can be formed at the portions where the ridgelines and corner portions have originally been located, and the transverse-rupture strength can be improved.

Moreover, by further performing plasma etching in a state in which the resist film 31*a* is removed from the mask-placement-face 6*b* of each of the semiconductor chips 40, a damage layer caused by, for example, an abrading process can be removed by the etching, and the manufacturing process of the semiconductor chips can be made more efficient.

Second Embodiment

The present invention is not limited to the above embodiment but allowed to be put into practice in various modes. For example, a manufacturing method for semiconductor chips according to the second embodiment of the present invention is described below with reference to the schematic explanatory views shown in FIGS. 16A through 16C, FIGS. 17A through 17C, FIGS. 18A through 18C and FIGS. 19A and 19B.

The manufacturing method for semiconductor chips of the present second embodiment differs from the first embodiment in the point that a polyimide (PI) film is used as the insulating film instead of using the silicon oxide film 35 as the insulating film formed in the portions that correspond to the dividing regions R2 as in the semiconductor wafer 6 of the first embodiment. Only the different point is described below. The fact that the plasma processing apparatus 101 used in the first embodiment is similarly used by the manufacturing method for semiconductor chips of the present second embodiment is same, and therefore, no description is provided for the apparatus. Moreover, the flow chart showing the procedure of the manufacturing method for the semiconductor chips of the present second embodiment is similar to the flow chart used for the first embodiment, no description is provided therefor.

Figure 16A:
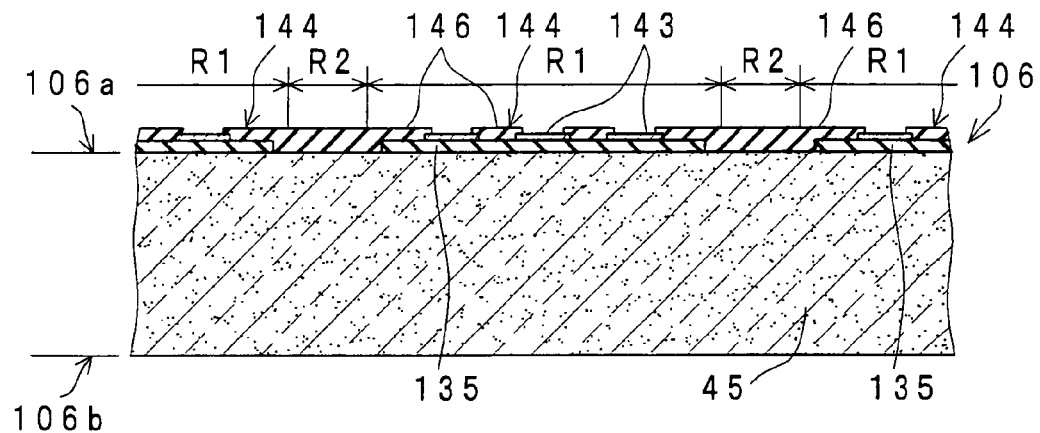
FIGS. 16A through 16C are schematic explanatory views of a semiconductor wafer showing the processes of a semiconductor chip manufacturing method according to a second embodiment of the present invention, where.

First of all, as shown in FIG. 16A, semiconductor devices 144 are formed in portions that correspond to the respective device-formation-regions R1 on a circuit-formation-face 106*a* of a semiconductor wafer 106. Each of the semiconductor devices 144 includes devices such as a MOS (Metal-Oxide-Semiconductor) structure transistor constructed of a silicon substrate 45 (Semiconductor), a silicon oxide 135 (Oxide) formed directly on the circuit-formation-face 106*a* and a metal film (Metal) formed on the silicon oxide 135. Further, the semiconductor devices 144 further includes a connection terminal 143 (also called the bonding pad) for electrically connecting the devices to external electronic apparatuses. In the portions that correspond to the dividing regions R2, the silicon oxide 135 is not formed unlike the first embodiment.

Moreover, as shown in FIG. 16A, on the circuit-formation-face 106*a* of the semiconductor wafer 106, a polyimide film 146 is formed as a surface protection film covering the formed semiconductor devices 144. The polyimide film 146 has a function to protect the semiconductor devices 144 formed on the circuit-formation-face 106*a* and placed formed also covering the portions that correspond to the dividing regions R2 on the circuit-formation-face 106*a*. In the semiconductor devices 144, the surfaces of the connection terminals 143 are not entirely covered with the polyimide film 146 but exposed for electrical connection. Moreover, the main body of the semiconductor wafer 106 is similar to that of the first embodiment in the point that it is formed of the silicon substrate 45.

Figure 16B:
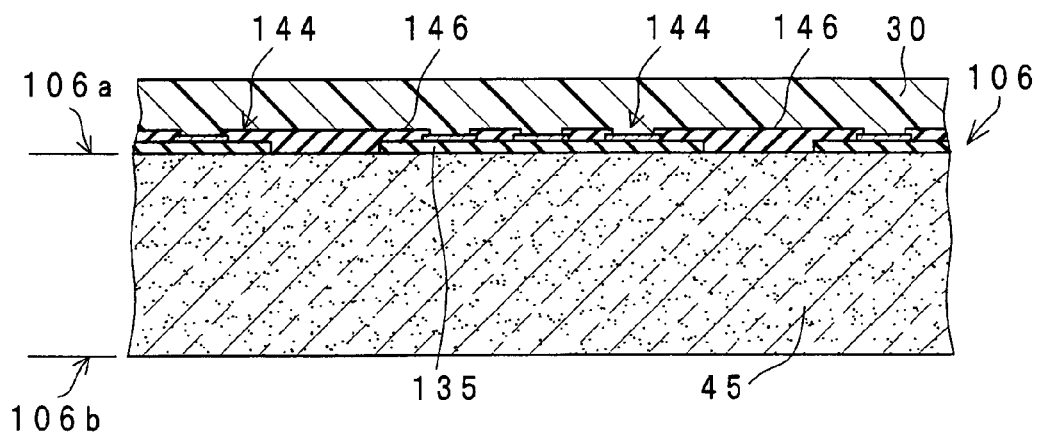
Figure 16C:
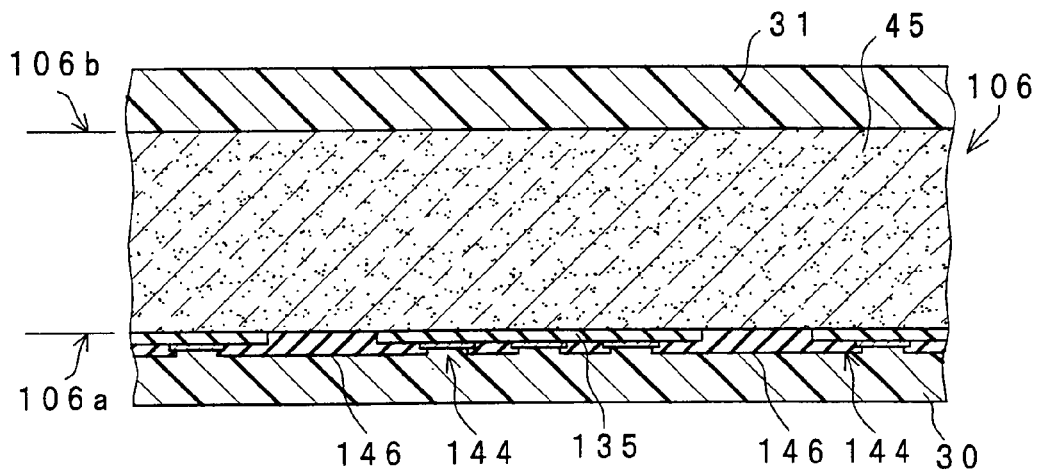
Figure 17A:
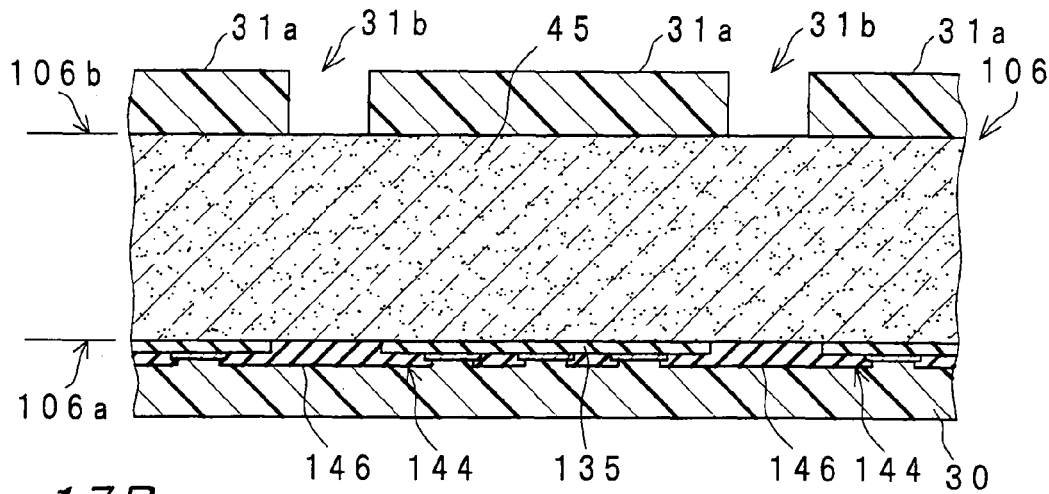
FIGS. 17A through 17C are schematic explanatory views of the semiconductor wafer showing the processes of the semiconductor chip manufacturing method continued from FIG. 16C, where.

A protective sheet 30 is adhesively stuck to the semiconductor wafer 106 so as to protect the entire circuit-formation-face 106*a* as shown in FIG. 16B. Subsequently, as shown in FIGS. 16C and 17A, a mask pattern of a resist film 31*a* and mask slit portions 31*b* is formed to define dividing regions R2 on the mask-placement-face 106*b* of the semiconductor wafer 106.

The semiconductor wafer 106 provided with the mask formed as above is subjected to plasma processing by using the plasma processing apparatus 101.

Figure 17B:
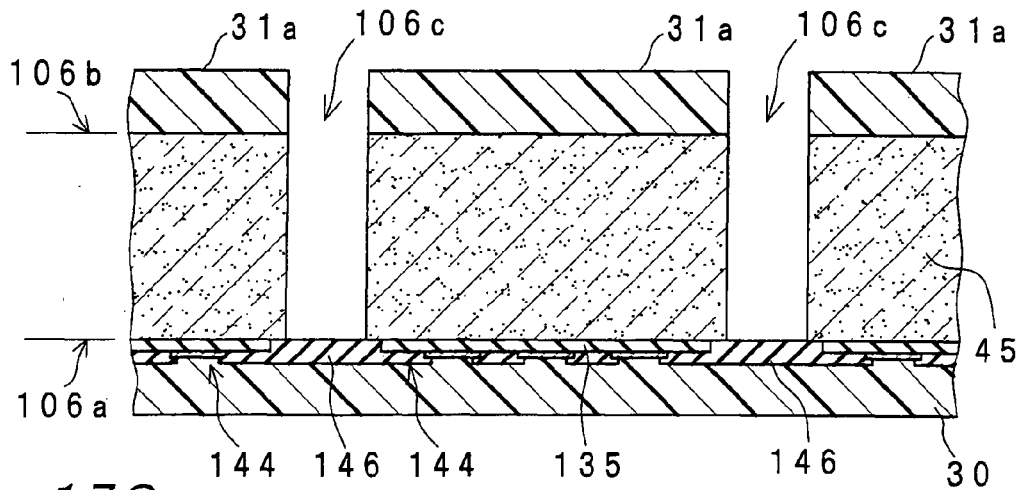
Figure 17C:
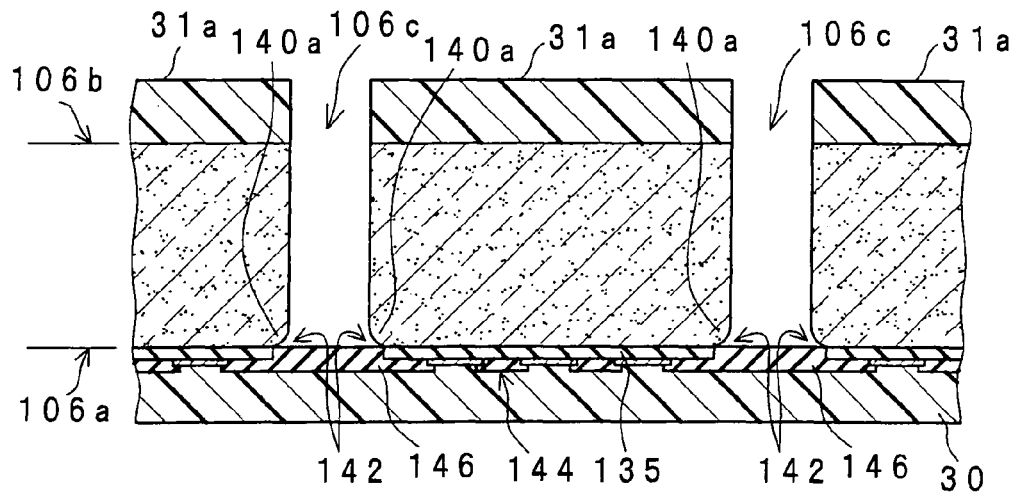

In concrete, a plasma dicing processing is first carried out by anisotropic etching from the mask-placement-face 106*b* of the semiconductor wafer 106, removing by anisotropic etching the silicon substrate 45 in the portions that correspond to the dividing regions R2. Through this process, as shown in FIG. 17B, groove portions 106*c* are to be formed in the portions that correspond to the dividing regions R2. With the progress of the etching, the polyimide film 146 becomes exposed from the etching bottom portion (insulator exposure processing in step S6 of FIG. 7). When the polyimide film 146 that is the insulating film is exposed as described above, the exposed polyimide film 146 is charged with the positive charge of the ions in the plasma, and the trajectory of the applied ions is to be bent. Consequently, as shown in FIG. 17C, notches 142 are formed at the corner portions of groove portions 106*c*, and rounded portions 140*a* are formed at the corner portions of the separated silicon substrate 45 put in contact with the polyimide film 146 (notch formation processing in step S8 of FIG. 7). When the rounded portions 140*a* of the prescribed size are formed, the plasma dicing processing by the anisotropic etching is ended.

Figure 18A:
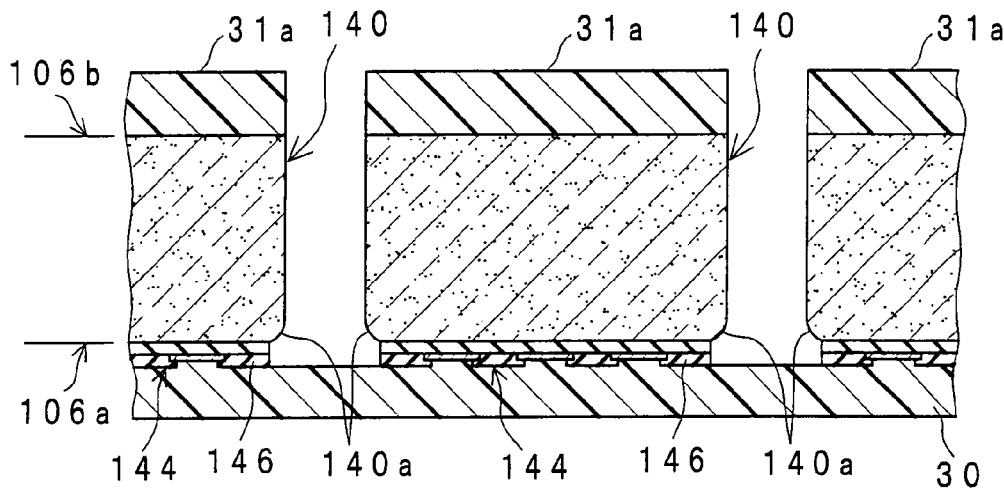
FIGS. 18A through 18C are schematic explanatory views of the semiconductor wafer showing the processes of the semiconductor chip manufacturing method continued from FIG. 17C, where.

Next, removal of the polyimide film 146 exposed on the dividing regions R2, i.e., the insulator removal processing is started (step S11 of FIG. 7). However, due to the polyimide film 146 used as the insulating film for the semiconductor wafer 106 of the present second embodiment, an etching gas capable of positively effecting plasma etching on the polyimide film 146 is used. For example, a gas that contains oxygen is used as the etching gas. In the plasma processing apparatus 101, the gases of the kinds used in each processing are stored in the gas supply units 20A, 20B, 20C and 20D. By thus carrying out the insulating film removing process, as shown in FIG. 18A, the exposed polyimide film 146 is removed from the portions that correspond to the dividing regions R2. Consequently, the semiconductor wafer 106 is divided into individual pieces of device-formation-regions R1, and the individual pieces of the semiconductor chips 140 are to be formed.

Figure 18B:
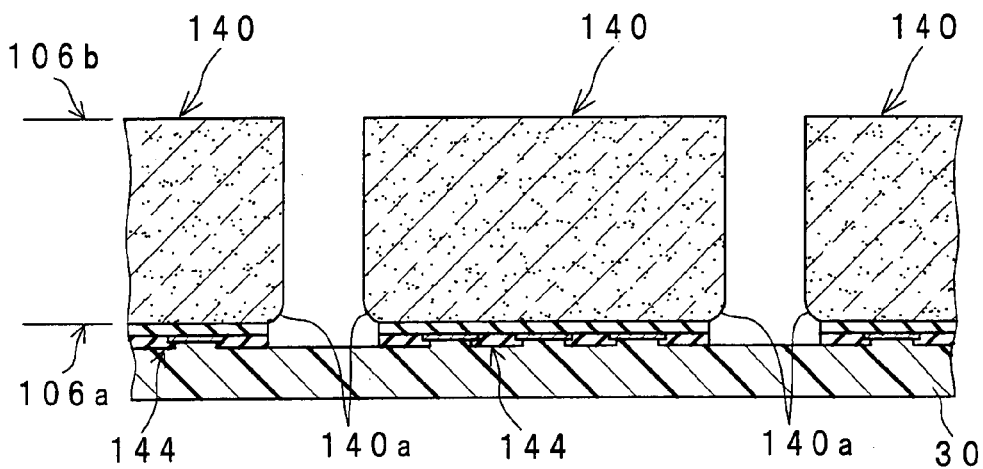

Subsequently, the resist film 31a is removed from the mask-placement-face 106b of the semiconductor chips 140 separated as shown in FIG. 18B by carrying out plasma ashing (mask removal processing in step S15 of FIG. 7).

Figure 18C:
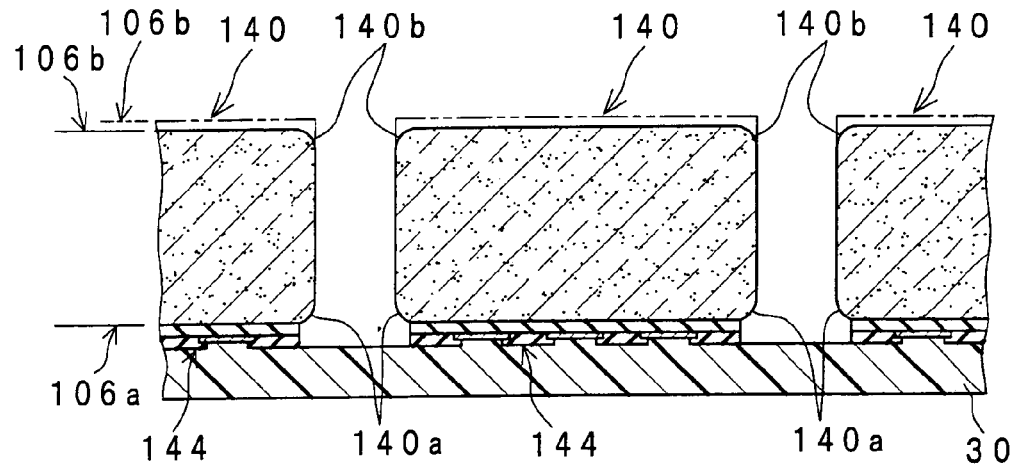

Subsequently, the isotropic etching is selected as the etching characteristic, and the plasma etching process by the isotropic etching is started on the second surface (mask-placement-face) 106b from which the resist film 31a has been removed (second corner portion removal processing in step S18 of FIG. 7). By the plasma etching process using the isotropic etching, the second surface 106b of the semiconductor chips 140 is entirely etched as shown in FIG. 18C, and the groove portions 106c (i.e., the side surfaces of the semiconductor chips 140) are etched in the direction along the surface of the semiconductor wafer 6 in the neighborhood of the entrance (i.e., in the neighborhood of the upper portion in the figure), as a consequence of which the groove portions 106c are etched so as to be slightly expanded in the widthwise direction thereof. As a result, the rounded (R) portions 140b that are curved convex surface portions put in contact with the dividing regions R2 can be formed on the mask-placement-face 106b of the semiconductor chips 140. That is, the rounded portions 140b are formed at the end portions (corner portions) located on the mask-placement-face 106b side of the semiconductor chips 140 and the four corner portions of the rectangular plane.

Figure 19A:
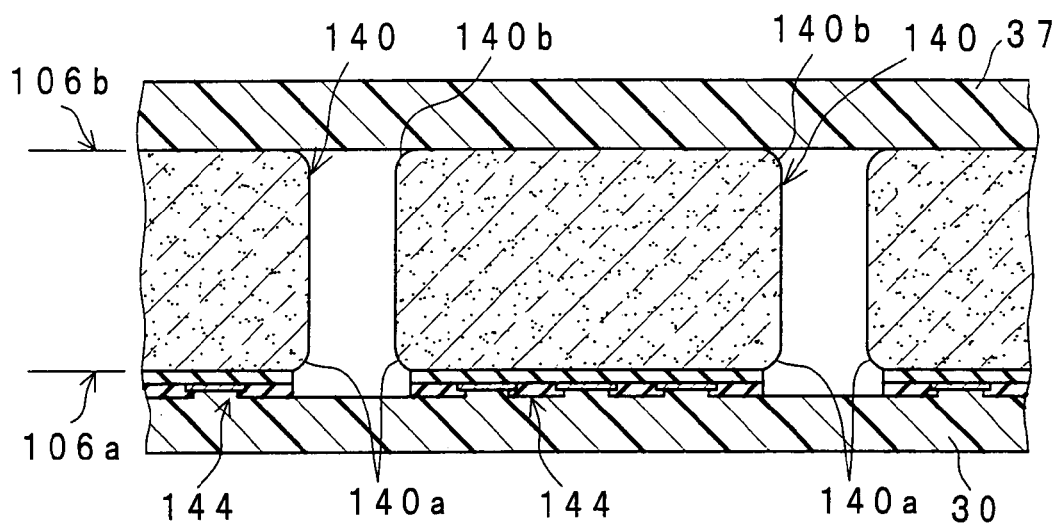
FIGS. 19A and 19B are schematic explanatory views of the semiconductor wafer showing the processes of the semiconductor chip manufacturing method continued from FIG. 18C, where.
Figure 19B:
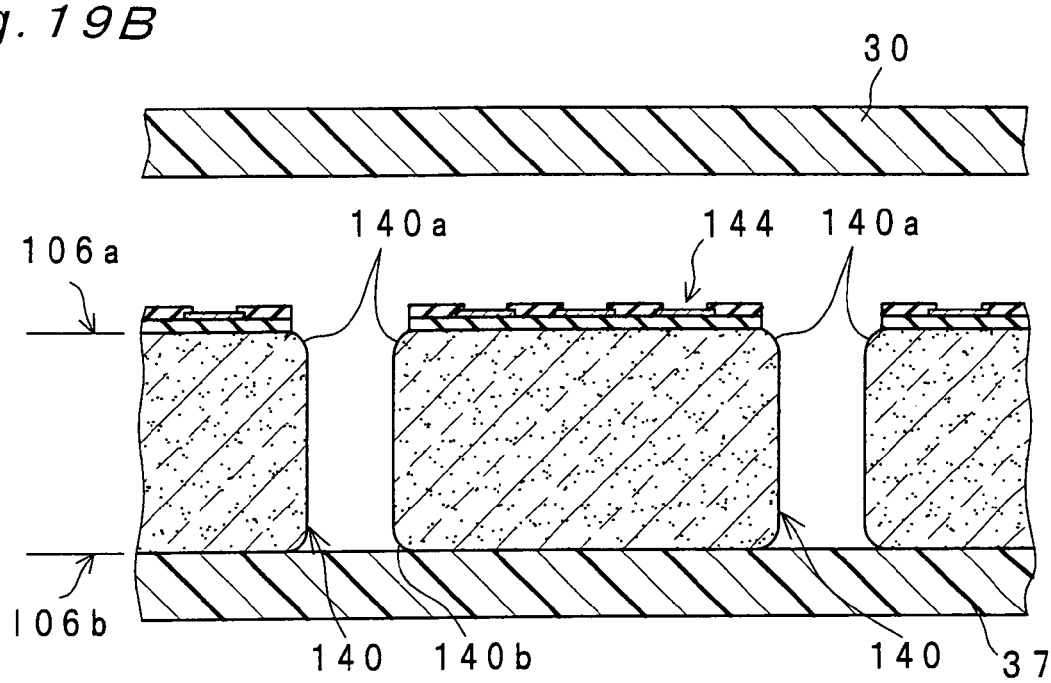

Subsequently, as shown in FIGS. 19A and 19B, the adhesive sheet 37 is stuck to the mask-placement-face 106b, and the protective sheet 30 is peeled off from the circuit-formation-face 106a. As a result, the manufacturing process of the semiconductor chips 140 is completed.

As described above, even when the semiconductor wafer 106 uses the polyimide film 146 that is the surface protection film as the insulating film placed in the dividing regions R2, the rounded portions 140a can be formed at the end portions on the circuit-formation-face 106a side by performing the notch formation as in the first embodiment during the plasma dicing processing, and the rounded portions 140b can be formed at the end portions on the mask-placement-face 106b side by using the isotropic etching after the mask removal processing is carried out. Therefore, semiconductor chips 140 that have corner portions formed of smooth curved convex surface portions with all the ridgelines removed can be formed, and semiconductor chips of which the transverse rupture strength can be improved can be manufactured.

Modification Example of Second Embodiment

Although the case where the polyimide film 146 formed as the surface protection film is used as the insulating film placed in the dividing regions R2 has been described above, the present second embodiment is not limited only to the case. It may be a case where, for example, a silicon nitride film formed of silicon nitride ($Si_3N_4$) is used as the surface protection film in place of such a case. The case where the silicon nitride film is used is described below as a semiconductor chip manufacturing method according to a modification example of the present second embodiment is described below. Moreover, for the description, a flow chart showing the procedure of the semiconductor chip manufacturing method is shown in FIG. 20, and a schematic explanatory view showing a state in which a notch formation processing and a silicon-nitride film (insulator) removal step are concurrently carried out is shown in FIG. 21.

Figure 20:
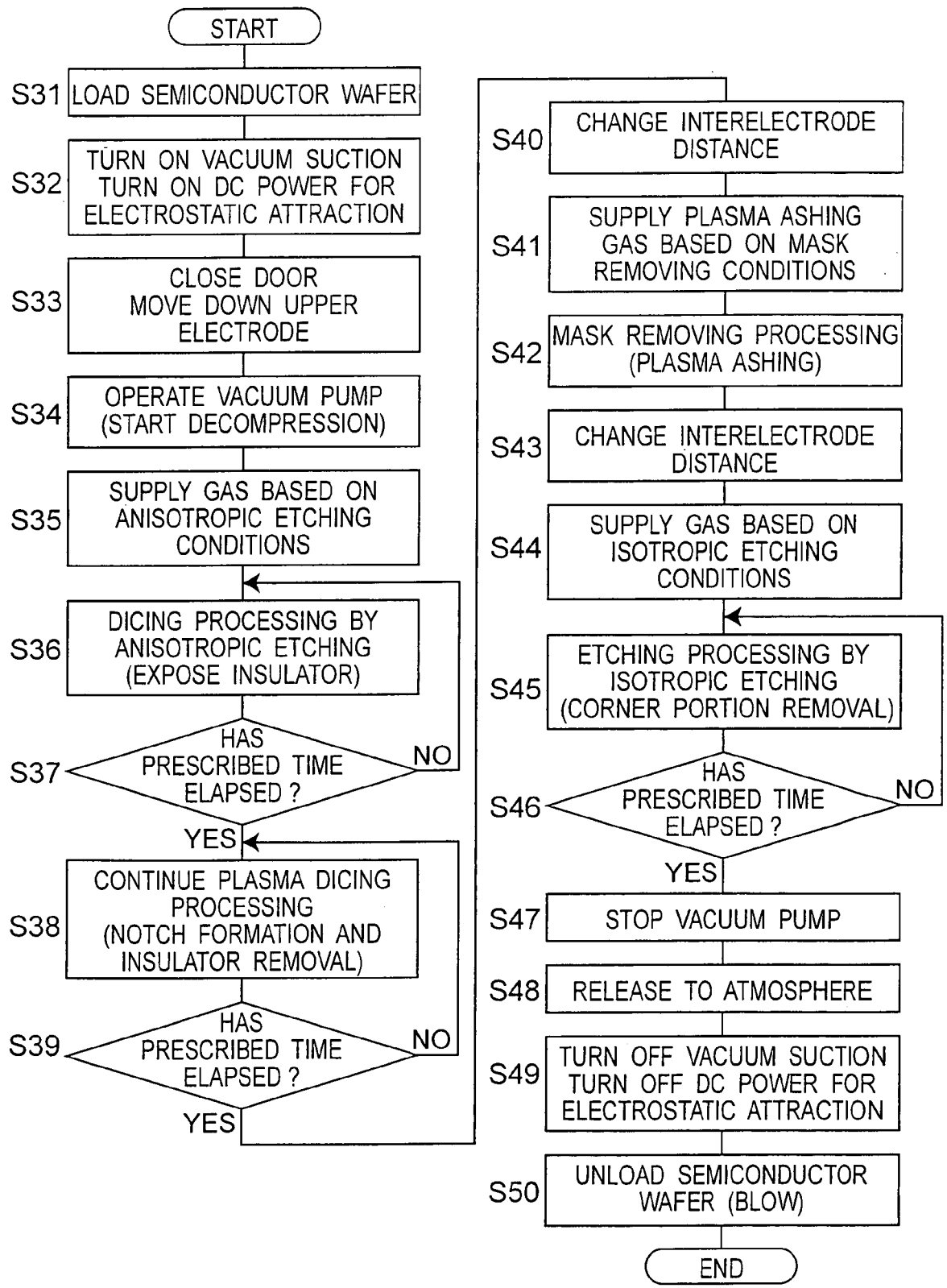
FIG. 20 is a flow chart showing the procedure of a semiconductor wafer dividing method according to a modification example of the second embodiment.
Figure 21:
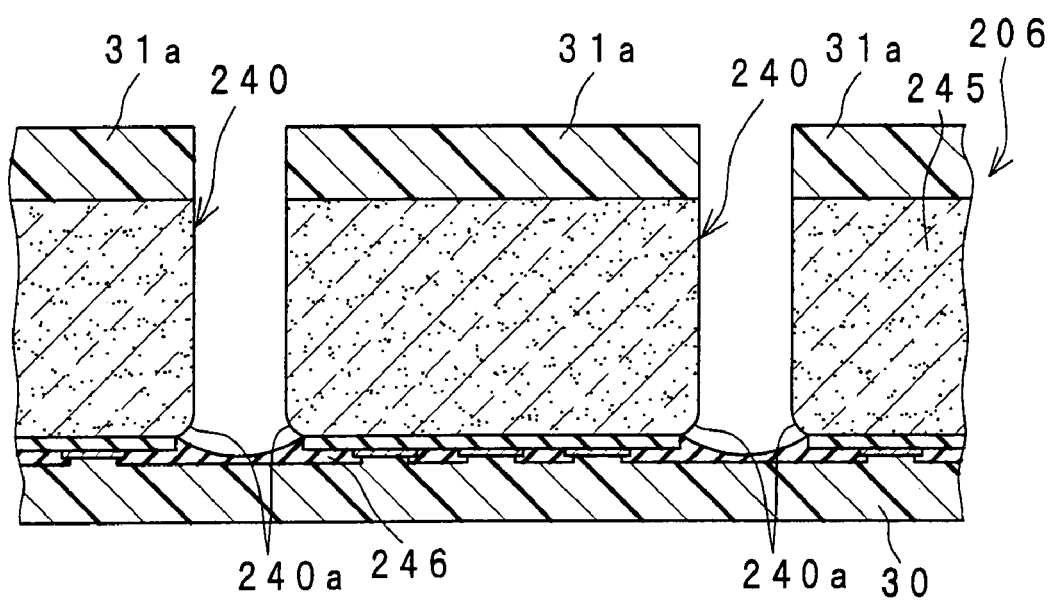
FIG. 21 is a schematic sectional view of a semiconductor wafer showing a semiconductor chip manufacturing method according to the modification example of the second embodiment.

First of all, as shown in the flow chart of FIG. 20, the loading of a semiconductor wafer 206 in step S31 to the completion of the insulator exposure processing in step S37 are similar to the procedure of the first embodiment of FIG. 7. Subsequently, the exposed silicon-nitride film 246 is to be removed by anisotropic etching in step S38. With regard to the gas for etching the silicon nitride film 246, the same gas as the sulfur hexafluoride gas ($SF_6$) that is the gas for etching the silicon substrate 145 is used. Therefore, in the schematic explanatory view of FIG. 21 showing a plasma dicing processing state of the semiconductor wafer 206 where the silicon nitride film 246 is formed as the insulating film, when the silicon nitride film 246 is exposed from the bottom portions of the formed groove portions 206c by etching the silicon substrate 245 in the portions that correspond to the dividing regions R2 by using $SF_6$, notch formation is carried out by bending the trajectory of the incident ions by charging the exposed silicon nitride film 246 with positive charge, and the exposed silicon nitride film 246 is concurrently etched. Consequently, by carrying out the plasma dicing processing by the anisotropic etching for notch formation, the exposed silicon nitride film 246 can be removed (notch formation and insulator removal processing).

As described above, in order to concurrently carry out the formation of rounded portions 240a on the semiconductor chips 240 by notch formation and the removal of the exposed silicon nitride film 246, it is preferable to determine the formation thickness of the silicon nitride film 246 in consideration of the plasma processing time necessary for forming the desired notches.

In the flow chart of FIG. 20, the mask removal processing is carried out in steps S40 through S42, subsequently the isotropic etching processing (second corner portion removal processing) is carried out in steps S43 through S46, the plasma dicing processing is completed by the prescribed procedure in steps S47 through S50, and semiconductor chips 240 are formed.

Third Embodiment

Figure 22:
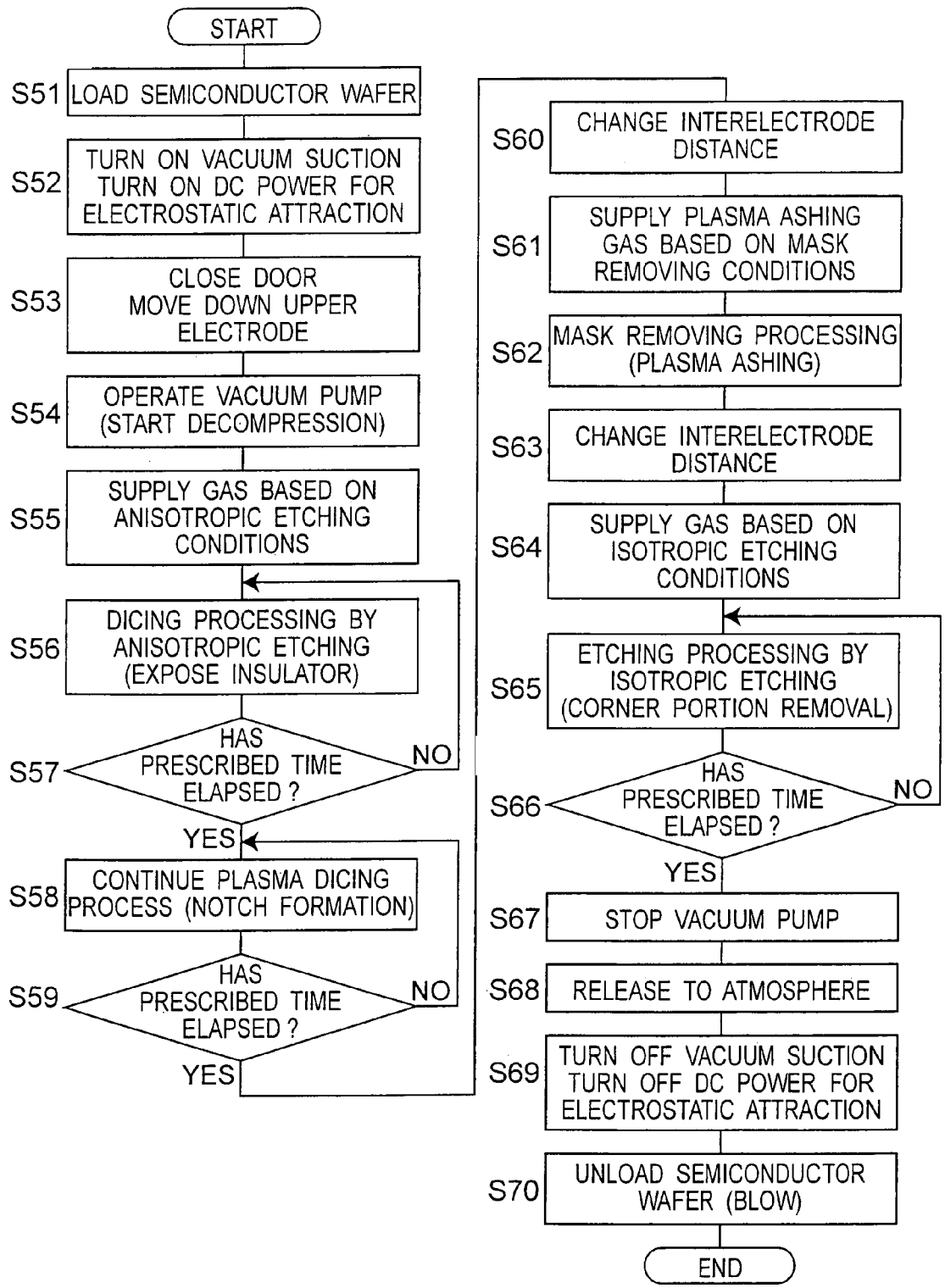
FIG. 22 is a flow chart showing the procedure of a semiconductor wafer dividing method according to a third embodiment of the present invention.

Next, a manufacturing method for semiconductor chips according to the third embodiment of the present invention is described below with reference to the flow chart of the procedure shown in FIG. 22 and the schematic explanatory views shown in FIGS. 23A through 23C, FIGS. 24A through 24C, FIGS. 25A and 25B and FIGS. 26A and 26B. By the manufacturing method for semiconductor chips of the present third embodiment, notch formation and so on are carried out by using a protective sheet that has an insulating property as the insulating film to be placed in the dividing regions R2 unlike the first embodiment and the second-embodiment. Only the different point is described below. Moreover, the manufacturing method for semiconductor chips of the third embodiment can be carried out by the processing apparatus 101 used in the first embodiment. Therefore, no description is provided for the construction and so on of the plasma processing apparatus 101.

Figure 23A:
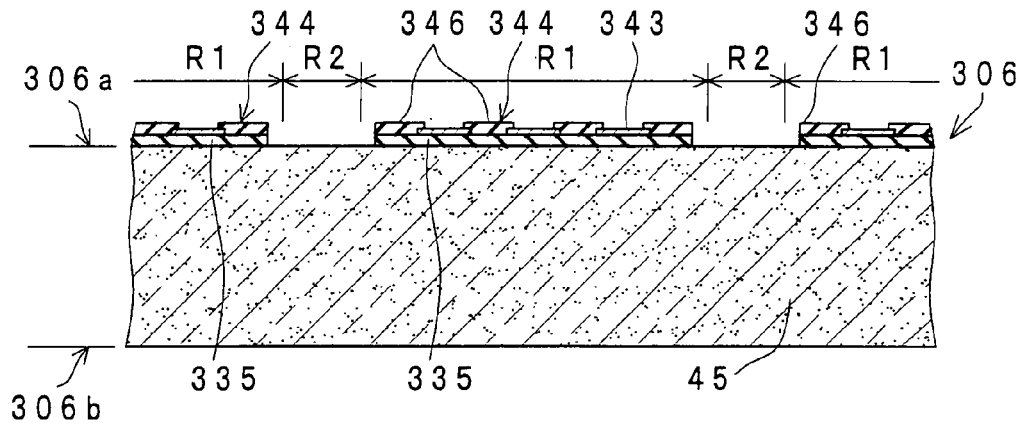
FIGS. 23A through 23C are schematic explanatory views of a semiconductor wafer showing the processes of a semiconductor chip manufacturing method according to the third embodiment, where.

As shown in FIG. 23A, a semiconductor device 344 is formed in each of the device-formation-regions R1 on a circuit-formation-face 306a of a semiconductor wafer 306. The semiconductor device 344 include devices such as a MOS structure transistor constructed of a silicon substrate 45, a silicon oxide 335 formed directly on the circuit-formation-face 306a, and a metal film formed on the silicon oxide 335. Further, the semiconductor device 344 also has connection terminals 343 for electrically connecting the devices to external electronic apparatuses. Moreover, the surface of the semiconductor device 344 is covered with a surface protection film 346. The connection terminal 343 is not covered with the surface protection film 335 but exposed outside. Moreover, neither the silicon oxide 335 nor the surface protection film 346 is formed in the portions that correspond to dividing regions R2.

Figure 23B:
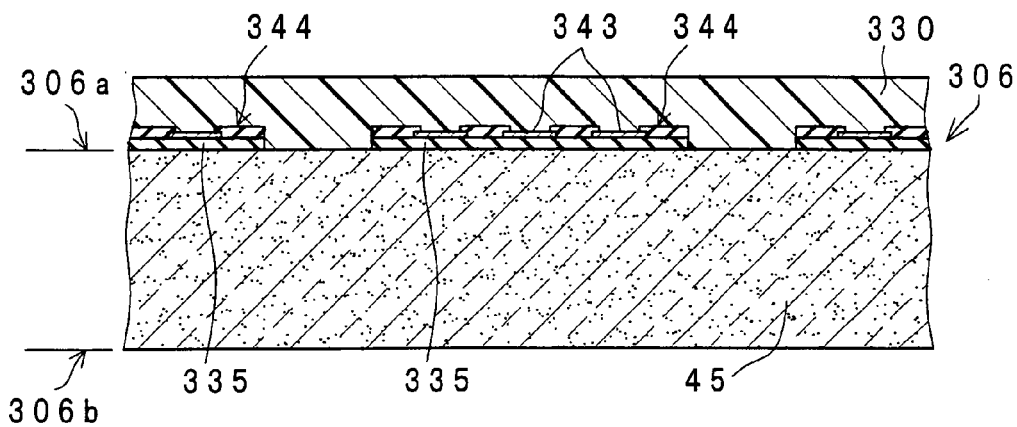

First, as shown in FIG. 23B, a protective sheet is adhesively stuck to the circuit-formation-face 306a of the semiconductor wafer 306 for the protection of the surface. In the present third embodiment, an insulating protective sheet 330 that has an electrical insulation property is used as such a protective sheet. Moreover, the insulating protective sheet 330 described above serves as one example of the insulating film to be placed in the dividing regions R2.

Figure 23C:
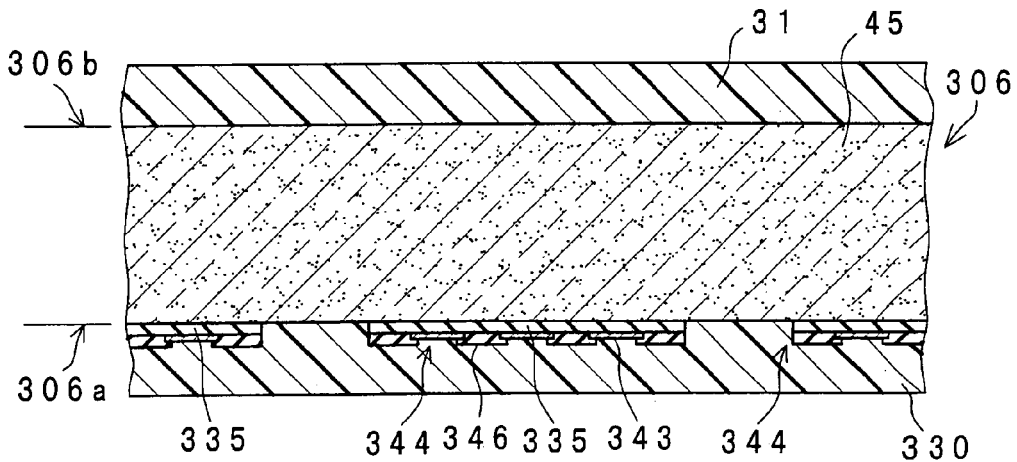
Figure 24A:
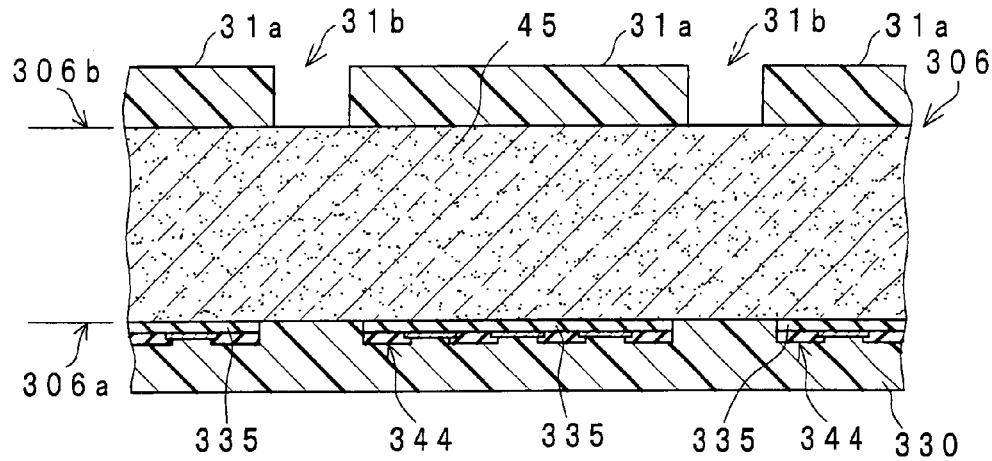
FIGS. 24A through 24C are schematic explanatory views of the semiconductor wafer showing the processes of the semiconductor chip manufacturing method continued from FIG. 23C, where.

Subsequently, a resist film 31 is formed covering the mask-placement-face 306b of the semiconductor wafer 306 as shown in FIG. 23C, and a mask pattern constructed of the mask slit portions 31b and resist film 31a is formed so that the portions corresponding to the dividing regions R2 are exposed as shown in FIG. 24A.

Figure 24B:
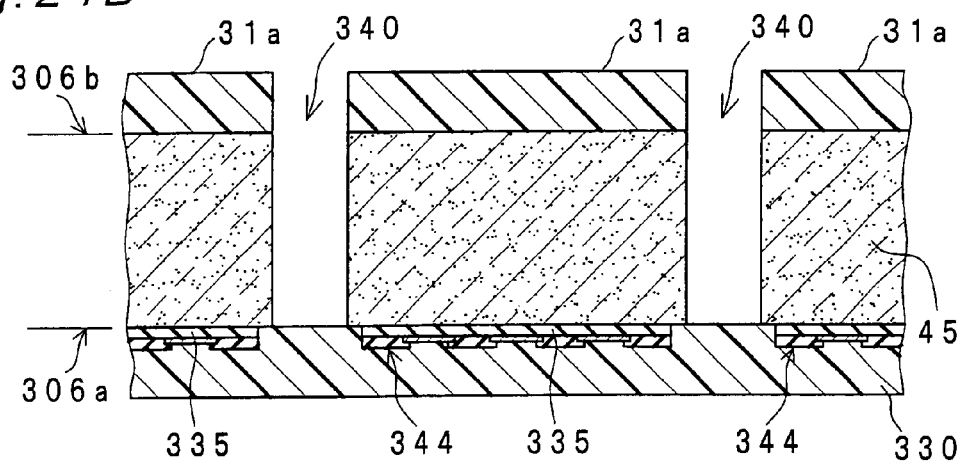

The semiconductor wafer 306 provided with the thus-formed mask is subjected to plasma processing by using the plasma processing apparatus 101. In concrete, a prescribed procedure is carried out in steps S51 through S55 shown in FIG. 22, and subsequently, as shown in FIG. 24B, the portions that correspond to the dividing regions R2 are removed by carrying out a plasma dicing processing by anisotropic etching (protective sheet exposure step in steps S56 and S57 of FIG. 22). As a result, the semiconductor wafer 306 is divided into individual pieces of the device-formation-regions R1, so that the individual pieces of the semiconductor chips 340 are formed.

Figure 24C:
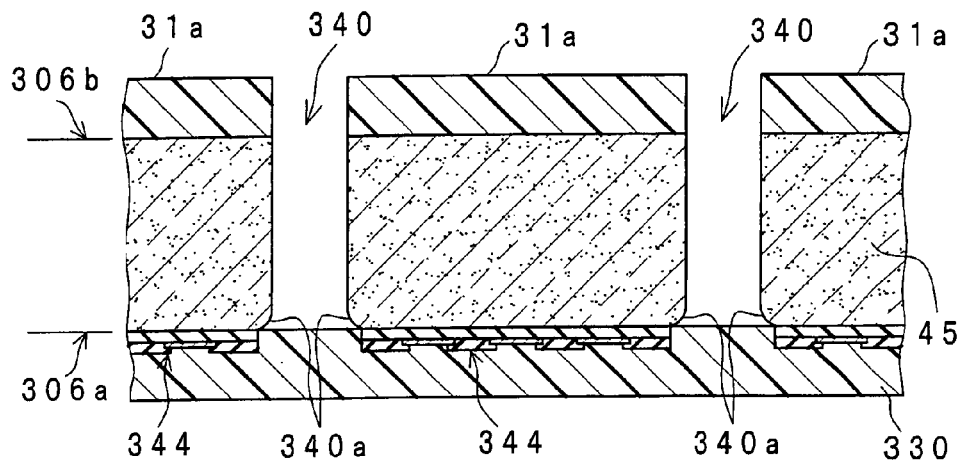

Moreover, if the portions that correspond to the dividing regions R2 are removed as described above, the surface of the insulating protective sheet 330 is to be exposed (i.e., the insulating film is exposed) in the dividing regions R2. When the insulating protective sheet 330 is exposed as described above, the exposed insulating protective sheet 330 is charged with the positive charge of the ions in the plasma, the trajectory of the subsequently incident ions is bent, and the notches 342 are formed at the corner portions located on the illustrated lower side of the semiconductor chips 340, i.e., the rounded portions 340a are formed as shown in FIG. 24C. When the rounded portions 340a of the desired size are formed (notch formation processing or first corner portion removal processing in steps S58 and 59 of FIG. 22), the plasma dicing processing by the anisotropic etching is ended.

Figure 25A:
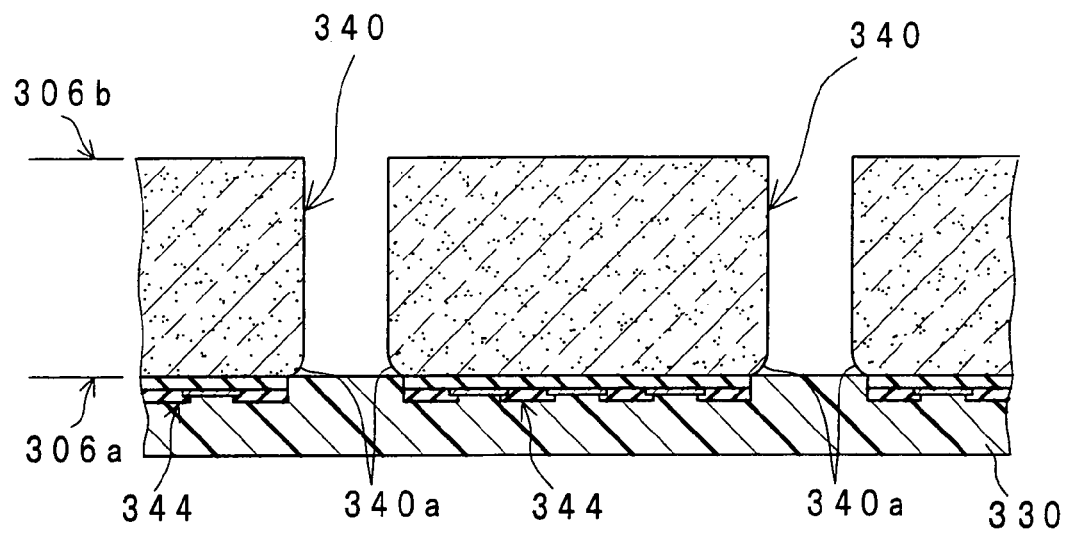
FIGS. 25A and 25B are schematic explanatory views of the semiconductor wafer showing the processes of the semiconductor chip manufacturing method continued from FIG. 24C, where.

Subsequently, plasma ashing (mask removal processing in steps S60 through S62 of FIG. 22) is carried out to remove the resist films 31a as shown in FIG. 25A.

Figure 25B:
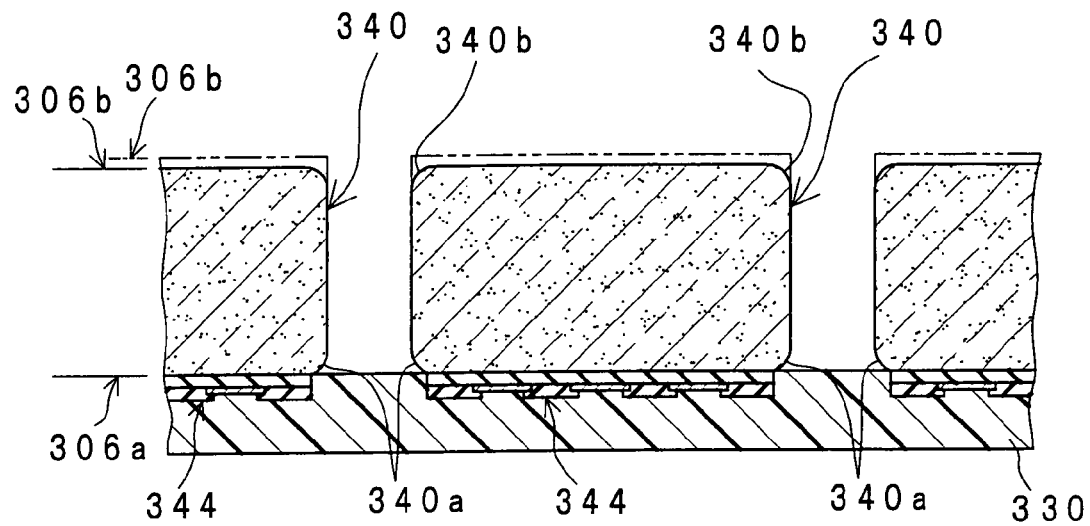

Subsequently, the plasma etching process by the isotopic etching is carried out on the mask-placement-face 306b from which the resist film 31a has been removed (second corner portion removal processing in steps S63 through S66 of FIG. 22). By carrying out the second corner portion removal processing by the isotropic etching, rounded portions 340b are formed at the corner portions located on the mask-placement-face 306b side of each of the separated semiconductor chips 340 as shown in FIG. 25B. Subsequently, by carrying out a prescribed procedure in steps S67 through S70, the separating process of the semiconductor chips 340 by the plasma dicing is completed.

Figure 26A:
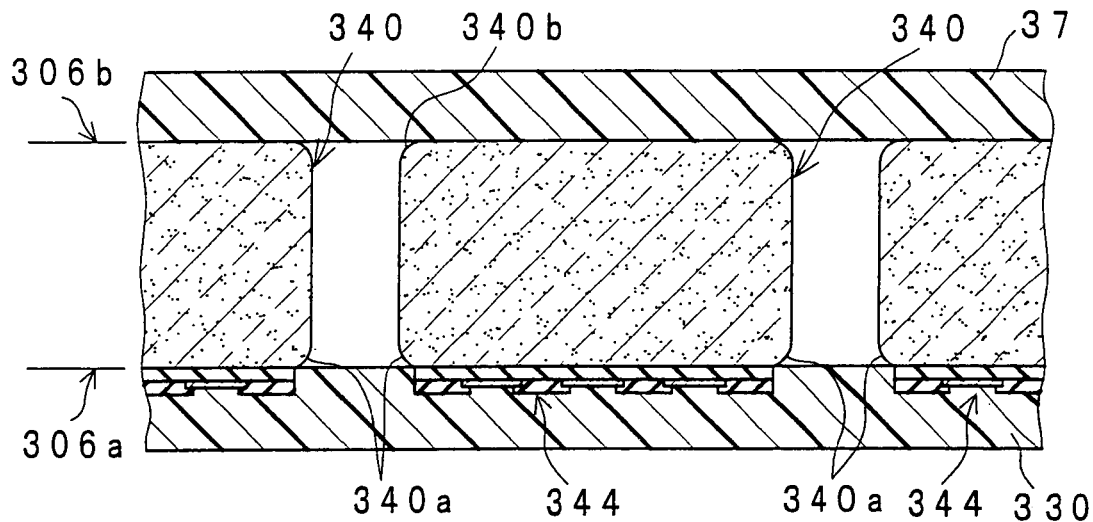
FIGS. 26A and 26B are schematic explanatory views of the semiconductor wafer showing the processes of the semiconductor chip manufacturing method continued from FIG. 25B, where.
Figure 26B:
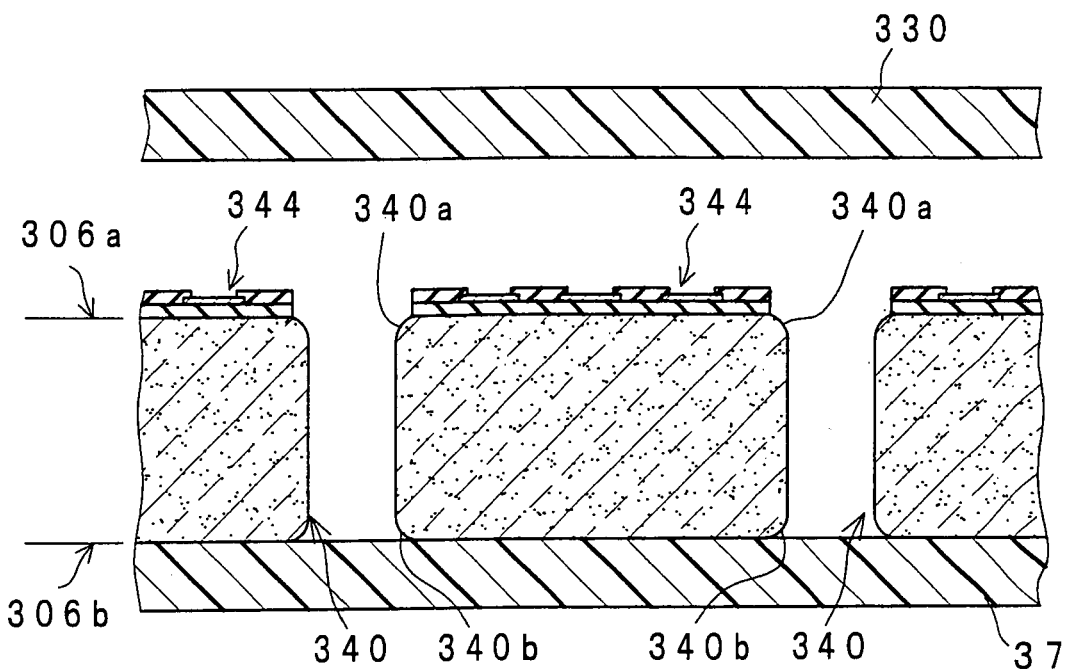
Figure 27A:
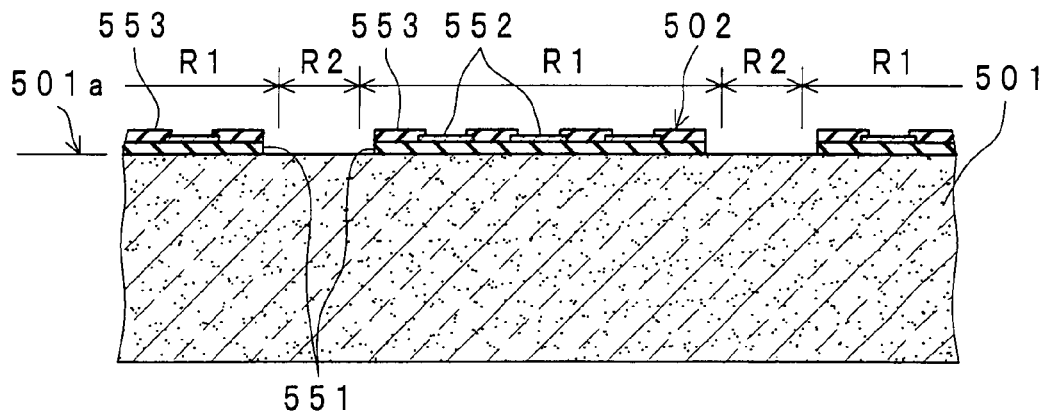
FIGS. 27A through 27C are schematic explanatory views of a semiconductor wafer showing a conventional semiconductor chip manufacturing method, where.
Figure 27B:
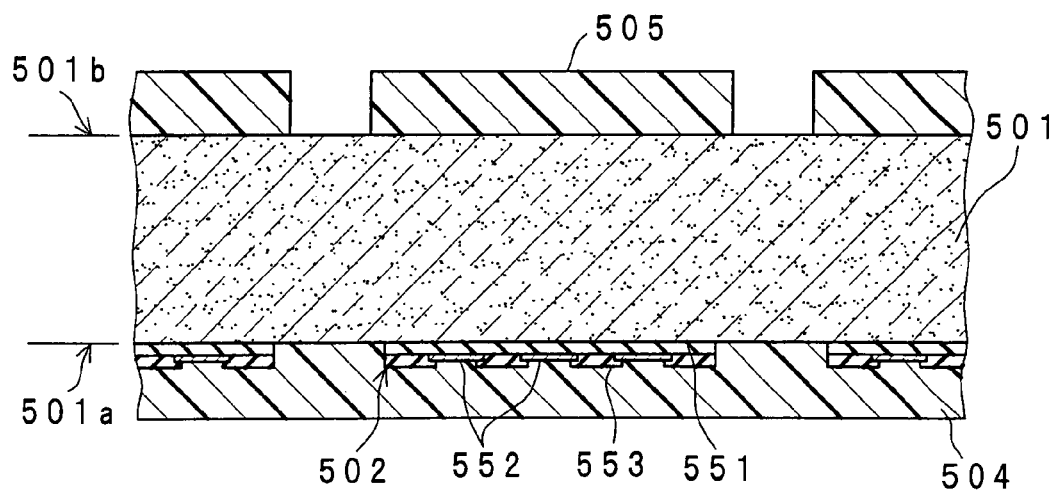
Figure 27C:
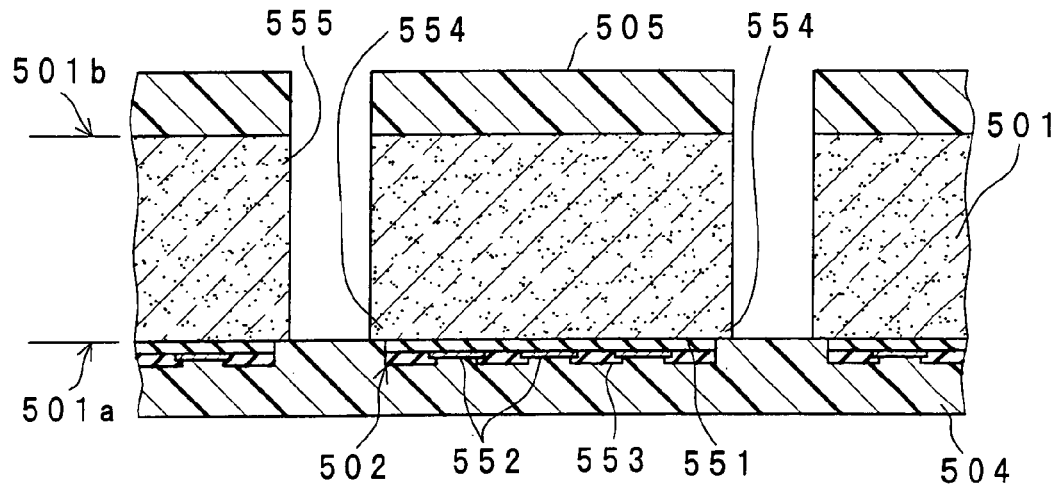
Figure 28A:
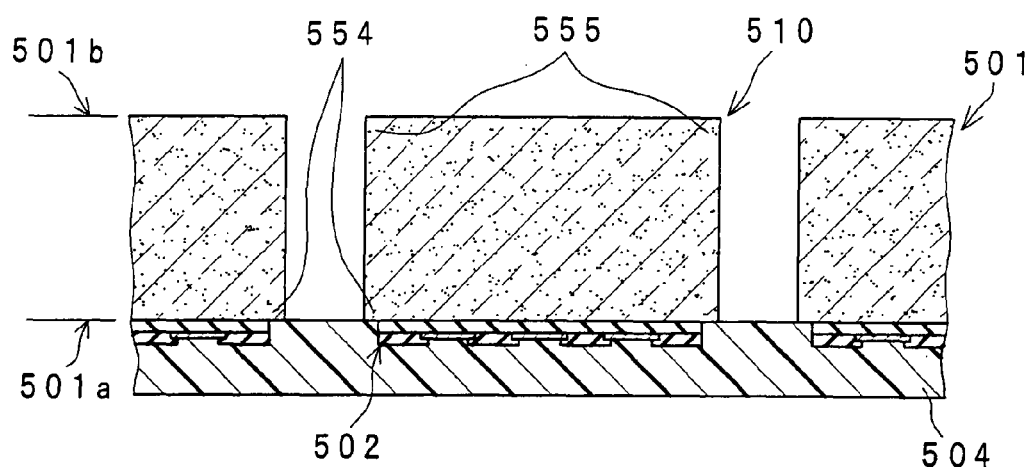
FIGS. 28A and 28B are schematic explanatory views of the semiconductor wafer showing the processes of the semiconductor chip manufacturing method continued from FIG. 27C, where.
Figure 28B:
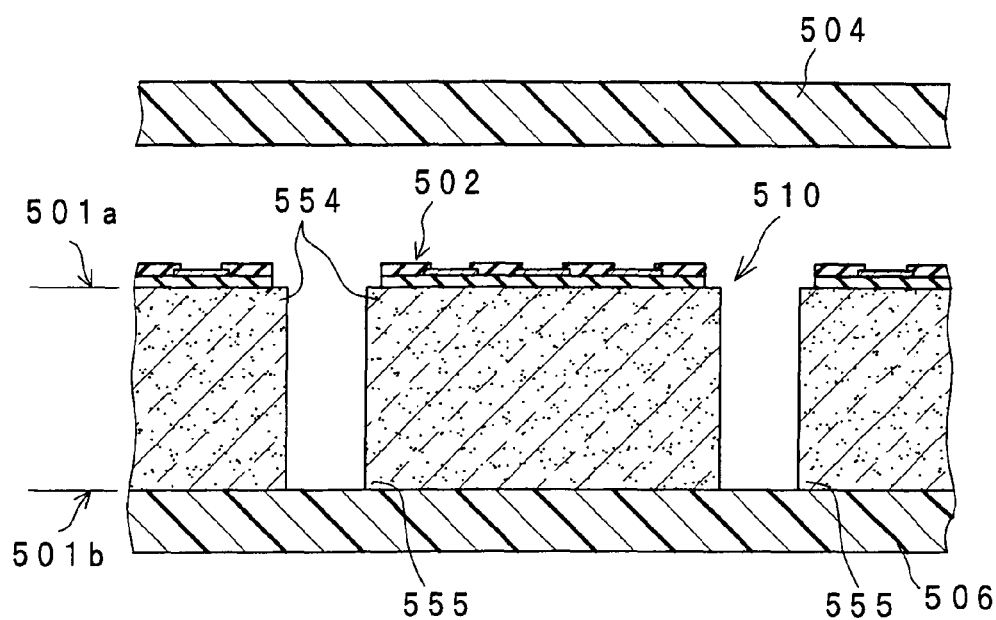
Figure 29:
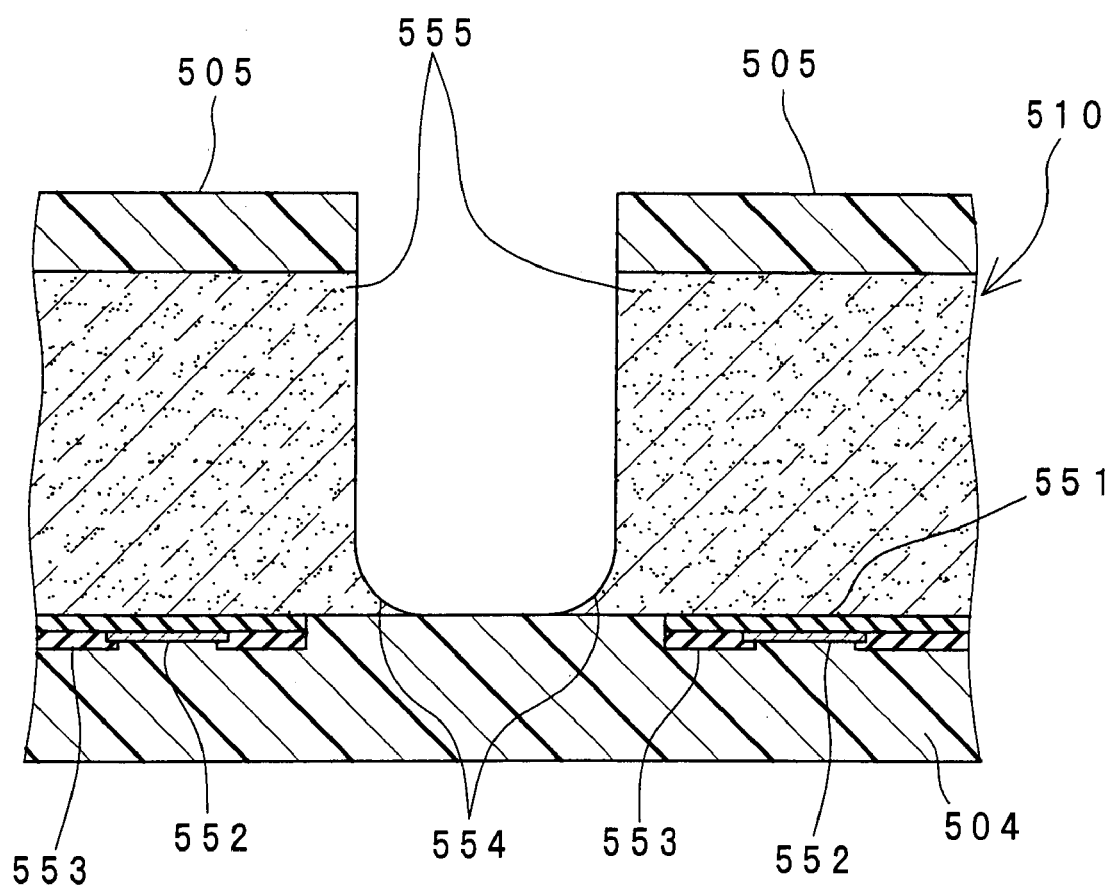
FIG. 29 is a partially enlarged schematic view in the neighborhood of the dividing region of a semiconductor wafer in a state in which the conventional semiconductor wafer plasma dicing processing is carried out.

Further, as shown in FIGS. 26A and 26B, an adhesive sheet 37 is stuck to the mask-placement-face 306b of the semiconductor wafer 306, and the insulating protective sheet 330 is peeled off from the circuit-formation-face 306a. As a result, the semiconductor chips 340, where the rounded portions 340a are formed at the corner portions of the circuit-formation-face 306a and the rounded portions 340b are formed at the corner portions of the mask-placement-face 306b, are manufactured.

Since the notch formation is performed as described above, the semiconductor chips, which can form the rounded portions 340a on the manufactured semiconductor chips 340 even when the insulating protective sheet 330 is used as the insulating film placed in the dividing regions R2 and of which the transverse rupture strength is improved, can be manufactured.

Moreover, a manufacturing method for semiconductor chips, which can obviate the need for carrying out the plasma etching process for removing the insulating film by using the insulating protective sheet 330 that can freely be adhesively stuck to or peeled off from the semiconductor wafer 306 as the insulating film and of which the efficiency is improved, can be provided.

The semiconductor chips manufactured by the semiconductor chip manufacturing method of the present invention can improve the transverse rupture strength by virtue of the curved convex surface portions formed in the portions that correspond to the positions where the ridgelines are formed so that all the ridgelines are removed. Therefore, it is particularly effective to use the semiconductor chips for IC cards with built-in semiconductor chips such as personal authentication cards. The above is because such IC cards have the features that they are often portably used and often contain important information separated inside, and the reliability can be improved by using the semiconductor chips of the present invention of which the strength against bending is improved.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2005-117239 filed on Apr. 14, 2005 including specification, drawing and claims are incorporated herein by reference in its entirety.

The invention claimed is:

1. A manufacturing method for semiconductor chips, the method comprising:
performing plasma etching on a second surface of a semiconductor wafer, the semiconductor wafer having a first surface on which an insulating film and semiconductor devices are disposed, wherein the semiconductor devices are placed in a plurality of device-formation-regions defined by dividing regions and the insulating film is placed in the dividing regions, wherein a mask for defining the dividing regions is placed on the second surface of the semiconductor wafer, the second surface being located opposite from the first surface, whereby portions that correspond to the dividing regions are removed and the insulating film is exposed;

removing corner portions on a first surface side of the semiconductor wafer in contact with the insulating film in the device-formation-regions by continuously performing the plasma etching in a state in which exposed surfaces of the insulating film are charged with electric charge due to ions in plasma;

after said removing the corner portions on the first surface side, removing the exposed insulating film from the second surface so that the device-formation-regions are separated into individual semiconductor chips;

removing the mask from surfaces of the semiconductor chips corresponding to the second surface of the semiconductor wafer; and after said removing the mask, removing corner portions on the surfaces of the semiconductor chips from which the mask has been removed by further performing plasma etching on the surfaces of the semiconductor chips from which the mask has been removed, whereby the semiconductor chips each of which includes one of the semiconductor devices are manufactured.

2. The manufacturing method as defined in claim 1, wherein removal of portions that correspond to the dividing regions and exposure of the insulating film are carried out by performing anisotropic etching as the plasma etching, and
wherein removal of the corner portions located on the second surface side is carried out by performing isotropic etching as the plasma etching.

3. The manufacturing method as defined in claim 1, wherein the insulating film is formed of silicon oxide on the first surface of the semiconductor wafer.

4. The manufacturing method as defined in claim 1, wherein the insulating film is a surface protection film formed of polyimide for protecting surfaces of the semiconductor devices.

5. The manufacturing method as defined in claim 1, wherein said removing the mask from the surfaces of the semiconductor chips is carried out by performing ashing on the second surface.

6. The manufacturing method as defined in claim 1, wherein the mask has roughly convex curved portions formed in portions that correspond to the corner portions of each of the device-formation-regions, each of the device-formation-regions having a roughly rectangular region.

7. The manufacturing method as defined in claim 1, wherein said removing the corner portions on the first surface of the semiconductor wafer is performed after said plasma etching on the second surface of the semiconductor wafer without flipping the semiconductor wafer.

8. A manufacturing method for semiconductor chips, the method comprising:
performing plasma etching on a second surface of a semiconductor wafer, the semiconductor wafer having a first surface on which an insulating film and semiconductor devices are disposed, wherein the semiconductor devices are placed in a plurality of device-formation-regions defined by dividing regions and the insulating film is placed in the dividing regions, wherein a mask for defining the dividing regions is placed on the second surface of the semiconductor wafer, the second surface being located opposite from the first surface, whereby portions that correspond to the dividing regions are removed and the insulating film is exposed;

removing the exposed insulating film while removing corner portions on a first surface side of the semiconductor wafer in contact with the insulating film in the device-formation-regions by performing the plasma etching in a state in which exposed surfaces of the insulating film are charged with electric charge due to ions in plasma, whereby the device-formation-regions are separated into individual semiconductor chips;

removing the mask from surfaces of the semiconductor chips corresponding to the second surface of the semiconductor wafer; and after said removing the mask, removing corner portions on the surfaces of the semiconductor chips by further performing plasma etching on the surfaces of the semiconductor chips, whereby the semiconductor chips each of which includes one of the semiconductor devices are manufactured.

9. The manufacturing method as defined in claim 8, wherein removal of portions that correspond to the dividing regions and exposure of the insulating film are carried out by performing anisotropic etching as the plasma etching, and
wherein removal of the corner portions located on the second surface side is carried out by performing isotropic etching as the plasma etching.

10. The manufacturing method as defined in claim 8, wherein the insulating film is a surface protection film formed of silicon nitride for protecting a surface of the semiconductor devices.

11. The manufacturing method as defined in claim 8, wherein said removing the mask from the surfaces of the semiconductor ships is carried out by performing ashing on the second surface.

12. The manufacturing method as defined in claim 8, wherein the mask has roughly convex curved portions formed in portions that correspond to the corner portions of each of the device-formation-regions, each of the device-formation-regions having a roughly rectangular region.

13. The manufacturing method as defined in claim 8, wherein said removing the corner portions on the first surface of the semiconductor wafer is performed after said plasma etching on the second surface of the semiconductor wafer without flipping the semiconductor wafer.

14. A manufacturing method for semiconductor chips, the method comprising:
performing plasma etching on a second surface of a semiconductor wafer, the semiconductor wafer having a first surface on which an insulating film and semiconductor devices are disposed, wherein the semiconductor devices are placed in a plurality of device-formation-regions defined by dividing regions, wherein a protective sheet having an insulating property is stuck on the semiconductor devices, and wherein a mask for defining the dividing regions is placed on the second surface of the semiconductor wafer, the second surface being located opposite from the first surface, whereby portions that correspond to the dividing regions are removed and the insulating protective sheet is exposed, and then the device-formation-regions are separated into individual semiconductor chips;

removing corner portions of each of the semiconductor chips in contact with the insulating protective sheet by performing the plasma etching in a state in which exposed surfaces of the insulating film are charged with electric charge due to ions in plasma, removing the mask from surfaces of the semiconductor chips corresponding to the second surface of the semiconductor wafer; and after said removing the mask, removing the corner portions on the surfaces of the semiconductor chips by further performing plasma etching on the surfaces of the semiconductor chips, whereby the semiconductor chips each of which includes one of the semiconductor devices are manufactured.

15. The manufacturing method as defined in claim 14, wherein removal of portions that correspond to the dividing regions and exposure of the insulating protective sheet are carried out by performing anisotropic etching as the plasma etching, and wherein removal of the corner portions located on the second surface side is carried out by performing isotropic etching as the plasma etching.

16. The manufacturing method as defined in claim 14, further comprising:

after said removing the corner portions on the surfaces of the semiconductor chips, removing the protective sheet by peeling off the protective sheet from the semiconductor chips.

17. The manufacturing method as defined in claim 14, wherein said removing the mask from the surfaces of the semiconductor chips is carried out by performing ashing on the second surface.

18. The manufacturing method as defined in claim 14, wherein the mask has roughly convex curved portions formed in portions that correspond to the corner portions of each of the device-formation-regions, each of the device-formation-regions having a roughly rectangular region.

19. The manufacturing method as defined in claim 14, wherein said removing the corner portions on the first surface of the semiconductor wafer is performed after said plasma etching on the second surface of the semiconductor wafer without flipping the semiconductor wafer.

* * * * *